(12) United States Patent
Ko et al.

(10) Patent No.: US 12,308,292 B2
(45) Date of Patent: May 20, 2025

(54) METHODS OF FORMING SEMICONDUCTOR DEVICE STRUCTURES

(71) Applicant: TAIWAN SEMICONDUCTOR MANUFACTURING COMPANY, LTD., Hsinchu (TW)

(72) Inventors: Yu-Chen Ko, Chiayi (TW); Kai-Chieh Yang, New Taipei (TW); Yu-Ting Wen, Taichung (TW); Ya-Yi Cheng, Taichung (TW); Min-Hsiu Hung, Tainan (TW); Wei-Jung Lin, Hsinchu (TW); Chih-Wei Chang, Hsinchu (TW); Ming-Hsing Tsai, Chupei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 194 days.

(21) Appl. No.: 17/825,307

(22) Filed: May 26, 2022

(65) Prior Publication Data

US 2023/0386914 A1    Nov. 30, 2023

(51) Int. Cl.
| | | |
|---|---|---|
| *H01L 21/768* | (2006.01) | |
| *H01L 21/3213* | (2006.01) | |
| *H10D 64/01* | (2025.01) | |
| *H10D 84/01* | (2025.01) | |
| *H10D 84/03* | (2025.01) | |

(52) U.S. Cl.
CPC .. *H01L 21/76865* (2013.01); *H01L 21/76846* (2013.01); *H01L 21/76856* (2013.01); *H10D 84/0186* (2025.01); *H10D 84/038* (2025.01); *H01L 21/32134* (2013.01); *H01L 21/32136* (2013.01); *H01L 21/32138* (2013.01); *H10D 64/01* (2025.01); *H10D 84/017* (2025.01)

(58) Field of Classification Search
CPC ........ H01L 21/76865; H01L 21/76841–76846
See application file for complete search history.

(56) References Cited

U.S. PATENT DOCUMENTS

| | | | |
|---|---|---|---|
| 5,904,561 A | * | 5/1999 | Tseng ................ H01L 21/76843 438/669 |
| 9,105,490 B2 | | 8/2015 | Wang et al. |
| 9,236,267 B2 | | 1/2016 | De et al. |
| 9,236,300 B2 | | 1/2016 | Liaw |

(Continued)

OTHER PUBLICATIONS

U.S. Appl. No. 63/334,428 (Year: 2022).*

*Primary Examiner* — Erik Kielin
(74) *Attorney, Agent, or Firm* — NZ Carr Law Office

(57) ABSTRACT

Methods of forming a semiconductor device structure are described. In some embodiments, the method includes forming a contact opening in an interlayer dielectric (ILD) layer disposed over an epitaxy source/drain region and forming a metal layer in the contact opening. The metal layer includes top portions, side portions, and a bottom portion, and a space is defined between the top portions of the metal layer. The method further includes performing a gradient metal removal process on the metal layer to enlarge the space, forming a sacrificial layer in the contact opening, recessing the sacrificial layer in the contact opening to expose a portion of the sidewall portions, removing the top portions and the exposed portion of the sidewall portions, removing the sacrificial layer, and forming a bulk metal layer on the bottom portion of the metal layer.

20 Claims, 43 Drawing Sheets

(56) References Cited

U.S. PATENT DOCUMENTS

| | | |
|---|---|---|
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2018/0315646 A1* | 11/2018 | Tsai ............... H01L 23/485 |
| 2018/0323103 A1* | 11/2018 | Shaviv ........... H01L 21/67207 |
| 2021/0104431 A1 | 4/2021 | Khaderbad et al. |
| 2022/0231137 A1* | 7/2022 | Mebarki ........... H01L 27/088 |
| 2023/0343643 A1* | 10/2023 | Hsu ............... H01L 21/76877 |
| 2023/0343644 A1* | 10/2023 | Hsu ............... H01L 21/76865 |
| 2023/0343645 A1* | 10/2023 | Wu ............... H01L 21/76843 |
| 2023/0360969 A1* | 11/2023 | Chung ........... H01L 21/32138 |

\* cited by examiner

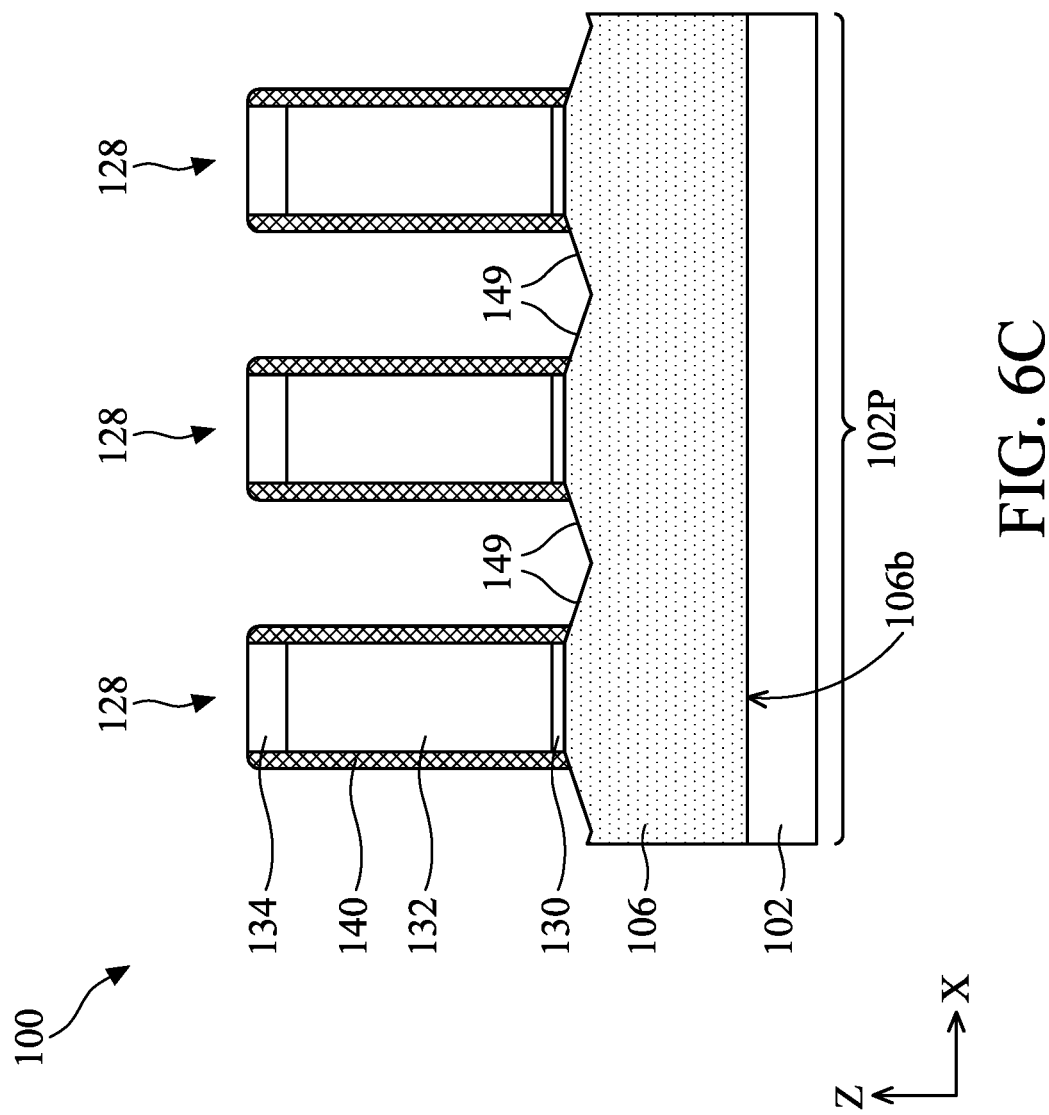

METHODS OF FORMING SEMICONDUCTOR DEVICE STRUCTURES

BACKGROUND

The semiconductor integrated circuit (IC) industry has experienced exponential growth. Technological advances in IC materials and design have produced generation of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Accompanying the scaling down of devices, manufacturers have begun using new and different materials and/or combination of materials to facilitate the scaling down of devices. Scaling down, alone and in combination with new and different materials, has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-10A are cross-sectional side views of various stages of manufacturing the semiconductor device structure of FIG. 4 taken along line A-A, in accordance with some embodiments.

FIGS. 5B-10B are cross-sectional side views of various stages of manufacturing the semiconductor device structure of FIG. 4 taken along line B-B, in accordance with some embodiments.

FIGS. 5C-10C are cross-sectional side views of various stages of manufacturing the semiconductor device structure of FIG. 4 taken along line C-C, in accordance with some embodiments.

FIGS. 11A-21A are cross-sectional side views of various stages of manufacturing the semiconductor device structure of FIG. 4 taken along line A-A, in accordance with some embodiments.

FIGS. 11B-21B are cross-sectional side views of various stages of manufacturing the semiconductor device structure of FIG. 4 taken along line B-B, in accordance with some embodiments.

FIGS. 22A-24A are cross-sectional side views of various stages of manufacturing the semiconductor device structure of FIG. 4 taken along line A-A, in accordance with alternative embodiments.

FIGS. 22B-24B are cross-sectional side views of various stages of manufacturing the semiconductor device structure of FIG. 4 taken along line B-B, in accordance with alternative embodiments.

DETAILED DESCRIPTION

Figure 1:
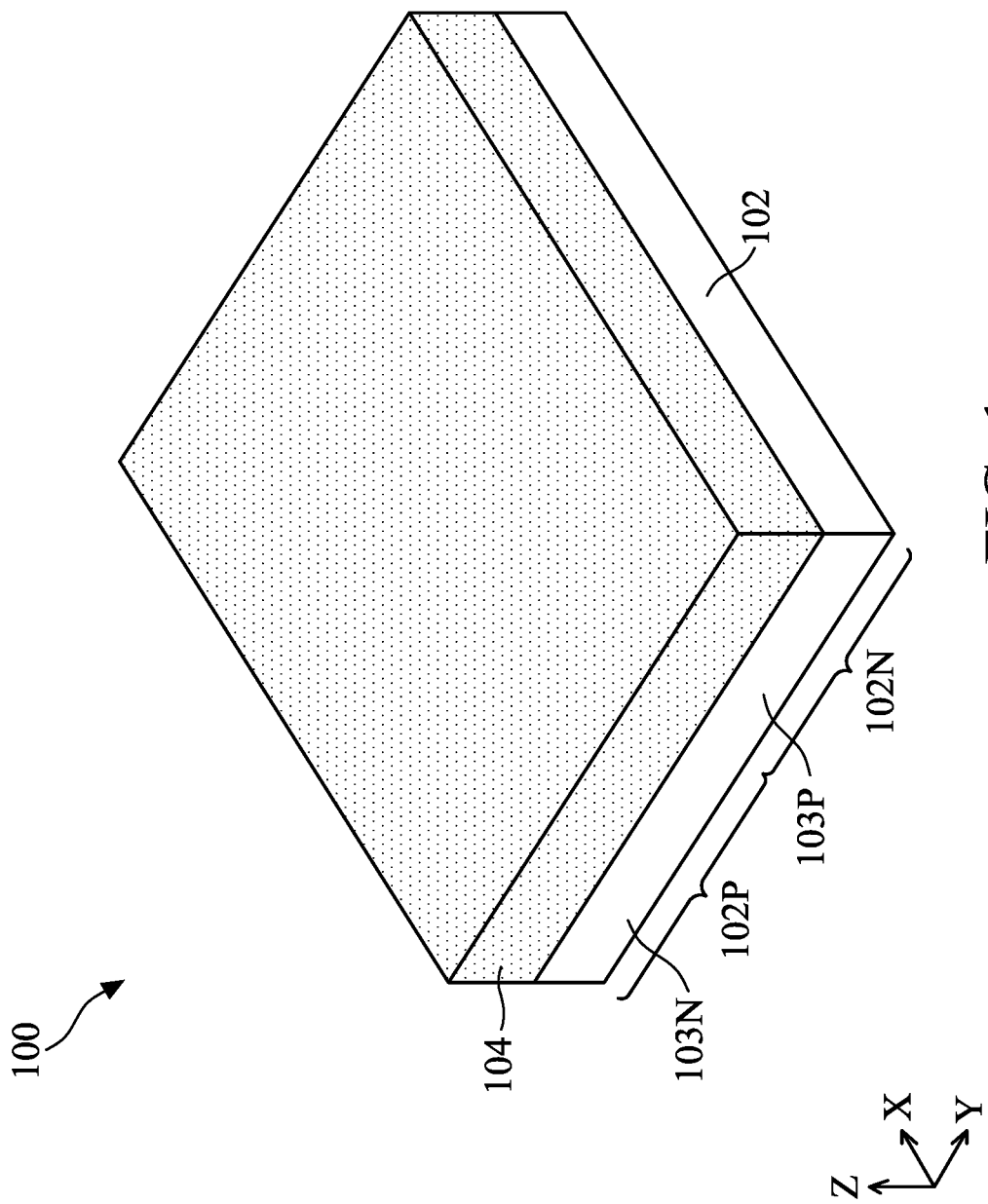
FIGS. 1-4 are perspective views of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-25B illustrate various stages of manufacturing a semiconductor device structure 100 in accordance with various embodiments of this disclosure. It is understood that additional operations can be provided before, during, and after processes shown by FIGS. 1-25B and some of the operations described below can be replaced or eliminated, for additional embodiments of the method. The order of the operations/processes may be interchangeable.

FIGS. 1-4 are perspective views of the semiconductor device structure 100, in accordance with some embodiments. In FIG. 1, a first semiconductor layer 104 is formed on a substrate 102. The substrate may be a part of a chip in a wafer. In some embodiments, the substrate 102 is a bulk semiconductor substrate, such as a semiconductor wafer. For example, the substrate 102 is a silicon wafer. The substrate 102 may include silicon or another elementary semiconductor material such as germanium. In some other embodiments, the substrate 102 includes a compound semiconductor. The compound semiconductor may include gallium arsenide, silicon carbide, indium arsenide, indium phosphide, another suitable semiconductor material, or a combination thereof. In some embodiments, the substrate 102 is a semiconductor-on-insulator (SOI) substrate. The SOI substrate may be fabricated using a separation by implantation of oxygen (SIMOX) process, a wafer bonding process, another applicable method, or a combination thereof.

The substrate 102 may be doped with P-type or N-type impurities. As shown in FIG. 1, the substrate 102 has a P-type metal-oxide-semiconductor region 102P (PMOS region 102P) and an N-type metal-oxide-semiconductor region 102N (NMOS region 102N) adjacent to the PMOS region 102P, in accordance with some embodiments. While not shown in scale in some figures, the PMOS region 102P and NMOS region 102N belong to a continuous substrate 102. In some embodiments of the present disclosure, the PMOS region 102P is used to form a PMOS structure thereon, whereas the NMOS region 102N is used to form an NMOS structure thereon. In some embodiments, an N-well region 103N and a P-well region 103P are formed in the substrate 102, as shown in FIG. 1. For example, the N-well region 103N is formed in the substrate 102 in the PMOS region 102P, whereas the P-well region 103P is formed in the substrate 102 in the NMOS region 102N. The P-well region 103P and the N-well region 103N may be formed by any suitable technique, for example, by separate ion implantation processes in some embodiments. By using two different implantation mask layers (not shown), the P-well region 103P and the N-well region 103N can be sequentially formed in different ion implantation processes.

The first semiconductor layer 104 is deposited over the substrate 102, as shown in FIG. 1. The first semiconductor layer 104 may be made of any suitable semiconductor material, such as silicon, germanium, III-V semiconductor material, or combinations thereof. In some embodiments, the first semiconductor layer 104 is substantially made of silicon. The first semiconductor layer 104 may be formed by an epitaxial growth process, such as metal-organic chemical vapor deposition (MOCVD), metal-organic vapor phase epitaxy (MOVPE), plasma-enhanced chemical vapor deposition (PECVD), remote plasma chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable process.

Figure 2:
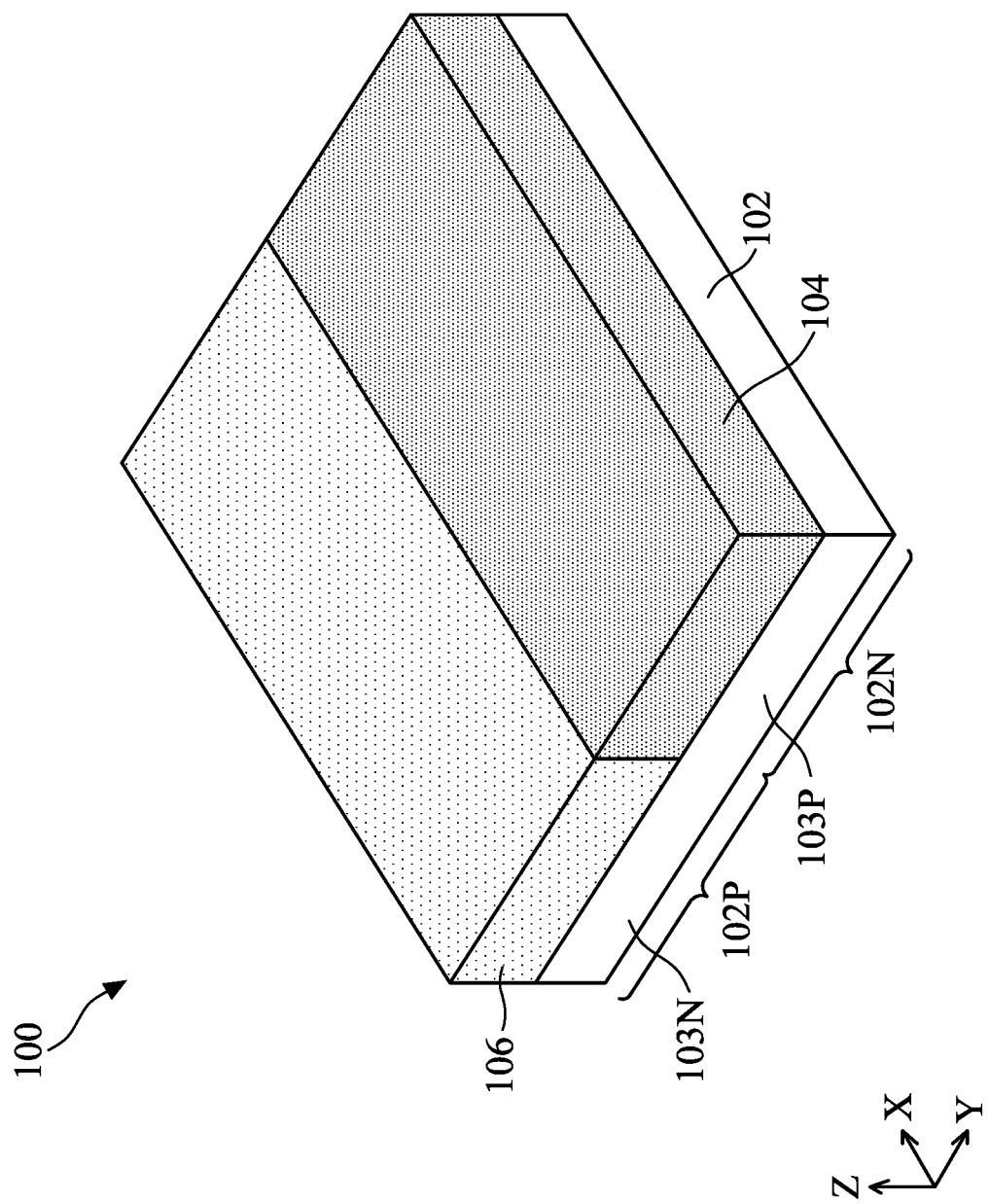

In FIG. 2, the portion of the first semiconductor layer 104 disposed over the N-well region 103N is removed, and a second semiconductor layer 106 is formed over the N-well region 103N and adjacent the portion of the first semiconductor layer 104 disposed over the P-well region 103P. A patterned mask layer (not shown) may be first formed on the portion of the first semiconductor layer 104 disposed over the P-well region 103P, and the portion of the first semiconductor layer 104 disposed over the N-well region 103N may be exposed. A removal process, such as a dry etch, wet etch, or a combination thereof, may be performed to remove the portion of the first semiconductor layer 104 disposed over the N-well region 103N, and the N-well region 103N may be exposed. The removal process does not substantially affect the mask layer (not shown) formed on the portion of the first semiconductor layer 104 disposed over the P-well region 103P, which protects the portion of the first semiconductor layer 104 disposed over the P-well region 103P. Next, the second semiconductor layer 106 is formed on the exposed N-well region 103N. The second semiconductor layer 106 may be made of any suitable semiconductor material, such as silicon, germanium, III-V semiconductor material, or combinations thereof. In some embodiments, the second semiconductor layer 106 is substantially made of silicon germanium. The second semiconductor layer 106 may be formed by the same process as the first semiconductor layer 104. For example, the second semiconductor layer 106 may be formed on the exposed N-well region 103N by an epitaxial growth process, which does not form the second semiconductor layer 106 on the mask layer (not shown) disposed on the first semiconductor layer 104. As a result, the first semiconductor layer 104 is disposed over the P-well region 103P in the NMOS region 102N, and the second semiconductor layer 106 is disposed over the N-well region 103N in the PMOS region 102P.

Portions of the first semiconductor layer 104 may serve as channels in the subsequently formed NMOS structure in the NMOS region 102N. Portions of the second semiconductor layer 106 may serve as channels in the subsequently formed PMOS structure in the PMOS region 102P. In some embodiments, the NMOS structure and the PMOS structure are FinFETs. While embodiments described in this disclosure are described in the context of FinFETs, implementations of some aspects of the present disclosure may be used in other processes and/or in other devices, such as planar FETs, nanostructure channel FETs, Horizontal Gate All Around (HGAA) FETs, Vertical Gate All Around (VGAA) FETs, and other suitable devices.

Figure 3:
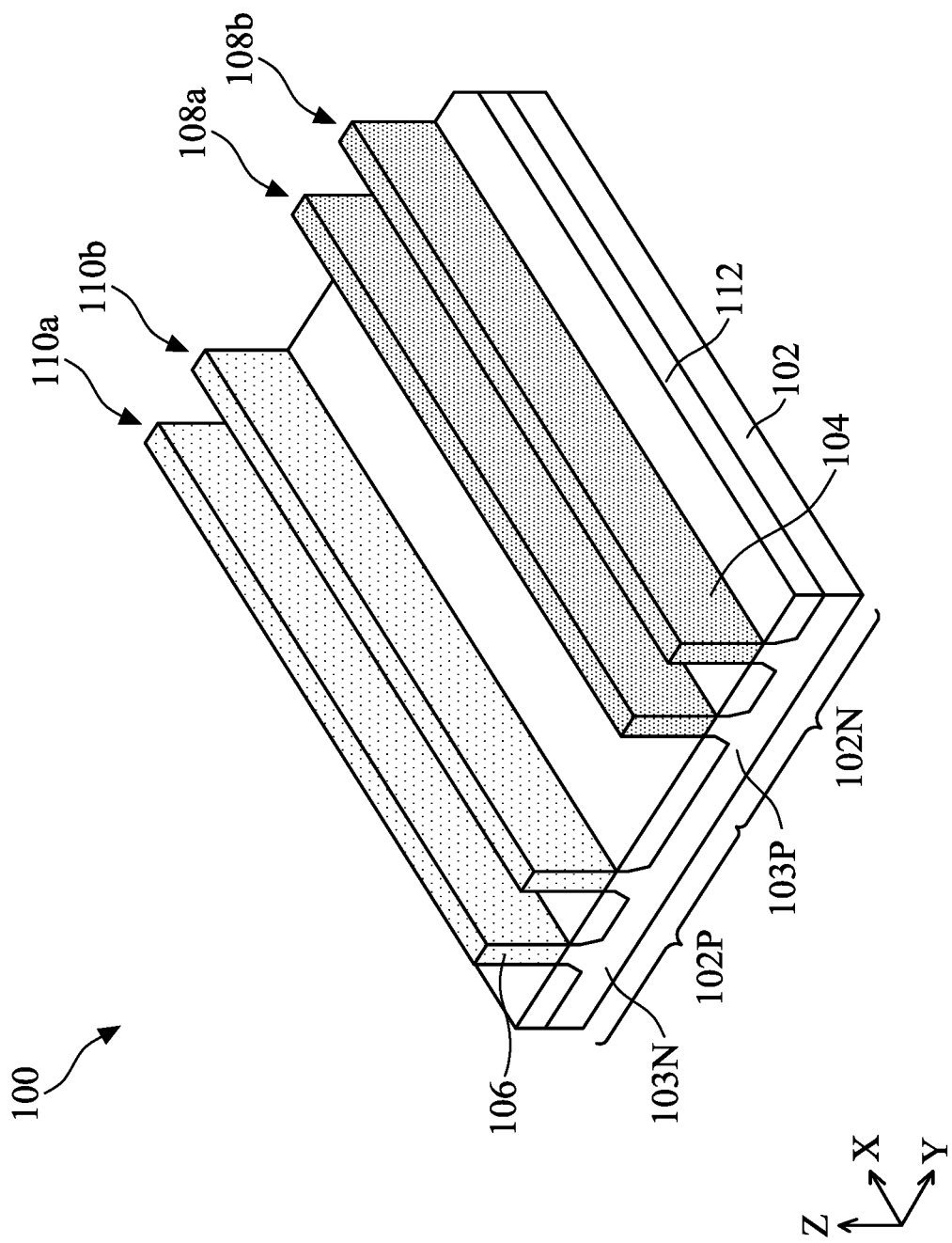

In FIG. 3, a plurality of fins 108a, 108b, 110a, 110b are formed from the first and second semiconductor layers 104, 106. The fins 108a, 108b, 110a, 110b may be patterned by any suitable method. For example, the fins 108a, 108b, 110a, 110b may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer (not shown) is formed over a substrate and patterned using a photolithography process. Spacers (not shown) are formed alongside the patterned sacrificial layer using a self-aligned process. The sacrificial layer is then removed, and the remaining spacers may then be used to pattern the substrate and form the fins.

The fins 108a, 108b may each include the first semiconductor layer 104, and a portion of the first semiconductor layer 104 may serve as an NMOS channel. Each fin 108a, 108b may also include the P-well region 103P. Likewise, the fins 110a, 110b may each include the second semiconductor layer 106, and a portion of the second semiconductor layer 106 may serve as a PMOS channel. Each fin 110a, 110b may also include the N-well region 103N. A mask (not shown) may be formed on the first and second semiconductor layers 104, 106, and may remain on the fins 108a-b and 110a-b.

Next, an insulating structure 112 is formed between adjacent fins 108a-b, 110a-b. The insulating structure 112 may be first formed between adjacent fins 108a-b, 110a-b and over the fins 108a-b, 110a-b, so the fins 108a-b, 110a-b are embedded in the insulating structure 112. The insulating structure 112 may include an oxygen-containing material, such as silicon oxide, carbon or nitrogen doped oxide, or fluorine-doped silicate glass (FSG); a nitrogen-containing material, such as silicon nitride, silicon oxynitride (SiON), SiOCN, SiCN; a low-K dielectric material (e.g., a material having a K value lower than that of silicon dioxide); or any suitable dielectric material. The insulating structure 112 may be formed by any suitable method, such as low-pressure chemical vapor deposition (LPCVD), plasma enhanced CVD (PECVD) or flowable CVD (FCVD).

Next, a planarization process, such as a chemical-mechanical polishing (CMP) process may be performed to expose the top of the fins 108a-b, 110a-b. In some embodiments, the planarization process exposes the top of the mask (not shown) disposed on the fins 108a-b and 110a-b. The insulating structure 112 is then recessed by removing portions of the insulating structure 112 located on both sides of each fin 108a-b, 110a-b. The recessed insulating structure 112 may be shallow trench isolation (STI) region.

Figure 4:
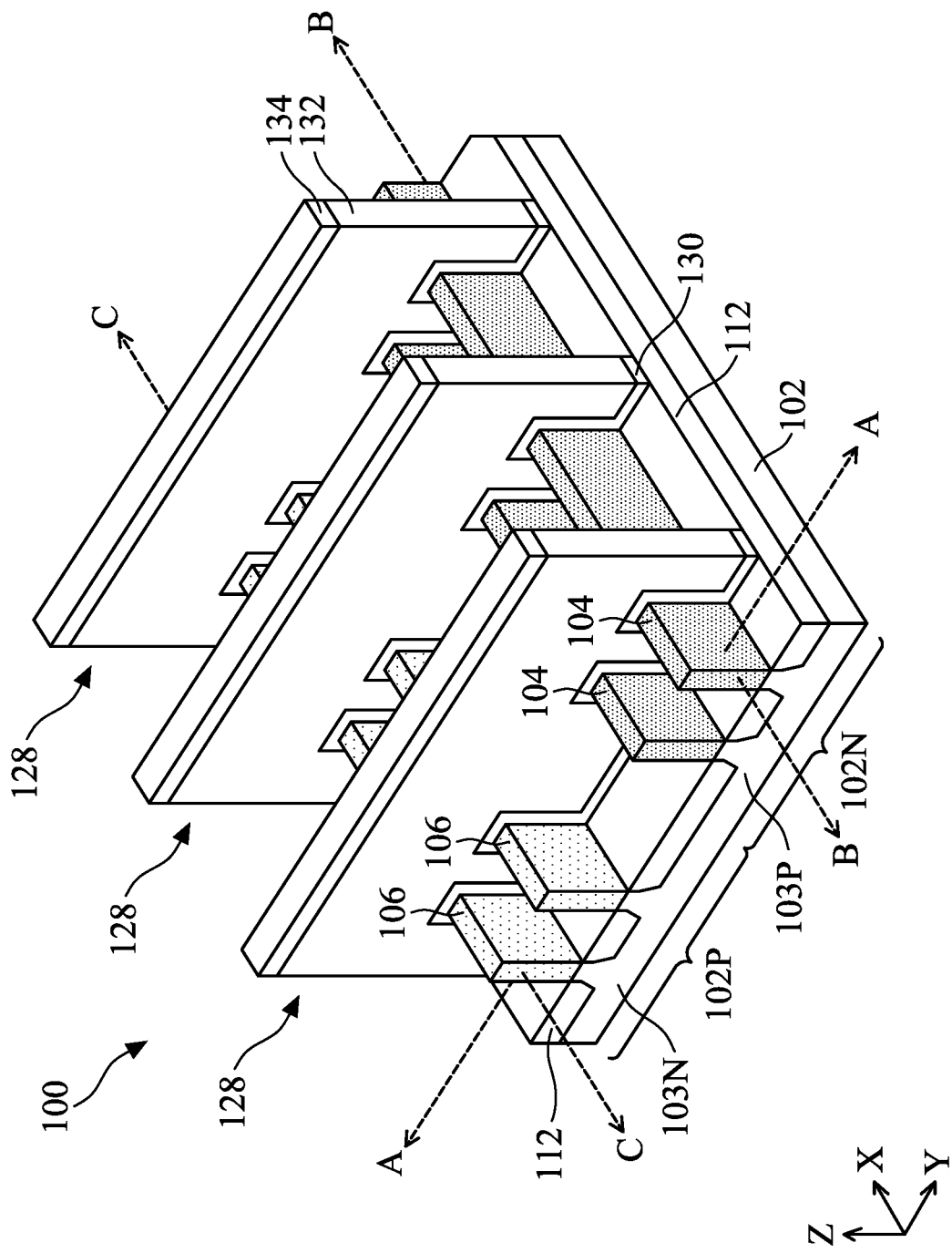

In FIG. 4, one or more sacrificial gate stacks 128 are formed on a portion of the fins 108a-b, 110a-b. Each sacrificial gate stack 128 may include a sacrificial gate dielectric layer 130, a sacrificial gate electrode layer 132, and a mask structure 134. The sacrificial gate dielectric layer 130 may include one or more layers of dielectric material, such as $SiO_2$, SiN, a high-K dielectric material, and/or other suitable dielectric material. In some embodiments, the sacrificial gate dielectric layer 130 may be deposited by a CVD process, a sub-atmospheric CVD (SACVD) process, a FCVD process, an ALD process, a PVD process, or other suitable process. The sacrificial gate electrode layer 132 may include polycrystalline silicon (polysilicon). The mask structure 134 may include an oxygen-containing layer and a nitrogen-containing layer. In some embodiments, the sacrificial gate electrode layer 132 and the mask structure 134 are formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 128 may be formed by first depositing blanket layers of the sacrificial gate dielectric layer 130, the sacrificial gate electrode layer 132, and the mask structure 134, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate stacks 128, the fins 108a-b, 110a-b are partially exposed on opposite sides of the sacrificial gate stacks 128. Portions of the insulating structure 112 are exposed as a result of the etch process(es) to form the sacrificial gate stacks 128. While three sacrificial gate stacks 128 are shown in FIG. 4, it can be appreciated that they are for illustrative purpose only and any number of the sacrificial gate stacks 128 may be formed.

FIGS. 5A-10A are cross-sectional side views of various stages of manufacturing the semiconductor device structure 100 of FIG. 4 taken along line A-A, in accordance with some embodiments. FIGS. 5B-10B are cross-sectional side views of various stages of manufacturing the semiconductor device structure 100 of FIG. 4 taken along line B-B, in accordance with some embodiments. FIGS. 5C-10C are cross-sectional side views of various stages of manufacturing the semiconductor device structure 100 of FIG. 4 taken along line C-C, in accordance with some embodiments.

Figure 5A:
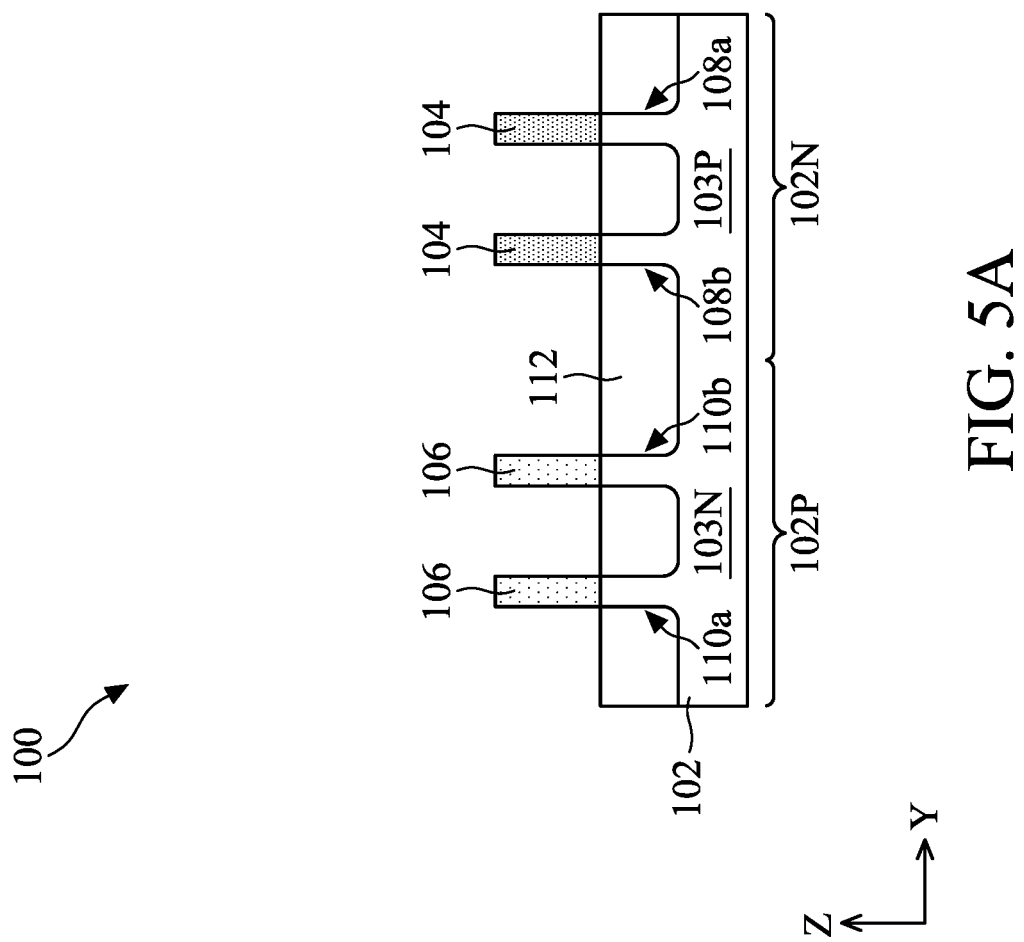
Figure 5B:
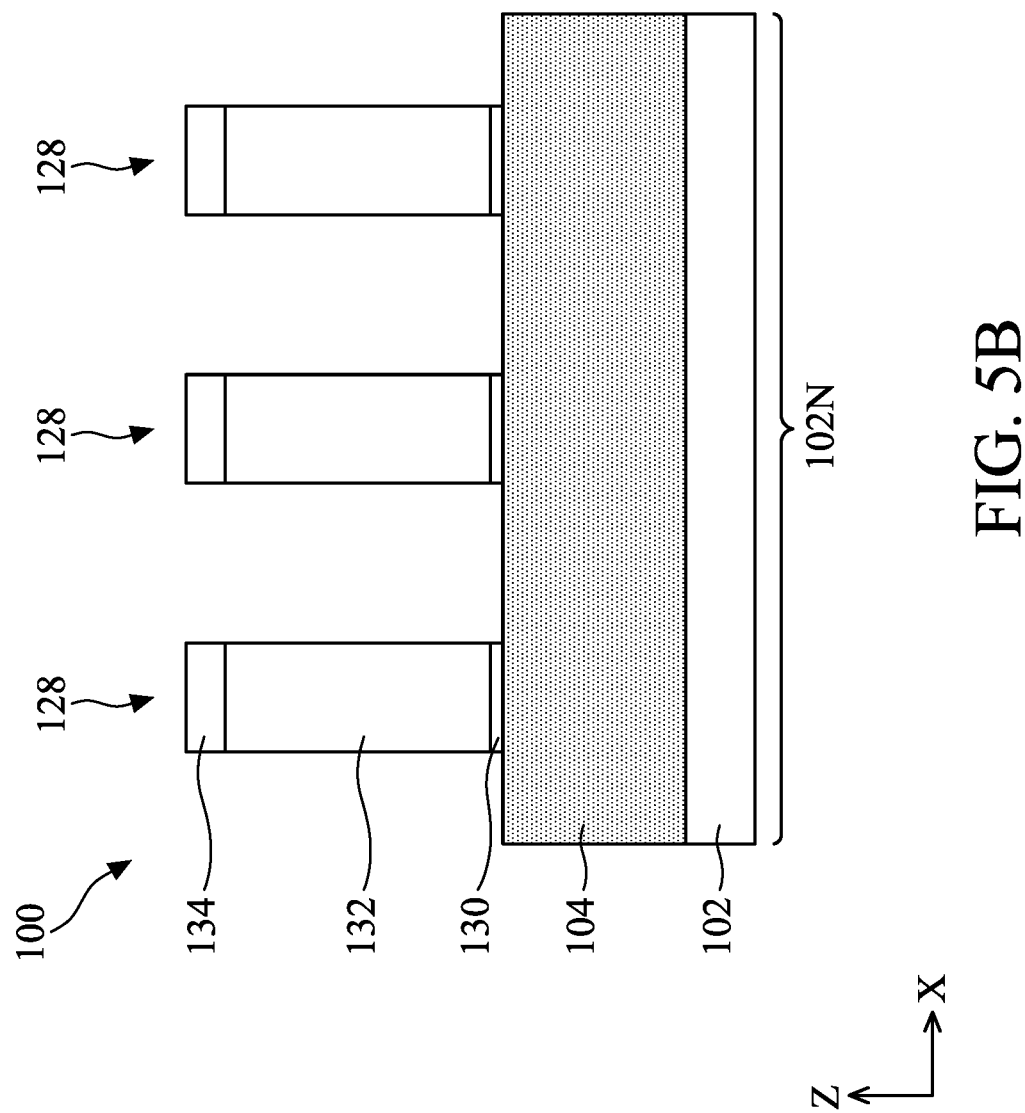
Figure 5C:
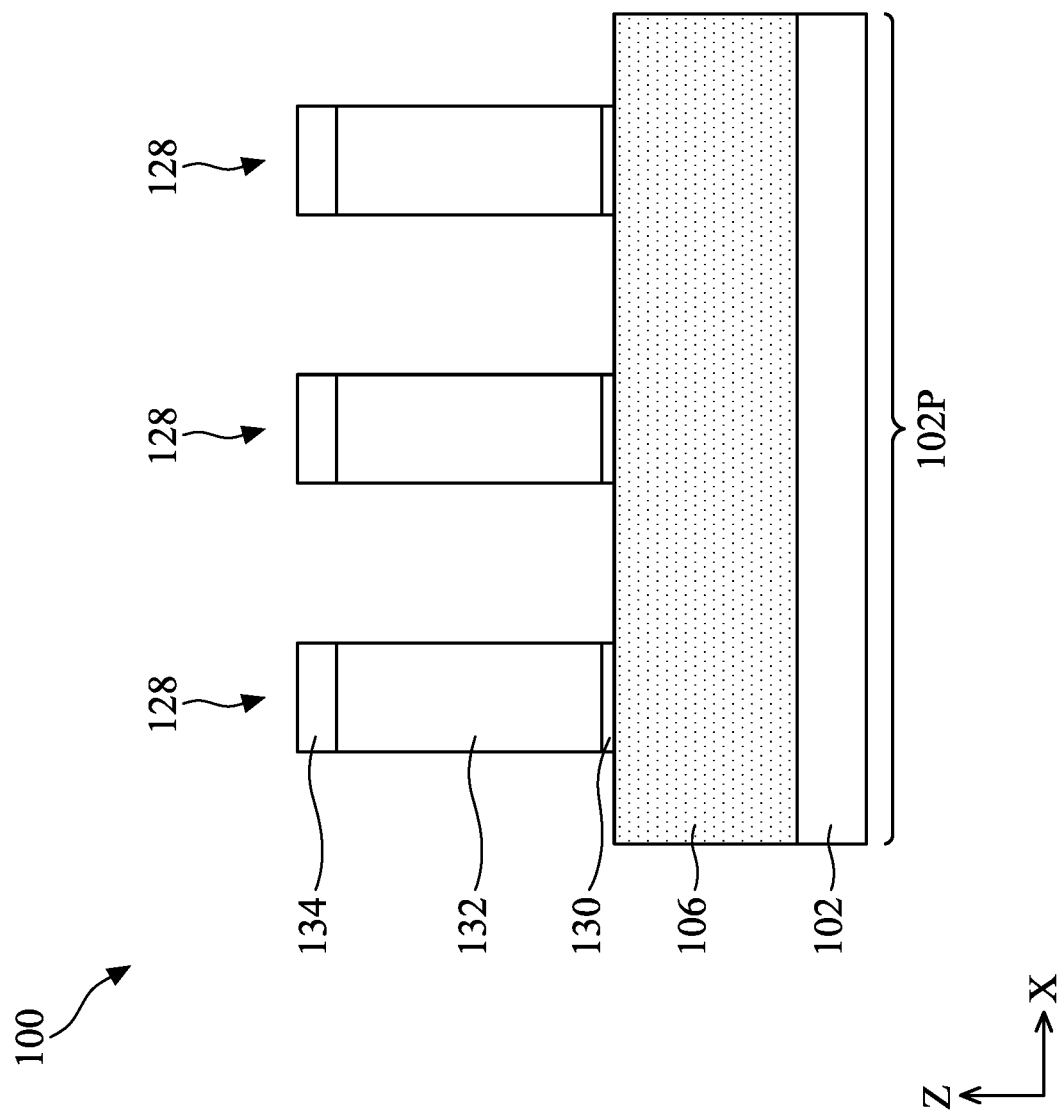
Figure 6A:
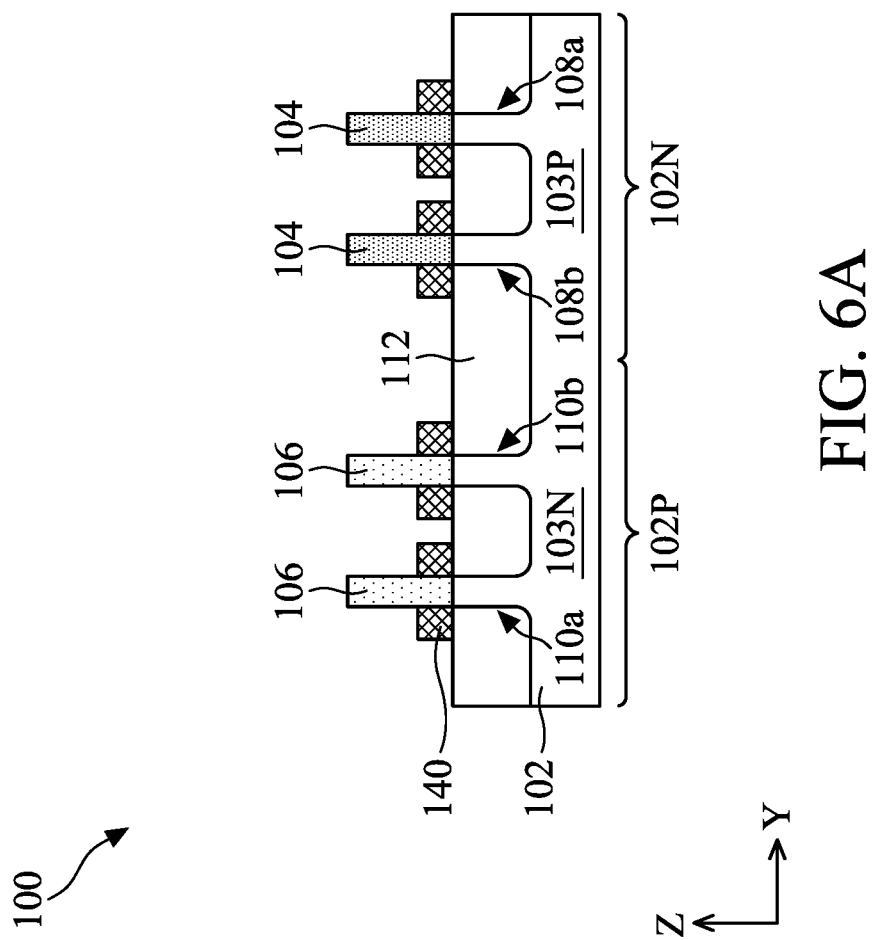
Figure 6B:
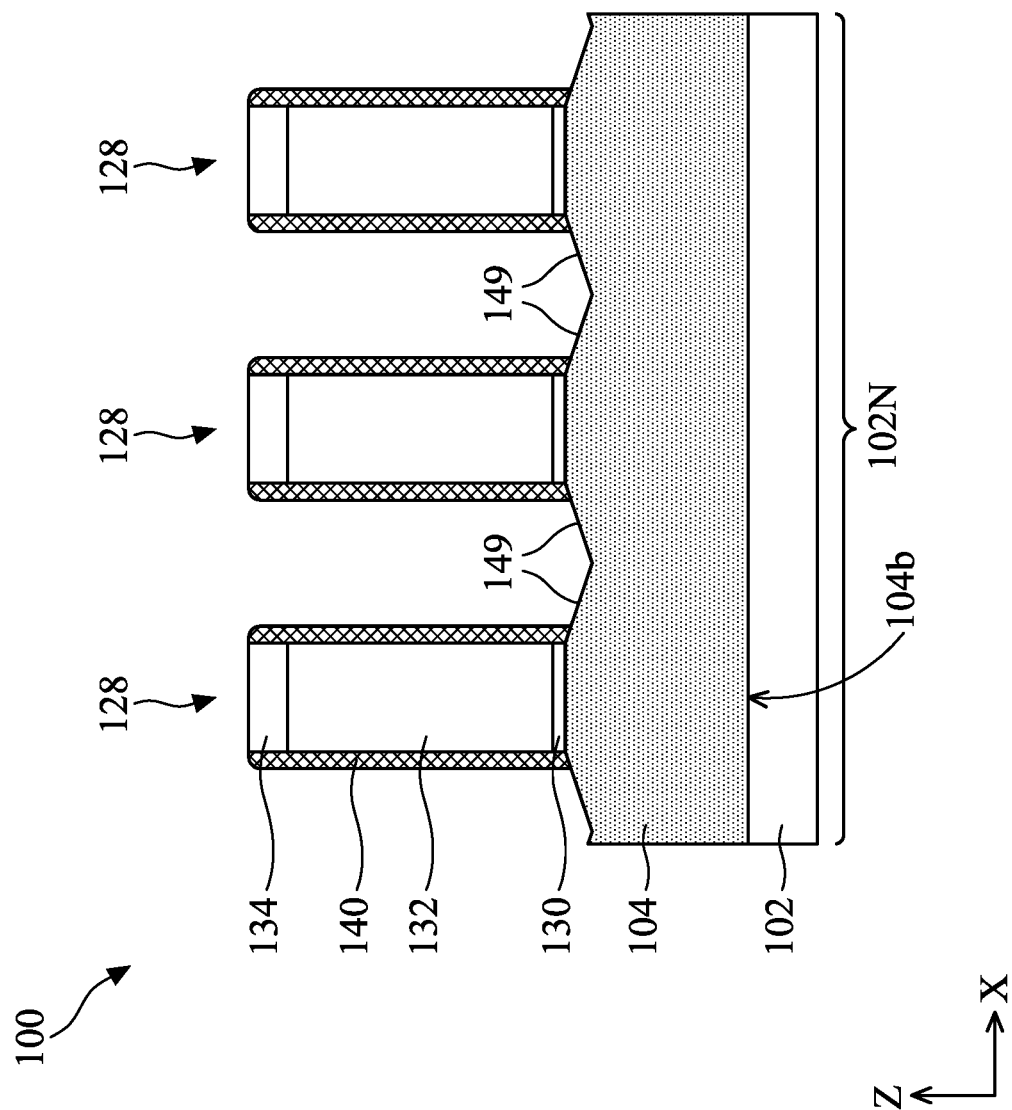

FIGS. 5A-5C illustrate a stage after the sacrificial gate stacks 128 are formed on a portion of the fins 108a-b, 110a-b. In FIGS. 6A-6C, a spacer 140 is formed on the sacrificial gate stacks 128 and the exposed portions of the first and second semiconductor layers 104, 106. The spacer 140 may be conformally deposited on the exposed surfaces of the semiconductor device structure 100. The conformal spacer 140 may be formed by ALD or any suitable processes. An anisotropic etch is then performed on the spacer 140 using, for example, RIE. During the anisotropic etch process, most of the spacer 140 is removed from horizontal surfaces, such as tops of the sacrificial gate stacks 128 and tops of the fins 108a-b, 110a-b, leaving the spacer 140 on the vertical surfaces, such as on opposite sidewalls of the sacrificial gate stacks 128. The spacers 140 may partially remain on opposite sidewalls of the fins 108a-b, 110a-b, as shown in FIG. 6A. In some embodiments, the spacers 140 formed on the source/drain regions of the fins 108a-b, 110a-b are fully removed.

The spacer 140 may be made of a dielectric material such as silicon oxide ($SiO_2$), silicon nitride ($Si_3N_4$), silicon carbide (SiC), silicon oxynitride (SiON), silicon carbon-nitride (SiCN), silicon oxycarbide (SiOC), silicon oxycarbonitride (SiOCN), air gap, and/or any combinations thereof. In some embodiments, the spacer 140 include one or more layers of the dielectric material discussed above.

In various embodiments where the spacer 140 includes multiple layers, the top portion of the fins 108a-b, 110a-b not covered by the sacrificial gate stacks 128 may have a taper profile 149, as shown in FIGS. 6B, 6C. The taper profile 149 may be formed as a result of multiple exposure of the first and second semiconductor layers 104, 106 to etchants used during formation of the spacer 140. The taper profile 149 between adjacent sacrificial gate stacks 128 forms a shallow V-shaped top surface in the first and second semiconductor layers 104, 106, respectively.

Figure 7A:
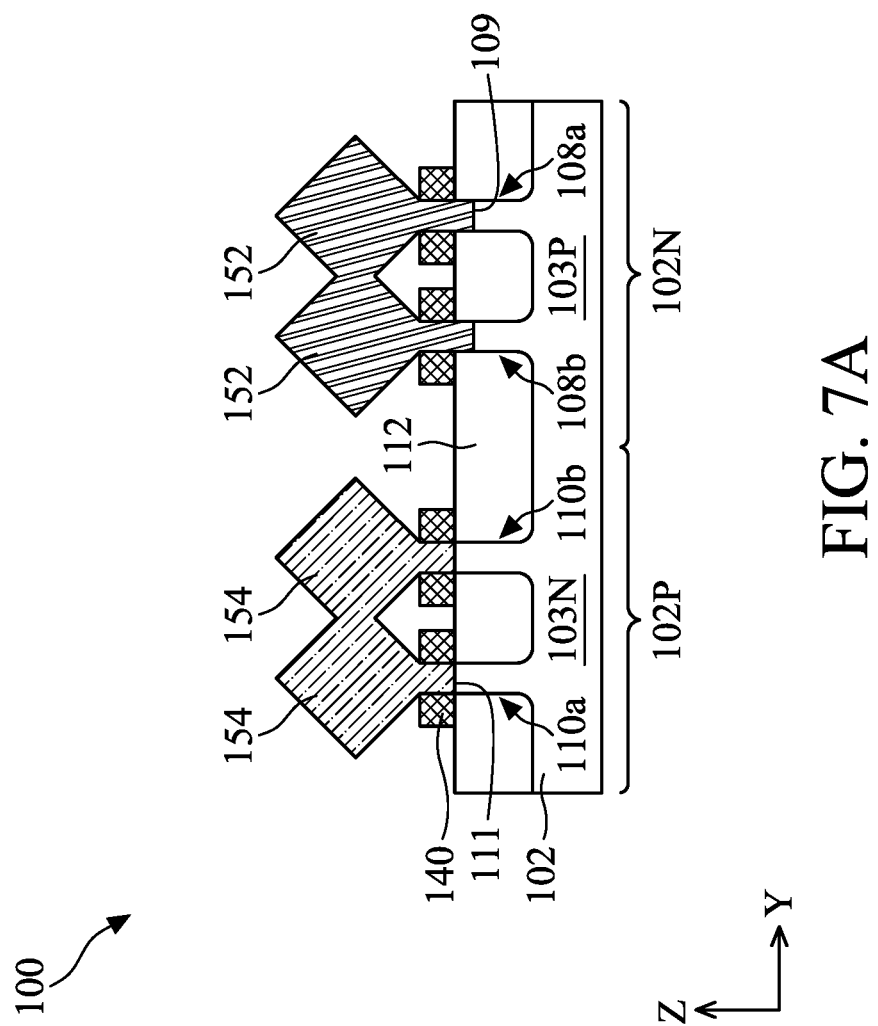
Figure 7B:
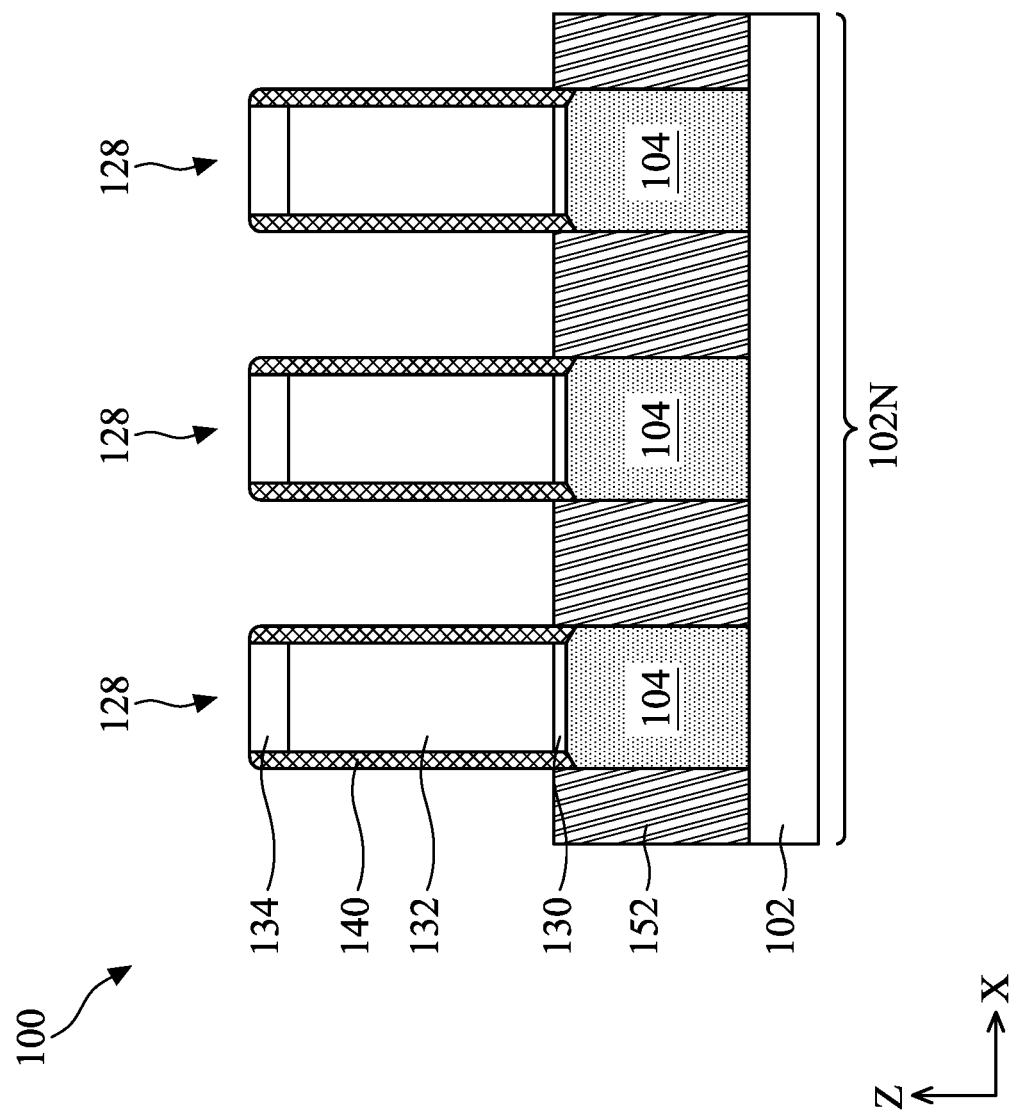
Figure 7C:
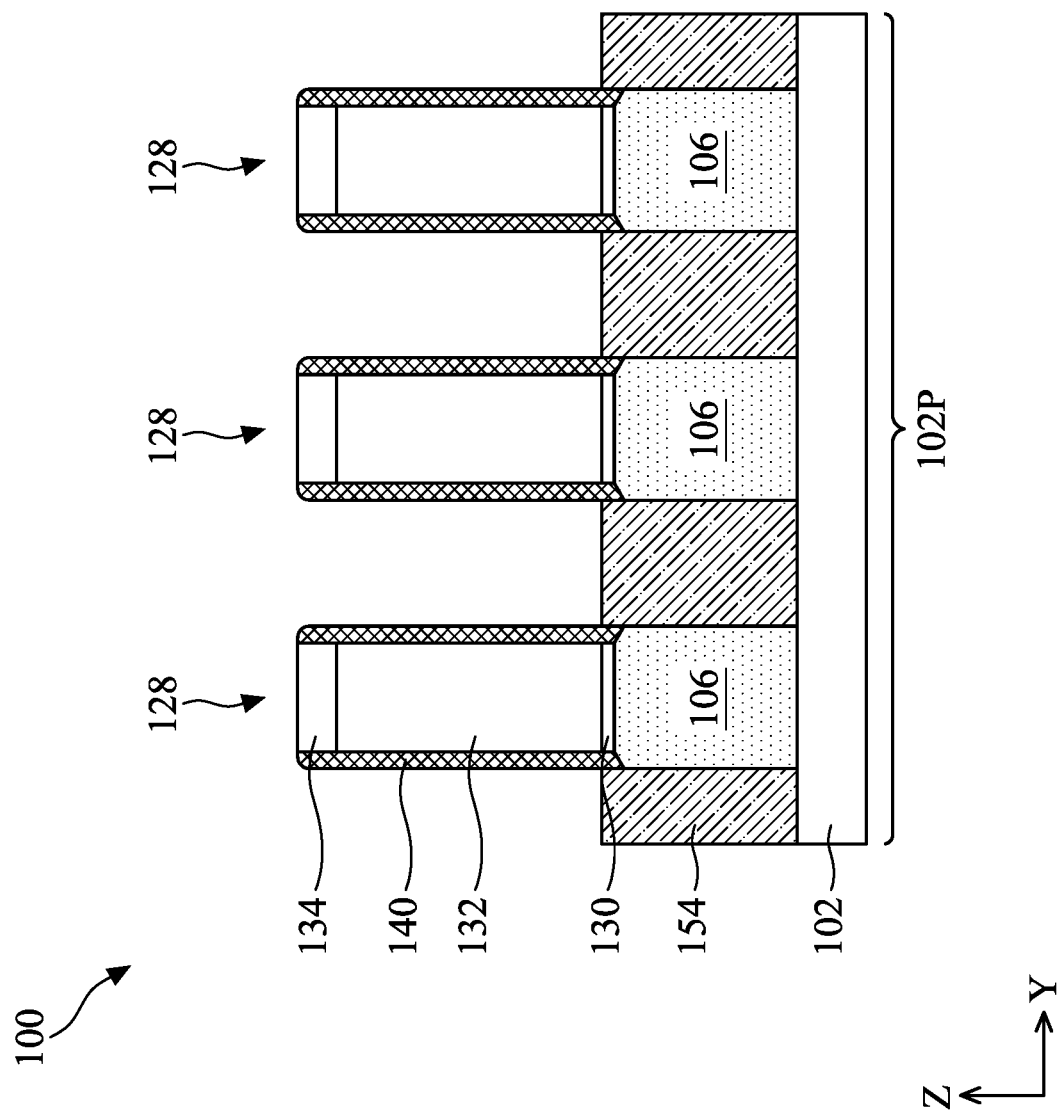

In FIGS. 7A-7C, the first and second semiconductor layers 104, 106 of the fins 108a-b, 110a-b not covered by the sacrificial gate stacks 128 and the spacers 140 are recessed, and source/drain (S/D) epitaxial features 152, 154 are formed. The etchant for recessing of the first and second semiconductor layers 104, 106 is selected so different materials have different etch rates. For example, the first semiconductor layer 104 of the fins 108a-b may have a first etch rate by the etchant, and the second semiconductor layer 106 of the fins 110a-b may have a second etch rate by the etchant. In the embodiments where the first semiconductor layer 104 in the NMOS region 102N and the second semiconductor layer 106 in the PMOS region 102P each includes different materials (e.g., first semiconductor layer 104 in the NMOS region 102N is SiGe and second semiconductor layer 106 in the PMOS region 102P is Si), the first etch rate is faster than the second etch rate. A portion of the P-well region 103P of the fins 108a-b can be slightly etched before the second semiconductor layer 106 in the PMOS region 102P is fully etched away. As a result, a top surface 109 of the fins 108a-b at the NMOS region 102N is at a level below (e.g., about 2 nm to about 10 nm below) a top surface 111 of the fins 110a-b at the PMOS region 102P, resulting in a deeper S/D junction depth in the NMOS region 102N than that of the PMOS region 102P. While not shown, it is contemplated that such a difference between the top surface 109 and the top surface 111 is applicable to various embodiments of this disclosure.

For devices in the NMOS region 102N, each S/D epitaxial features 152 may include one or more layers of Si, SiP, SiC, SiCP, SiAs, or a group III-V material (InP, GaAs, AlAs, InAs, InAlAs, InGaAs). In some embodiments, each S/D epitaxial feature 152 includes two or more layers of Si, SiP, SiC, SiCP or the group III-V material, and each layer may have a different silicon concentration. Each S/D epitaxial feature 152 may include N-type dopants, such as phosphorus (P), arsenic (As), or other suitable N-type dopants. The S/D epitaxial features 152 may be formed by any suitable method, such as CVD, CVD epitaxy, MBE, or other suitable method. The S/D epitaxial features 152 may be formed on the exposed surface of the fins 108a-b on both sides of each sacrificial gate stack 128, as shown in FIG. 7B. In some embodiments, the portions of the first semiconductor layer 104 on both sides of each sacrificial gate stack 128 are completely removed, and the S/D epitaxial features 152 are formed on the P-well region 103P of the fins 108a-b. The S/D epitaxial features 152 may grow both vertically and horizontally to form facets, which may correspond to crystalline planes of the material used for the substrate 102. In some embodiments, the S/D epitaxial features 152 formed on the P-well region 103P of the fins 108a and 108b are merged, as shown in FIG. 7A. The S/D epitaxial features 152 may each have a top surface at a level higher than a top surface of the first semiconductor layer 104, as shown in FIG. 7B.

For devices in the PMOS region 102P, each S/D epitaxial features 154 may include one or more layers of Si, SiGe, SiGeB, Ge, or a group III-V material (InSb, GaSb, InGaSb), and each layer may have a different silicon or germanium concentration. Each S/D epitaxial feature 154 may include P-type dopants, such as boron (B) or other suitable P-type dopants. In some embodiments, the S/D epitaxial features 152 in the NMOS region 102N and the S/D epitaxial features 154 in the PMOS region 102P are both Si. In some embodiments, the S/D epitaxial features 152 in the NMOS region 102N are Si and the S/D epitaxial features 154 in the PMOS region 102P are SiGe. The S/D epitaxial features 154 may be formed by any suitable method, such as CVD, CVD epitaxy, MBE, or other suitable method. In some embodiments, the portions of the second semiconductor layer 106 on both sides of each sacrificial gate stack 128 are completely removed, and the S/D epitaxial features 154 are formed on the N-well region 103N of the fins 110a-b. The S/D epitaxial features 154 may grow both vertically and horizontally to form facets, which may correspond to crystalline planes of the material used for the substrate 102. In some embodiments, the S/D epitaxial features 154 formed on the N-well region 103N of the fins 110a and 110b are merged, as shown in FIG. 7A. The S/D epitaxial features 154 may each have a top surface at a level higher than a top surface of the second semiconductor layer 106, as shown in FIG. 7C.

Figure 8A:
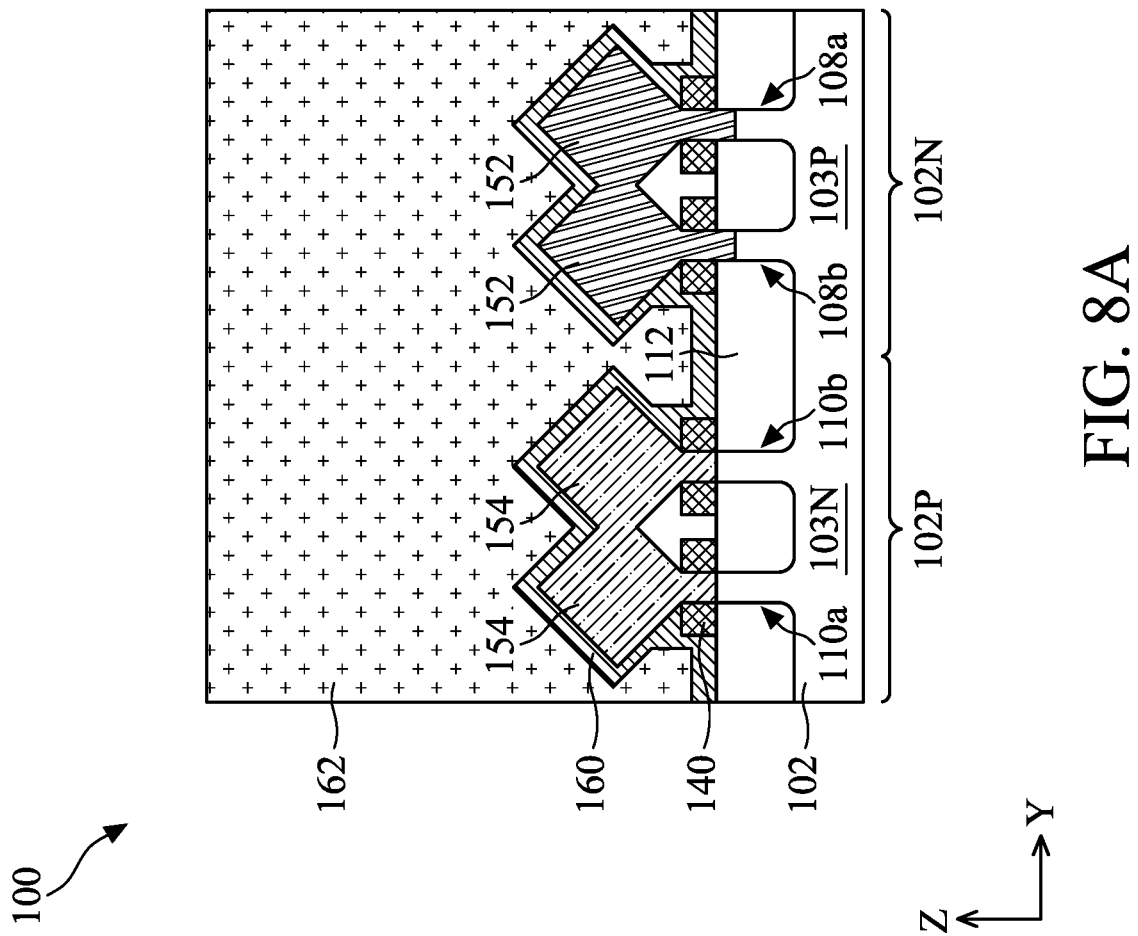
Figure 8B:
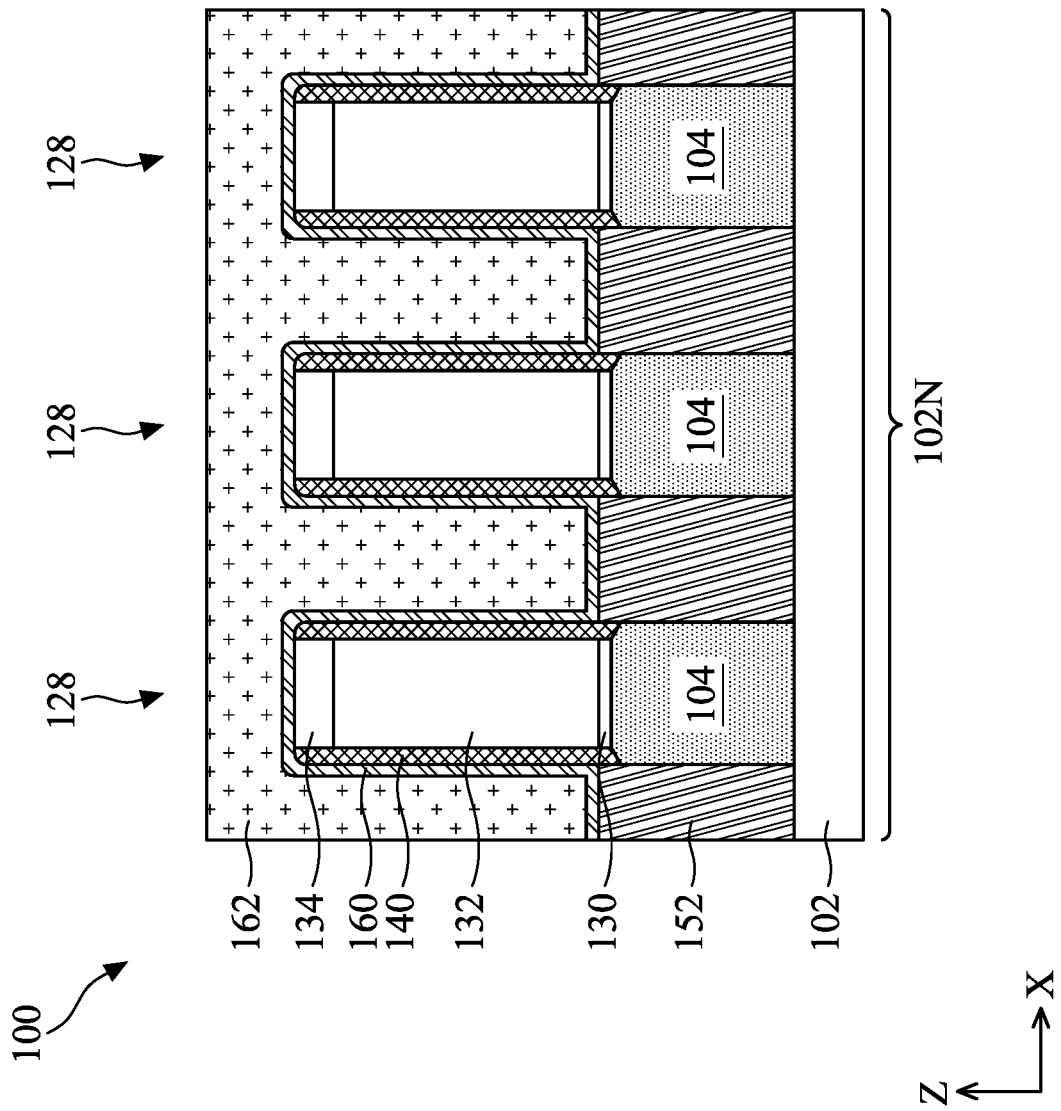
Figure 8C:
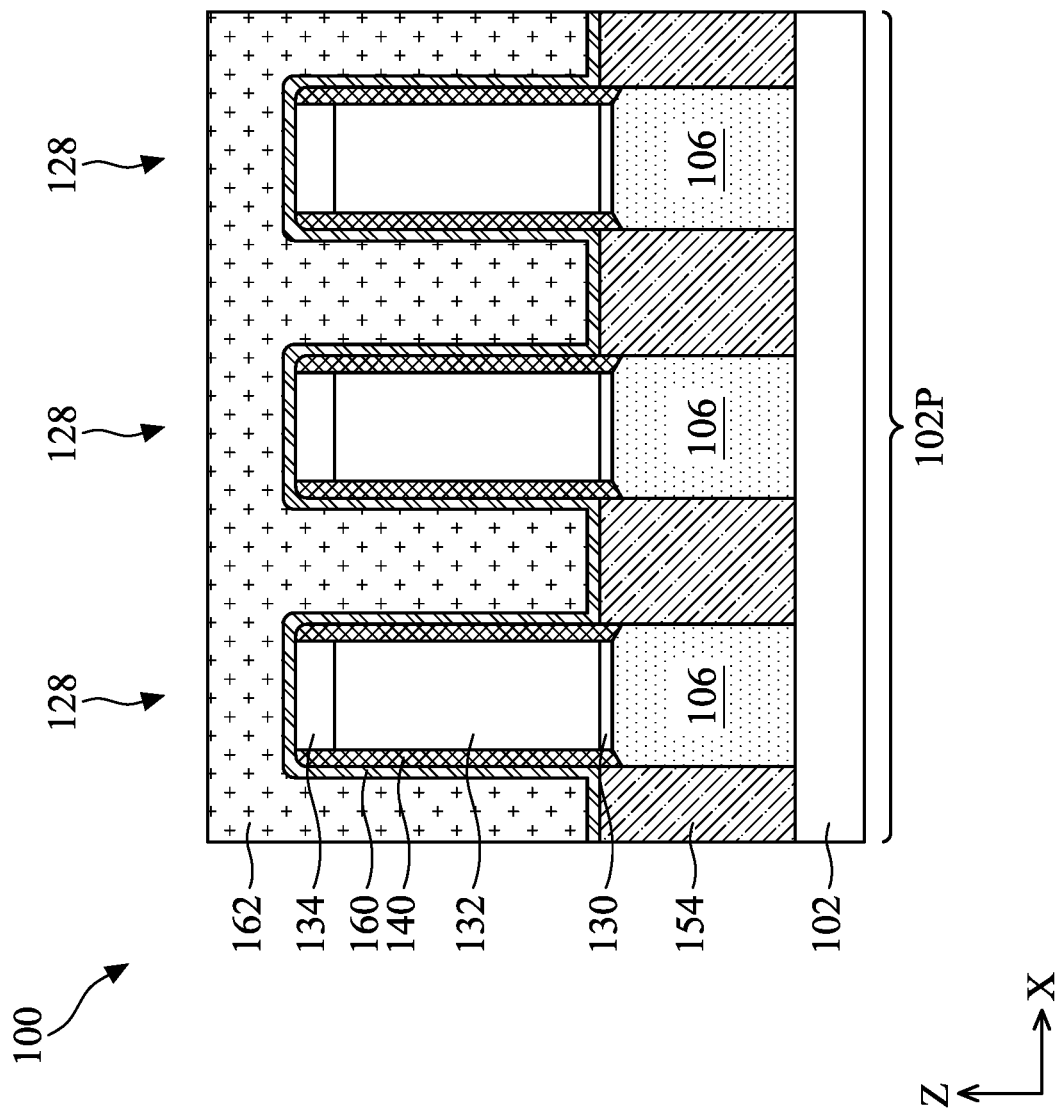

In FIGS. 8A-8C, a contact etch stop layer (CESL) 160 is conformally formed on the exposed surfaces of the semiconductor device structure 100. The CESL 160 covers the sidewalls of the sacrificial gate stacks 128, the insulating structure 112, and the S/D epitaxial features 152, 154. The CESL 160 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique.

Next, an interlayer dielectric (ILD) layer 162 is formed on the CESL 160. The materials for the ILD layer 162 may include compounds comprising Si, O, C, and/or H, such as SiOCH, oxide formed using tetraethylorthosilicate (TEOS), un-doped silicate glass, silicon oxide, or doped silicon oxide such as borophosphosilicate glass (BPSG), fused silica glass (FSG), phosphosilicate glass (PSG), boron doped silicon glass (BSG), and/or other suitable dielectric materials. The ILD layer 162 may be deposited by a PECVD process or other suitable deposition technique.

After the formation of the ILD layer 162, a planarization process is performed to expose the sacrificial gate electrode layer 132. The planarization process may be any suitable process, such as a CMP process. The planarization process removes portions of the ILD layer 162 and the CESL 160 disposed on the sacrificial gate stacks 128. The planarization process may also remove the mask structure 134.

Figure 9A:
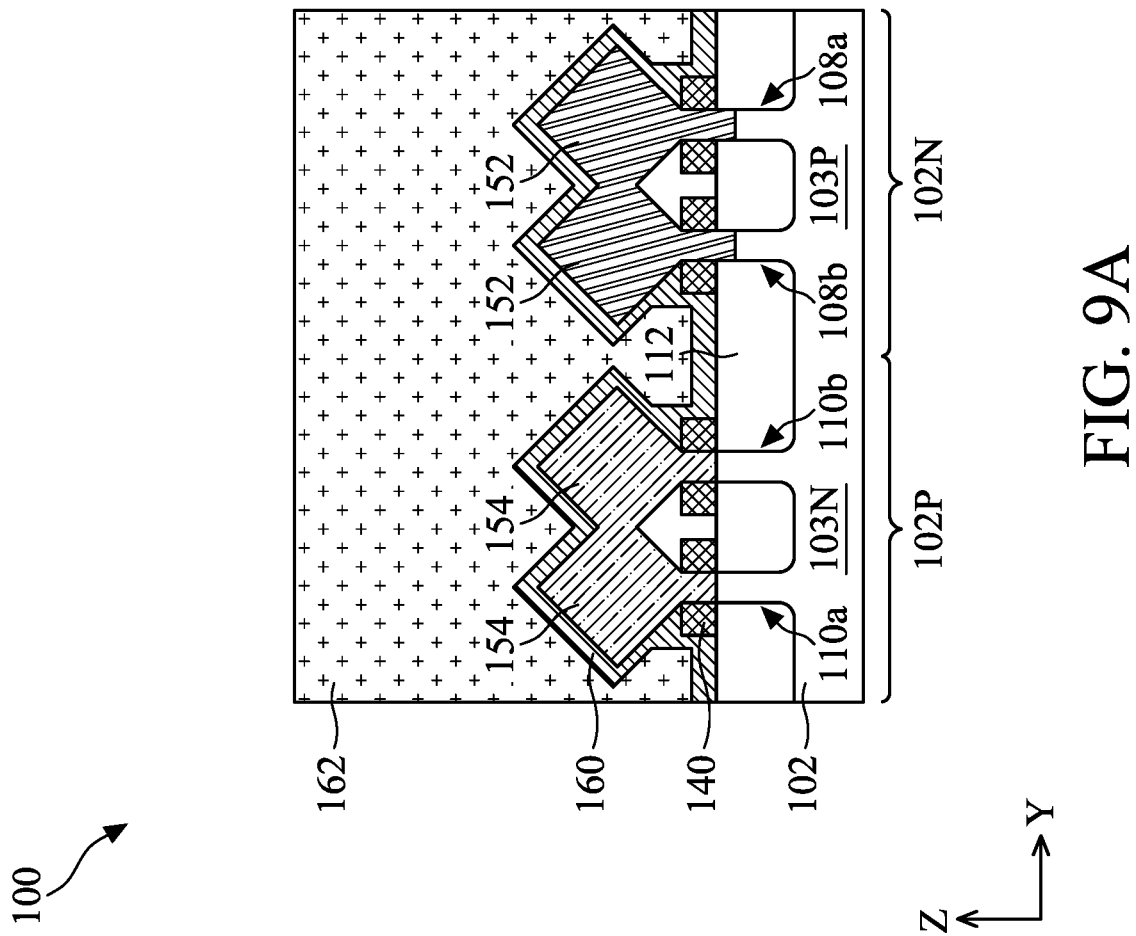
Figure 9B:
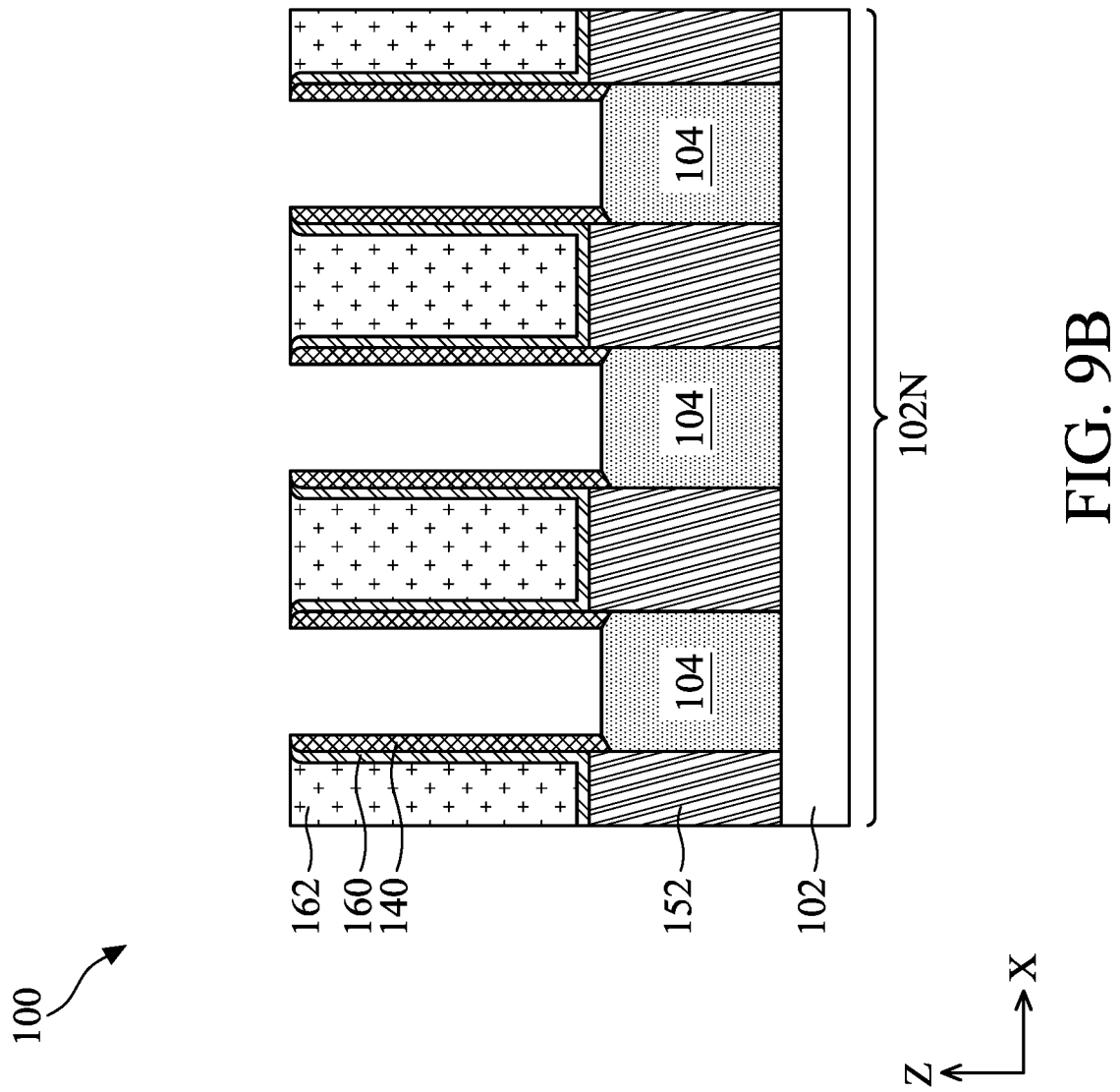
Figure 9C:
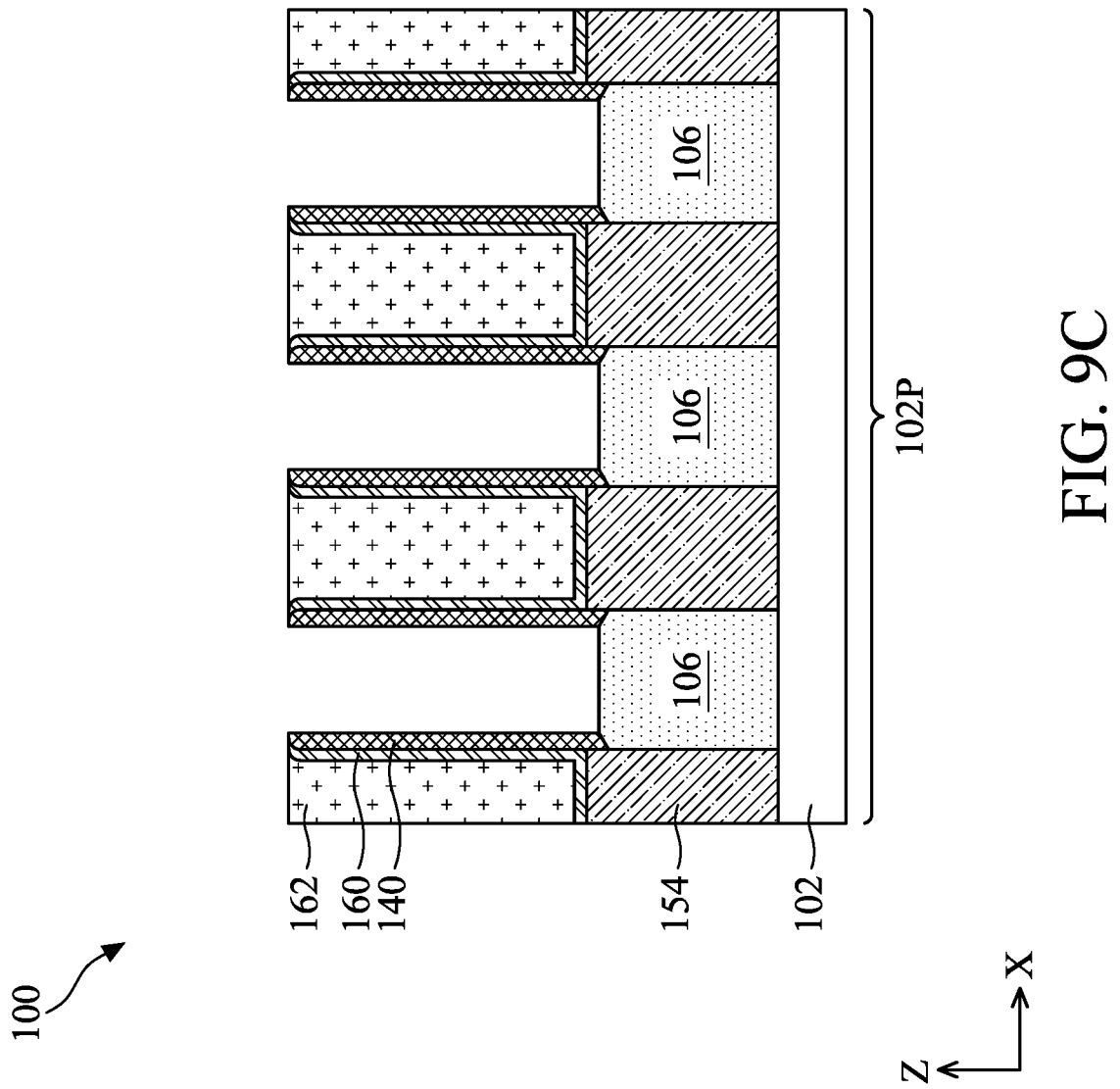

In FIGS. 9A-9C, the mask structure 134 (if not removed during CMP process), the sacrificial gate electrode layers 132 (FIG. 8B), and the sacrificial gate dielectric layers 130 (FIG. 8B) are removed. The sacrificial gate electrode layers 132 and the sacrificial gate dielectric layers 130 may be removed by one or more etch processes, such as dry etch process, wet etch process, or a combination thereof. The one or more etch processes selectively remove the sacrificial gate electrode layers 132 and the sacrificial gate dielectric layers 130 without substantially affects the spacer 140, the CESL 160, and the ILD layer 162. The removal of the sacrificial gate electrode layers 132 and the sacrificial gate dielectric layers 130 exposes a top portion of the first and second semiconductor layers 104, 106 in the channel region.

Figure 10A:
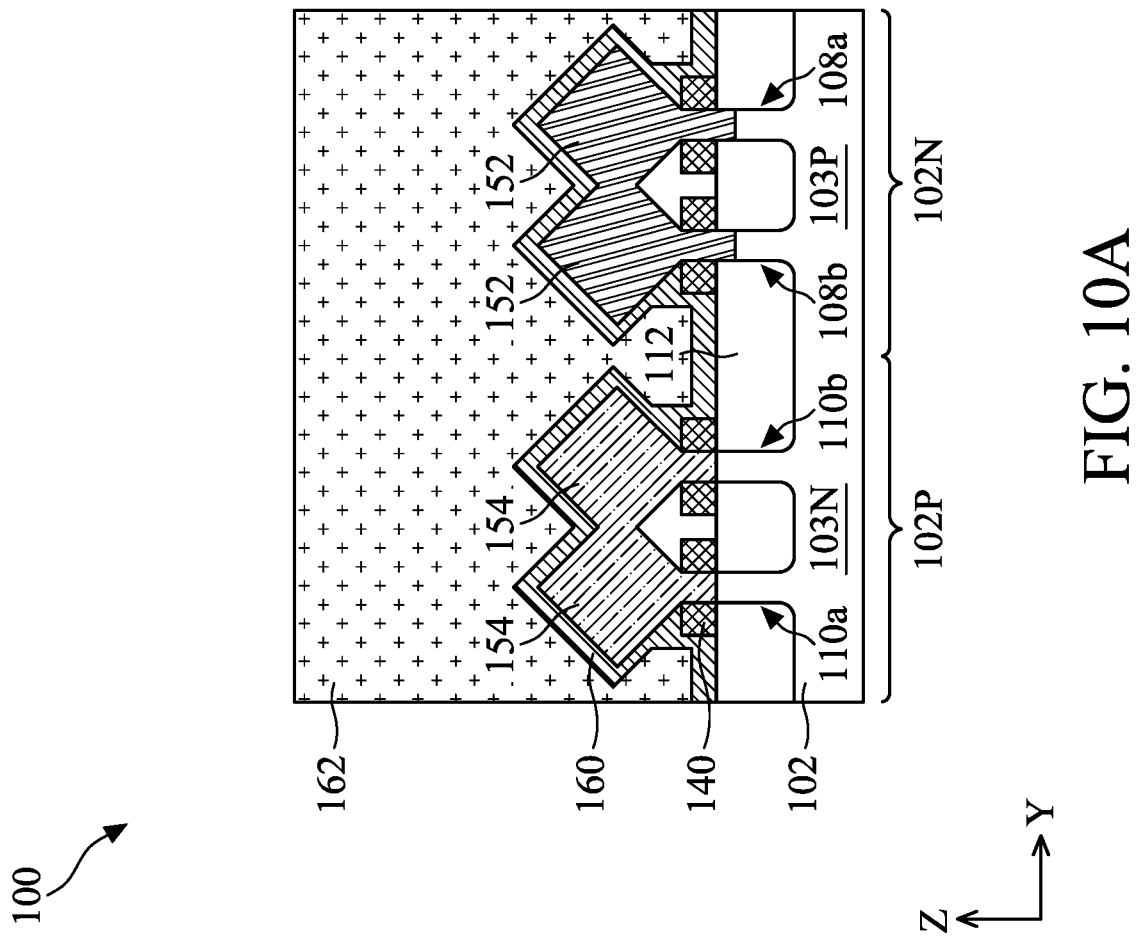
Figure 10B:
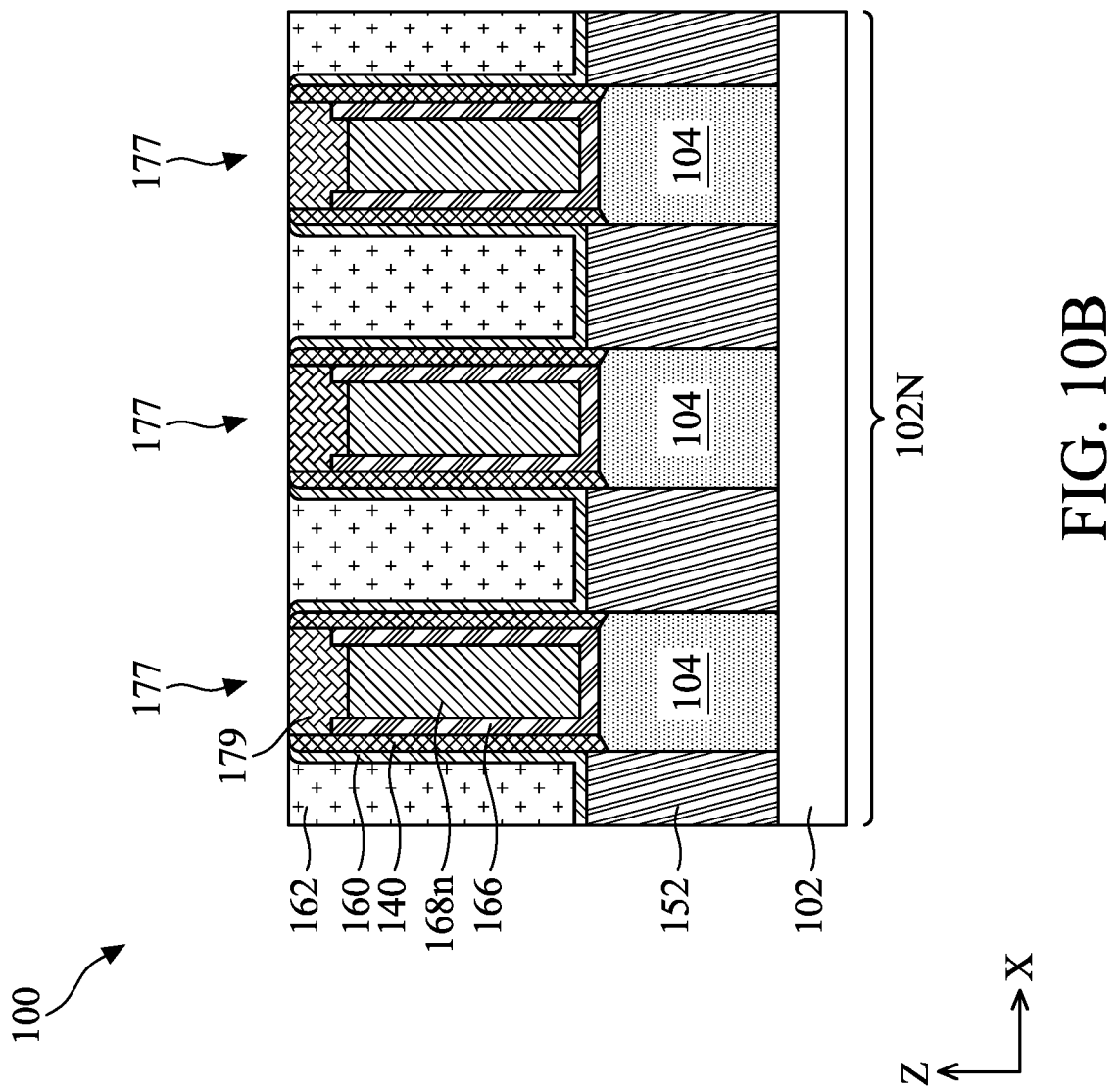
Figure 10C:
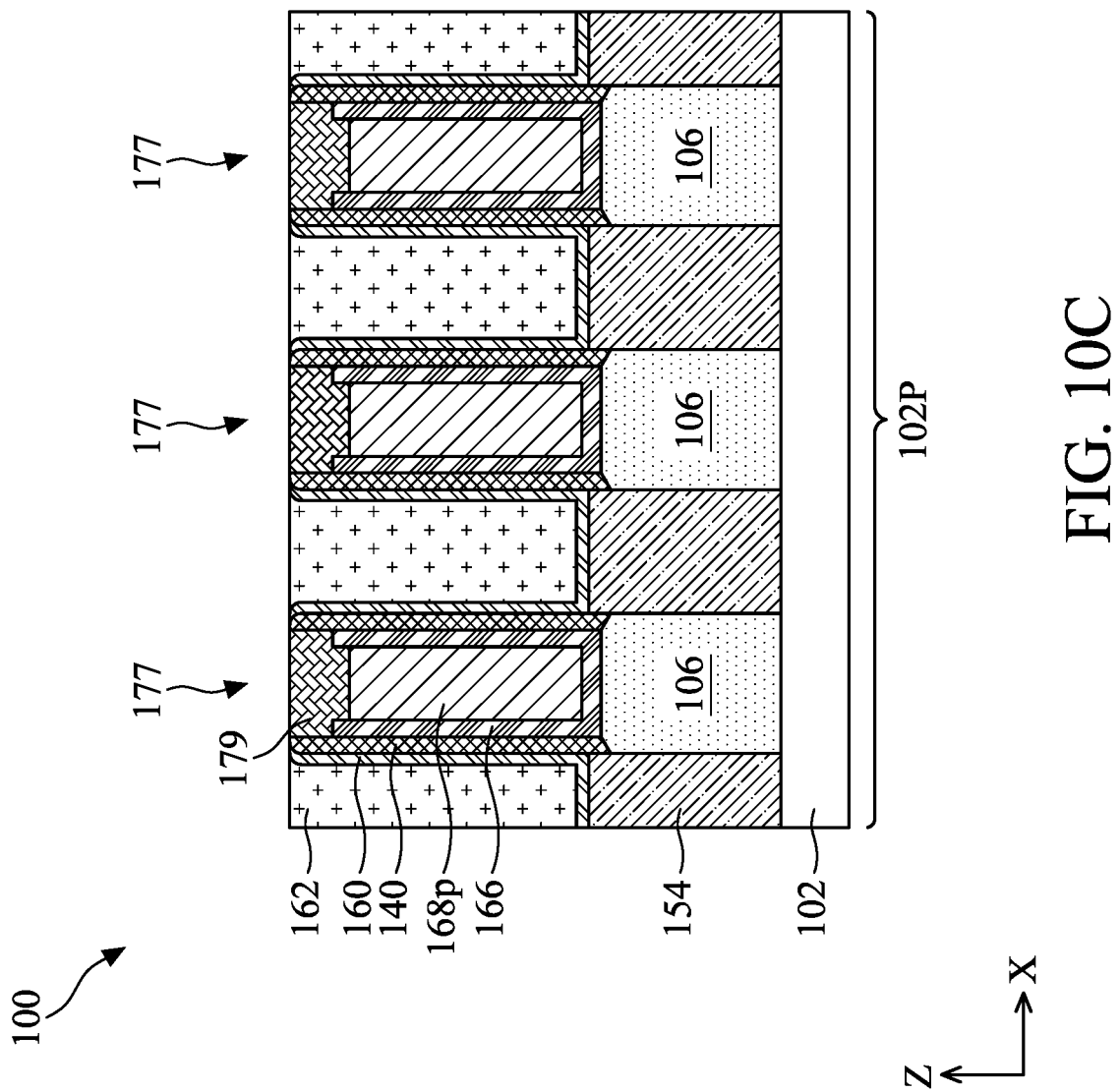

In FIGS. 10A-10C, replacement gate structures 177 are formed. The replacement gate structure 177 may include a gate dielectric layer 166 and a gate electrode layer 168p, 168n formed on the gate dielectric layer 166. As can be seen in FIGS. 10B and 10C, the gate dielectric layer 166 is formed on the first and second semiconductor layers 104, 106. The gate dielectric layer 166 may include one or more dielectric layers and may include the same material(s) as the sacrificial gate dielectric layer 130. In some embodiments, the gate dielectric layers 166 may be deposited by one or more ALD processes or other suitable processes. The gate electrode layer 168p, 186n may include one or more layers of electrically conductive material, such as polysilicon, aluminum, copper, titanium, tantalum, tungsten, cobalt, molybdenum, tantalum nitride, nickel silicide, cobalt silicide, TiN, WN, AlTi, AlTiO, AlTiC, AlTiN, TaCN, TaC, TaSiN, metal alloys, other suitable materials, and/or combinations thereof. For devices in the NMOS region 102N, the gate electrode layer 168n may be AlTiO, AlTiC, or a combination thereof. For devices in the PMOS region 102P, the gate electrode layer 168p may be AlTiO, AlTiC, AlTiN, or a combination thereof. The gate electrode layers 168 may be formed by PVD, CVD, ALD, electro-plating, or other suitable method.

Optionally, a metal gate etching back (MGEB) process is performed to remove portions of the gate dielectric layer 166 and the gate electrode layer 168p, 168n. The MGEB process may be a plasma etching process employing one or more etchants such as chlorine-containing gas, a bromine-containing gas, and/or a fluorine-containing gas. After the MGEB process, a top surface of the gate electrode layer 168p, 168n may be lower than a top surface of the gate dielectric layer 166. In some embodiments, portions of the spacers 140 are etched back so that the top surface of the spacers 140 is higher than the top surfaces of the gate dielectric layer 166 and the gate electrode layer 168p, 168n.

Then, trenches formed above the gate dielectric layer 166 and the gate electrode layer 168p, 168n as a result of the MGEB processes are filled with a self-aligned contact (SAC) layer 179. The SAC layer 179 can be formed of any dielectric material that has different etch selectivity than the CESL 160 and serves as an etch stop layer during subsequent trench and via patterning for metal contacts. A CMP process is then performed to remove excess deposition of the SAC layer 179 until the top surface of the ILD layer 162 is exposed.

FIGS. 11A-21A are cross-sectional side views of various stages of manufacturing the semiconductor device structure 100 of FIG. 4 taken along line A-A, in accordance with some embodiments. FIGS. 11B-21B are cross-sectional side views of various stages of manufacturing the semiconductor device structure 100 of FIG. 4 taken along line B-B, in accordance with some embodiments. FIGS. 11B-21B illustrate the various stages of manufacturing the NMOS region 102N of the semiconductor device structure 100. However, those skilled in the art should appreciate that similar processes may be performed on the PMOS region 102P of the semiconductor device structure 100.

Figure 11B:
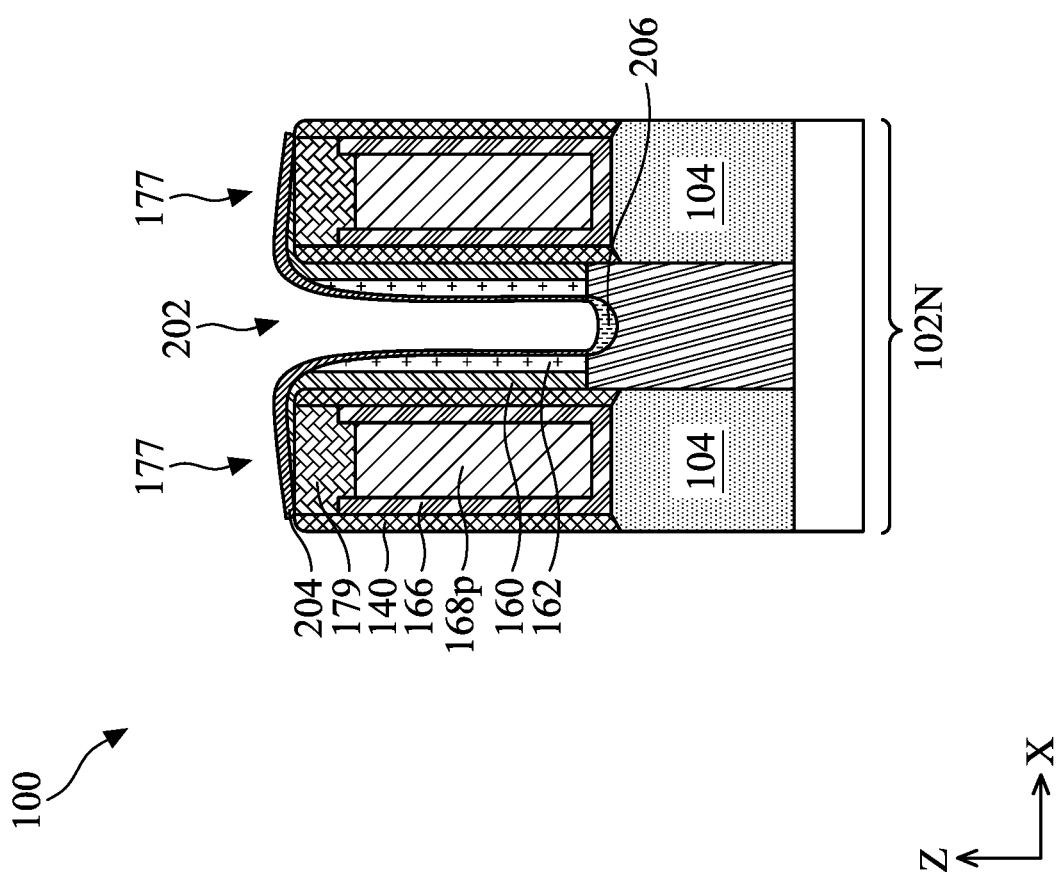
Figure 11A:
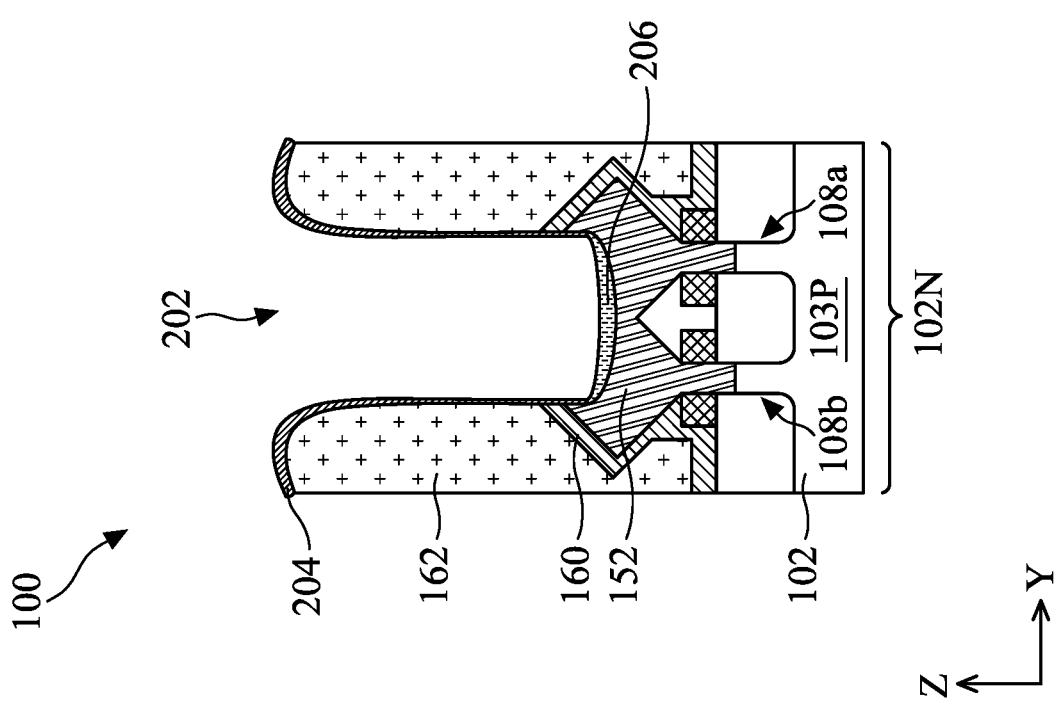

As shown in FIGS. 11A and 11B, portions of the ILD layer 162 and the CESL 160 disposed on both sides of the replacement gate structures 177 are removed. The removal of the portions of the ILD layer 162 and the CESL 160 forms a contact opening 202 exposing the S/D epitaxial feature 152. In some embodiments, the upper portion of the exposed S/D epitaxial feature 152 is removed. The removal of the portions of the ILD layer 162 and the CESL 160 may be performed by a dry or wet etch process. Next, a metal layer 204 is formed in the contact openings 202 and on the ILD layer 162 and the SAC layers 179. The metal layer 204 can be conformally deposited in the contact openings 202 (e.g., on sidewalls of the contact openings 202 and exposed surface of the S/D epitaxial feature 152) and over the ILD layer 162. The metal layer 204 may be or include titanium, tantalum, the like, or a combination thereof, and may be deposited by atomic layer deposition (ALD), chemical vapor deposition (CVD), physical vapor deposition (PVD), or another deposition technique.

As shown in FIGS. 11A and 11B, a silicide region 206 may be formed on the S/D epitaxial feature 152 by reacting an upper portion of the S/D epitaxial feature 152 with the metal layer 204. An anneal can be performed to facilitate the reaction of the S/D epitaxial feature 152 with the metal layer 204 to form the silicide region 206.

Figure 12B:
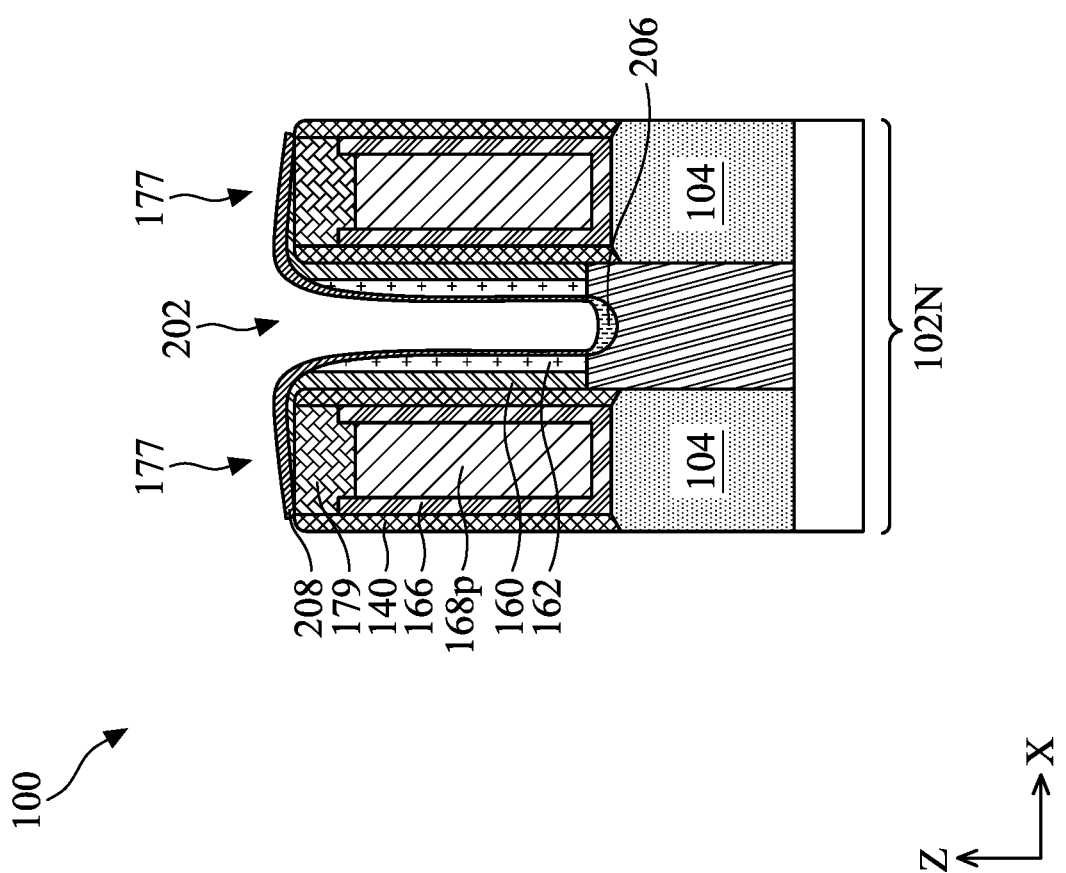
Figure 12A:
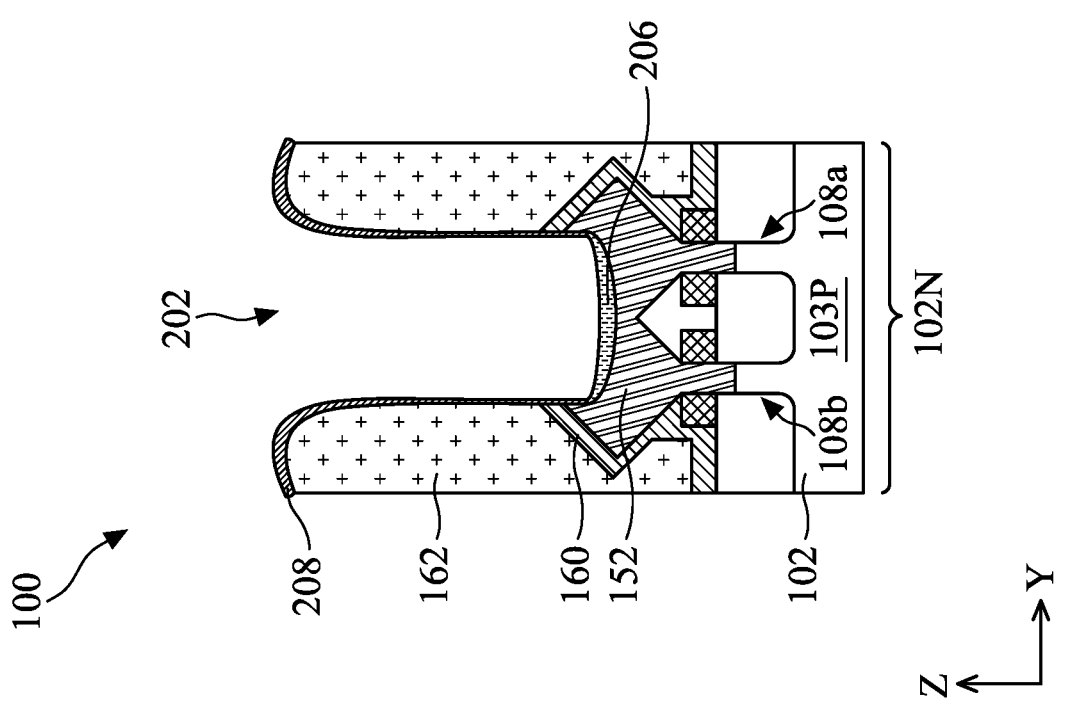

As shown in FIGS. 12A and 12B, in some embodiments, the metal layer 204 is treated to form a nitride layer 208. For example, a nitridation process, such as a nitrogen plasma process, can be performed on the metal layer 204 to convert the metal layer 204 into the nitride layer 208. In some examples, the metal layer 204 can be completely converted such that no metal layer 204 remains, while in other examples, a portion of the metal layer 204 remains unconverted such that the portion of the metal layer 204 remains with the nitride layer 208 on the metal layer 204. In some embodiments, silicon from the ILD layer 162 may diffuse into the nitride layer 208. As a result, the nitride layer 208 may include or be metal silicon nitride, such as TiSiN. In some embodiments, although not shown in FIGS. 12A and 12B, the nitride layer 208 may be also formed on the silicide region 206.

Figure 13B:
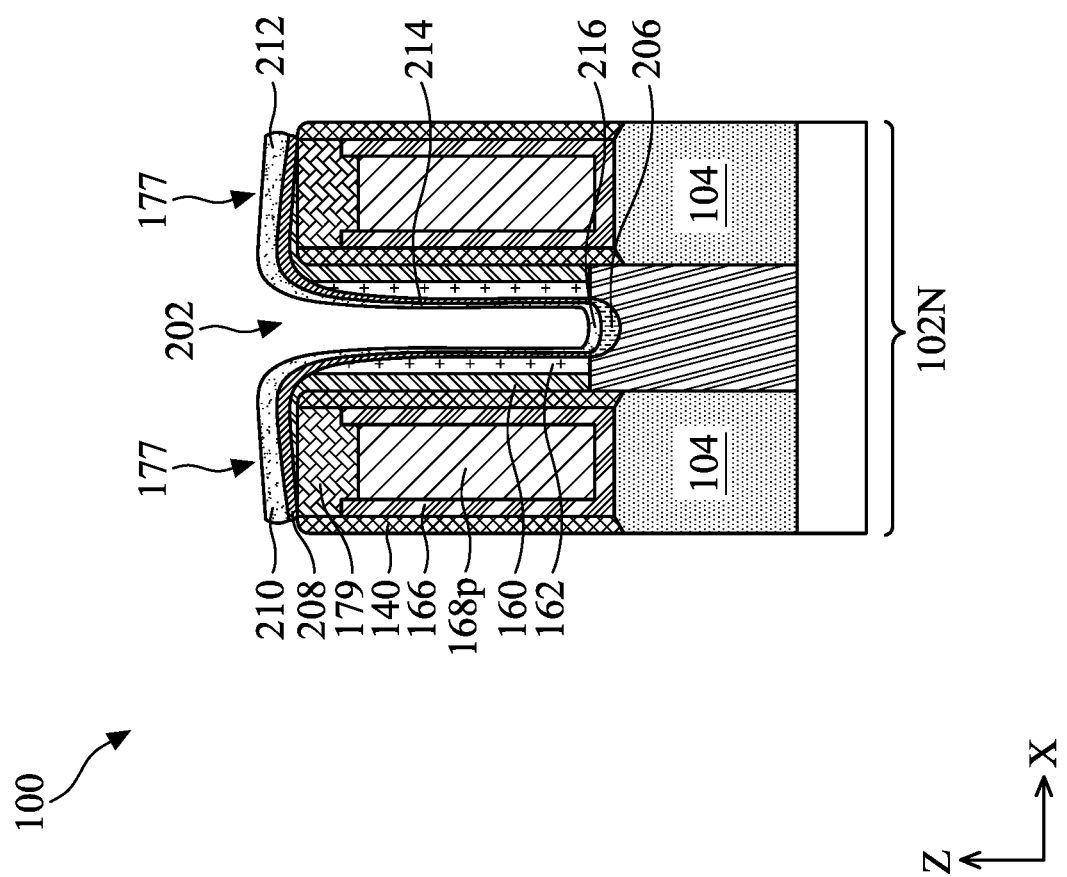
Figure 13A:
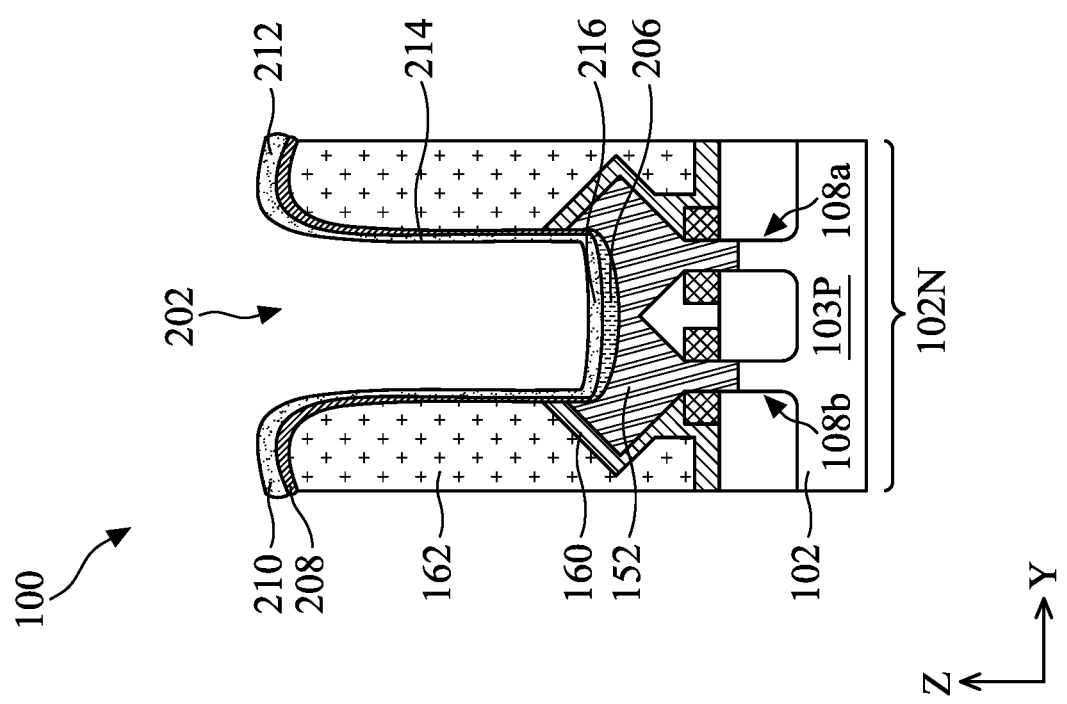
Figure 21B:
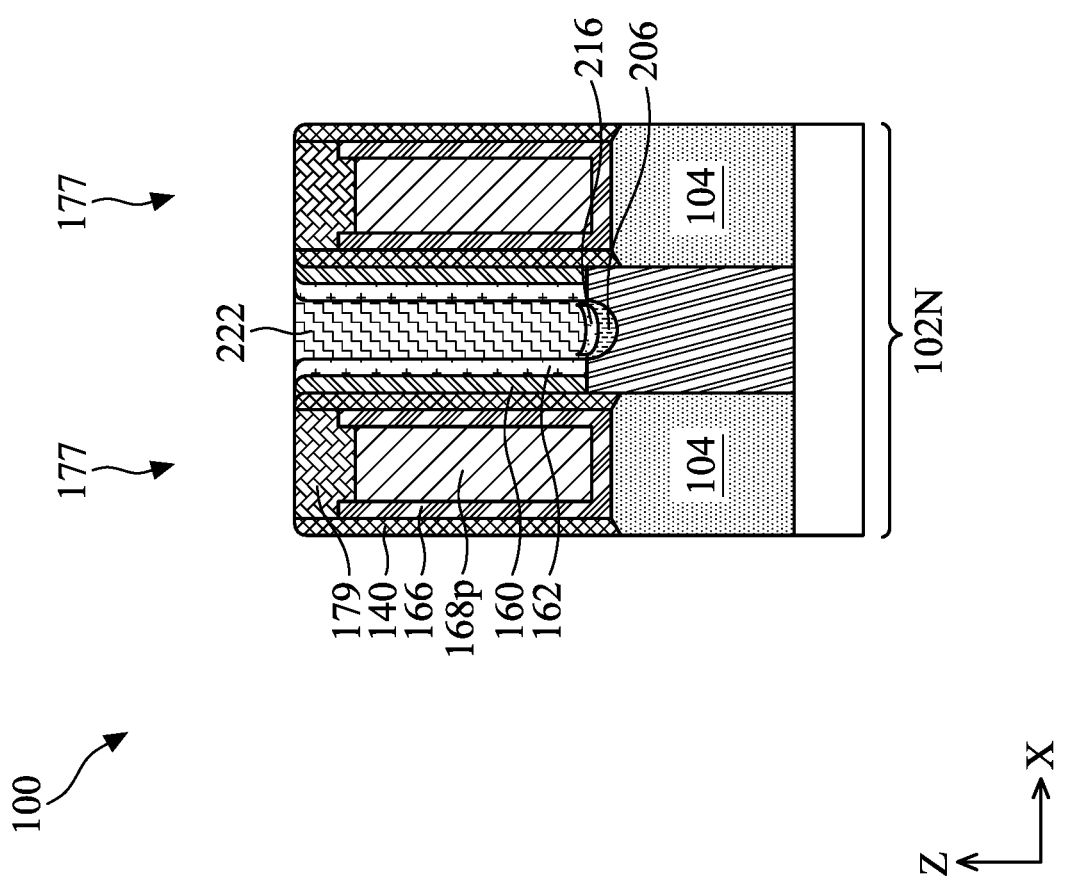
Figure 21A:
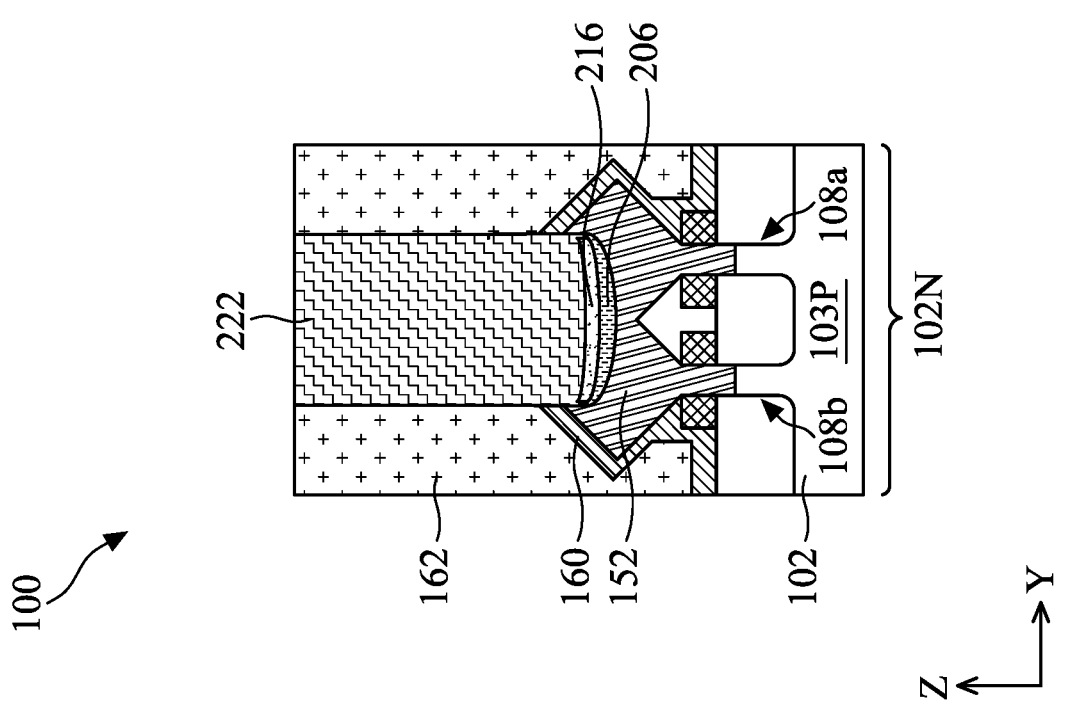

As shown in FIGS. 13A and 13B, a metal layer 210 is formed on the nitride layer 208. The metal layer 210 may include tungsten (W), platinum (Pt), tantalum (Ta), titanium (Ti), copper (Cu), cobalt (Co), ruthenium (Ru), rhodium (Rh), iridium (Jr), molybdenum (Mo), or other suitable metal. In some embodiments, the metal layer 210 includes W. The metal layer 210 may be formed by PVD and may have different thicknesses in different regions. For example, the metal layer 210 may include top portions 212 disposed over the ILD layer 162 and the SAC layers 179, sidewall portions 214 disposed on the sidewall in the contact opening 202, and a bottom portion 216 disposed at the bottom of the contact opening 202. The bottom portion 216 connects the sidewall portions 214. The top portion 212 has a first thickness in the z-axis, the sidewall portion 214 has a second thickness in the x-axis and y-axis substantially less than the first thickness, and the bottom portion 216 has a third thickness in the z-axis substantially less than the first thickness. In some embodiments, the third thickness is substantially greater than the second thickness. The metal layer 210 functions as a seed layer for a subsequently formed bulk metal layer 222 (FIGS. 21A and 21B).

As shown in FIG. 13A, the space between the top portions 212 of the metal layer 210 is smaller than the space between the sidewall portions 214. As a result, a subsequently formed layer in the contact opening 202 may include seams or voids. In other words, due to the small space defined by the top portions 212 of the metal layer 210, the gap fill of the contact opening 202 may be poor.

Figure 14B:
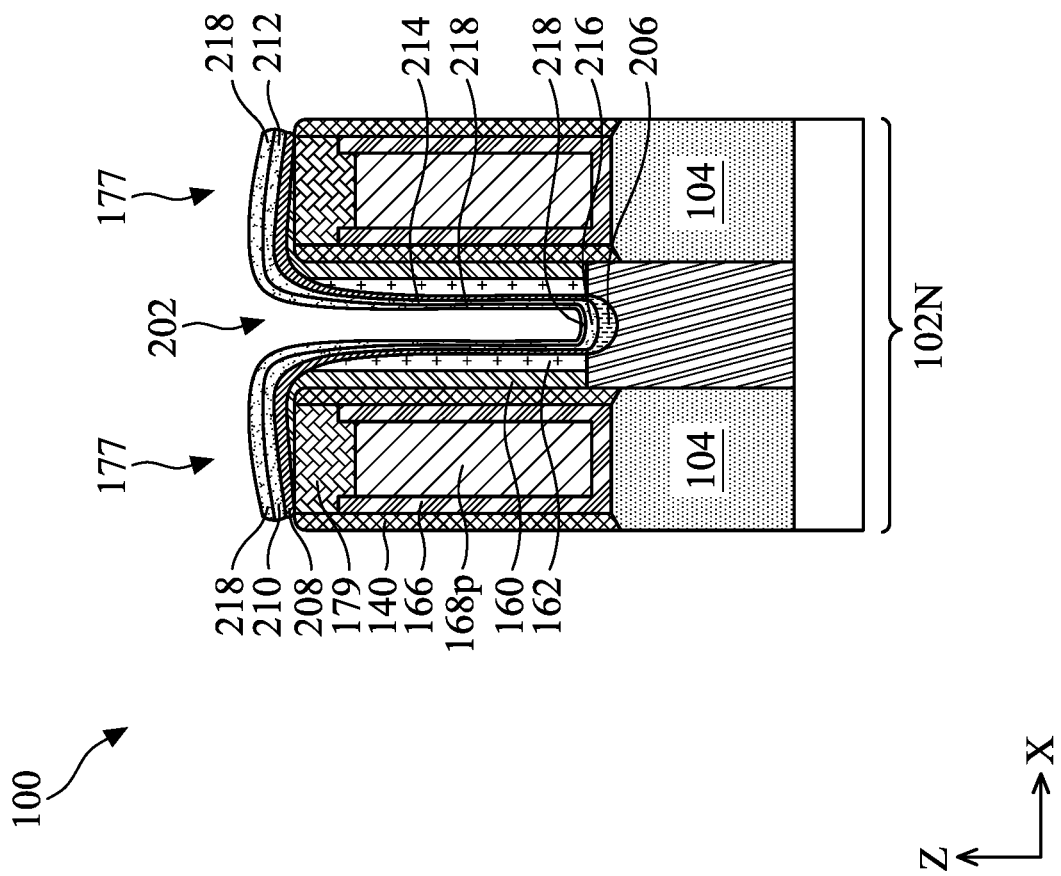
Figure 14A:
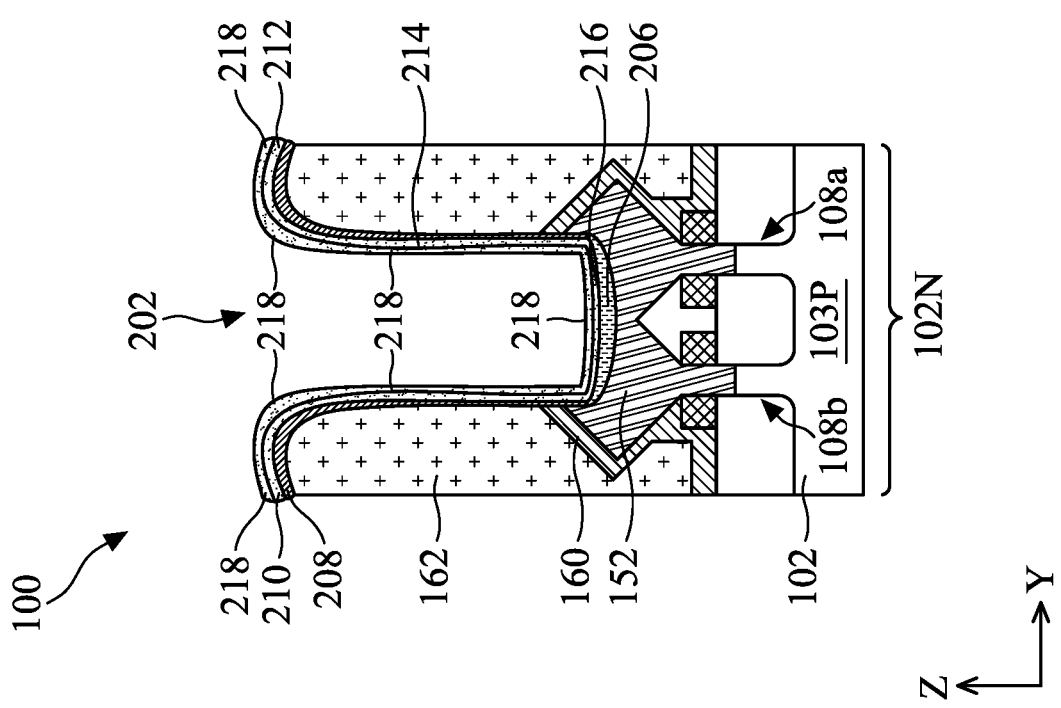

In order to widen the space defined by the top portions 212 of the metal layer 210, at least a portion of the top portion 212 is removed by a gradient metal removal process. In some embodiments, the gradient metal removal process includes an oxidation process and an etch process. For example, as shown in FIGS. 14A and 14B, an outer portion of the top portion 212 of the metal layer 210 is oxidized to form an oxide layer 218. In some embodiments, an outer portion of the sidewall portion 214 is also oxidized, and the oxide layer 218 is also formed from the sidewall portion 214 and the bottom portion 216, as shown in FIGS. 14A and 14B. In some embodiments, the thickness of the oxide layer 218 formed from the top portion 212 is substantially greater than the thickness of the oxide layer 218 formed from the sidewall portion 214 and the bottom portion 216, because there are less oxygen species in the contact opening 202 due to the small space defined by the top portion 212. In some embodiments, a ratio of the thickness of the oxide layer 218 formed from the top portion 212 to the thickness of the oxide layer 218 formed from the bottom portion 216 ranges between about 1.2 to 1 and about 1.8 to 1. The bottom portion 216 of the metal layer 210 will remain for subsequent processes. Thus, if the ratio is less than 1.2 to 1, the entire bottom portion 216 may be oxidized. In some embodiments, the thickness of the oxide layer 218 formed from the top portion 212 of the metal layer 210 may be about 10 percent to about 50 percent of the thickness of the top portion 212. Due to the thickness variations of the oxide layer 218, the upper portion of the contact opening 202 is narrower near the upper edge than the middle portion of the contact opening 202.

The oxidation process may be a thermal oxidation process or plasma oxidation process. In either the thermal oxidation process or the plasma oxidation process, an oxygen-containing gas is flowed into a processing chamber having the semiconductor device structure 100 placed therein. The oxygen-containing gas includes $O_2$, $O_3$, NO, $N_2O$, $NO_2$, $NO_3$, CO, $CO_2$, $H_2O$, or other suitable oxygen-containing gas. In some embodiments, a carrier gas, such as argon or nitrogen gas, is flowed into the processing chamber along with the oxygen-containing gas. The oxygen-containing gas may have a flow rate ranging from about 50 sccm to about 9000 sccm. The oxygen-containing gas may be about 0.2 percent to about 100 percent of the gas flowing into the processing chamber. The processing temperature is less than about 500 degrees Celsius, such as from about 100 degrees Celsius to about 400 degrees Celsius. The processing pressure ranges from about 500 mtorr to about 30000 mtorr. For the plasma oxidation process, the plasma may be direct plasma or remote plasma, and the plasma power ranges from about 100 W to about 5000 W. In some embodiments, the direct plasma is inductively coupled plasma (ICP) or capacitively coupled plasma (CCP).

Figure 15B:
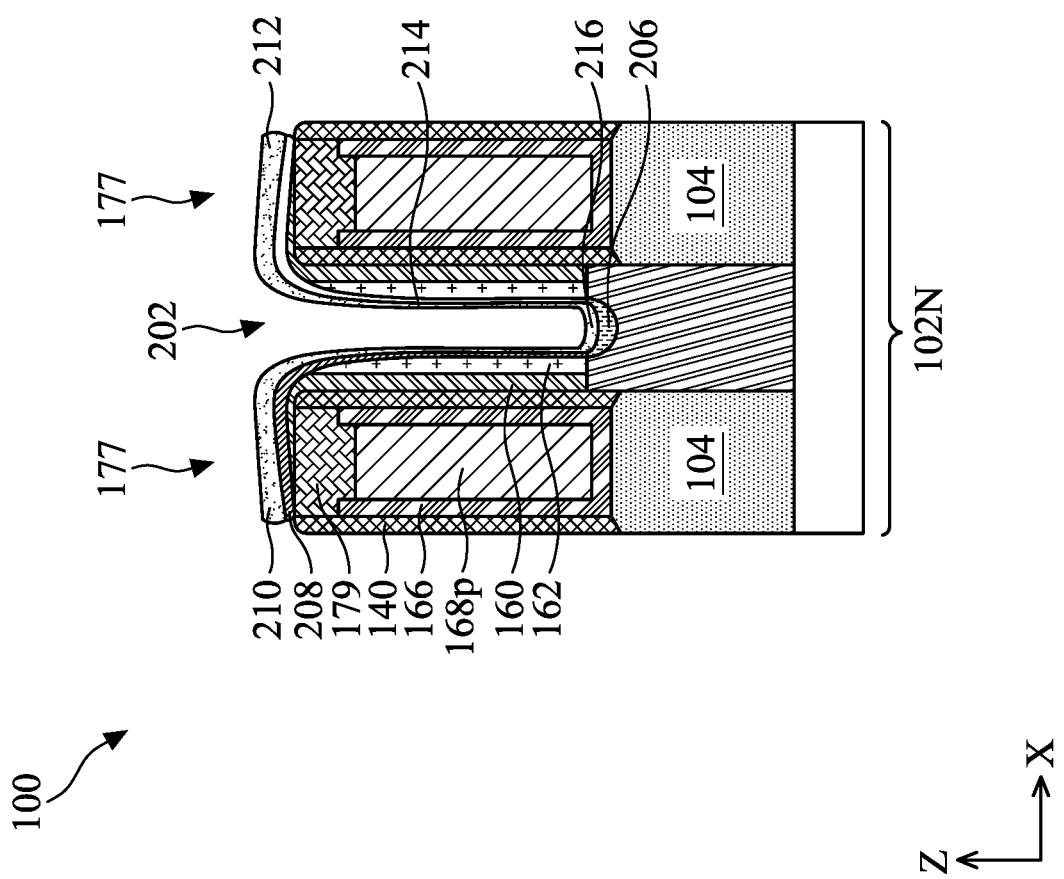
Figure 15A:
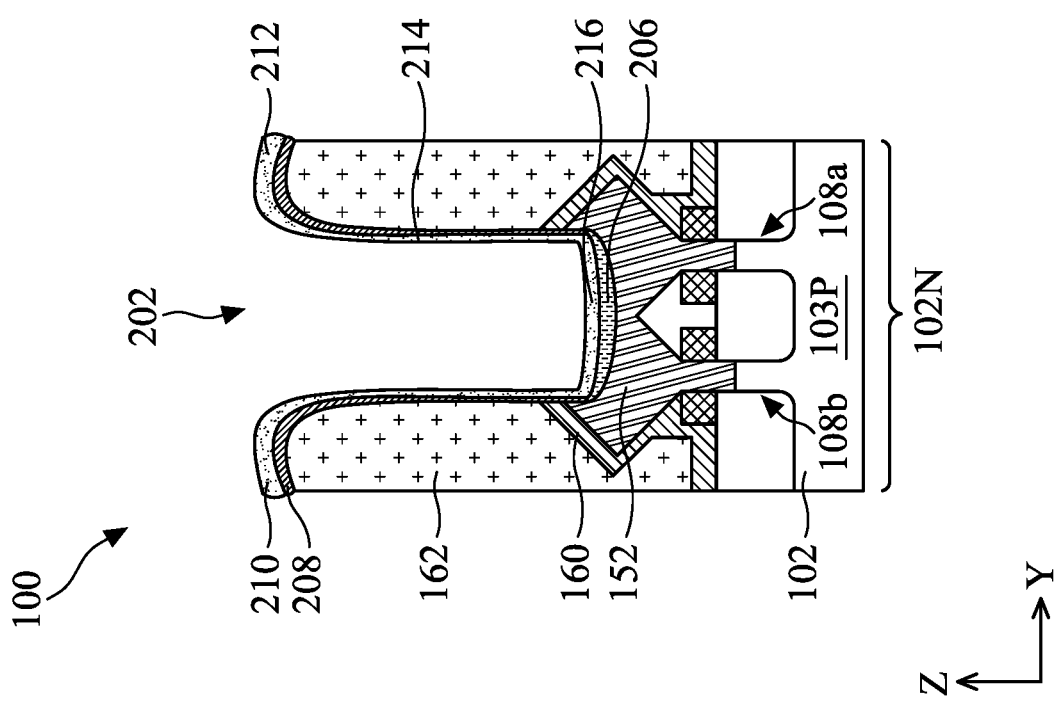

Next, as shown in FIGS. 15A and 15B, an etch process is performed to remove the oxide layer 218. The etch process may be a thermal tech process or plasma etch process. In either the thermal etch process or the plasma etch process, an etchant is flowed into a processing chamber having the semiconductor device structure 100 placed therein. The processing chamber may be the same processing chamber in which the oxidation process is performed. The etchant includes a halide or a metal halide, such as $Cl_2$, $BCl_3$, $WCl_5$, $WCl_6$, $MoCl$, $TiCl_4$, $RuCl_3$, $F_2$, $WF_6$, $NF_3$, or other suitable etchant. In some embodiments, a carrier gas, such as argon or nitrogen gas, is flowed into the processing chamber along with the etchant. The etchant may have a flow rate ranging from about 50 sccm to about 1000 sccm. The processing temperature ranges from about 20 degrees Celsius to about 500 degrees Celsius. The processing pressure ranges from about 500 mtorr to about 30000 mtorr. For the plasma etch process, the plasma power ranges from about 100 W to about 5000 W. In some embodiments, the plasma is inductively coupled plasma (ICP) or capacitively coupled plasma (CCP).

The etch process to remove the oxide layer 218 is a selective etch process, and the metal layer 210 is not substantially affected by the etch process. In some embodiments, the oxide layer 218 is relatively thin, and the duration of the etch process may be short, which also leads to the metal layer 210 being unaffected. Because the oxide layer 218 formed from the bottom portion 216 of the metal layer 210 is substantially thinner than the oxide layer 218 formed from the top portion 212 of the metal layer 210, the remaining top portion 212 may have a thickness substantially less than a thickness of the remaining bottom portion 216. In some embodiments, the space defined by the top portions 212 along the x-axis is enlarged as the result of the etch process, as shown in FIG. 15A. In some embodiments, multiple cycles of oxidation and etch processes are performed to enlarge the space defined by the top portions 212 by oxidation and etching an outer portion of the metal layer 210. The multiple cycles of oxidation and etch processes may be a gradient metal removal process that removes more of the top portion 212 than the bottom portion 216 of the metal layer 210.

Figure 16B:
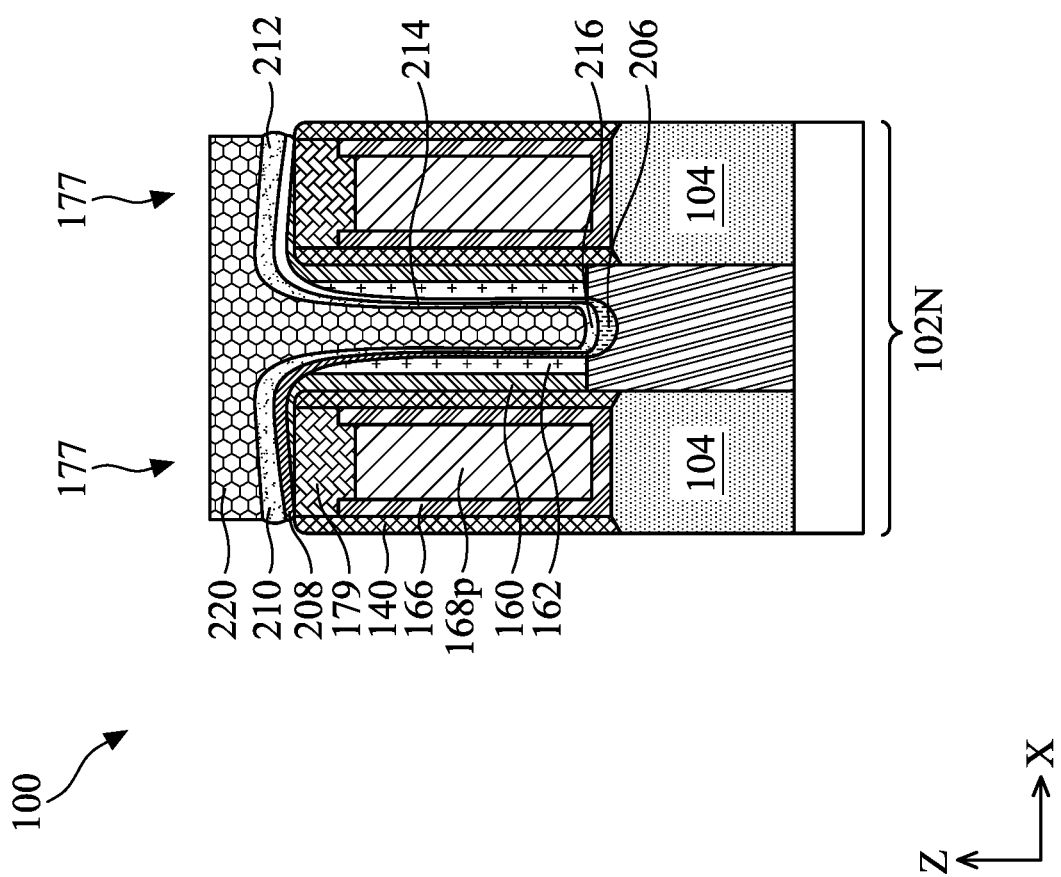
Figure 16A:
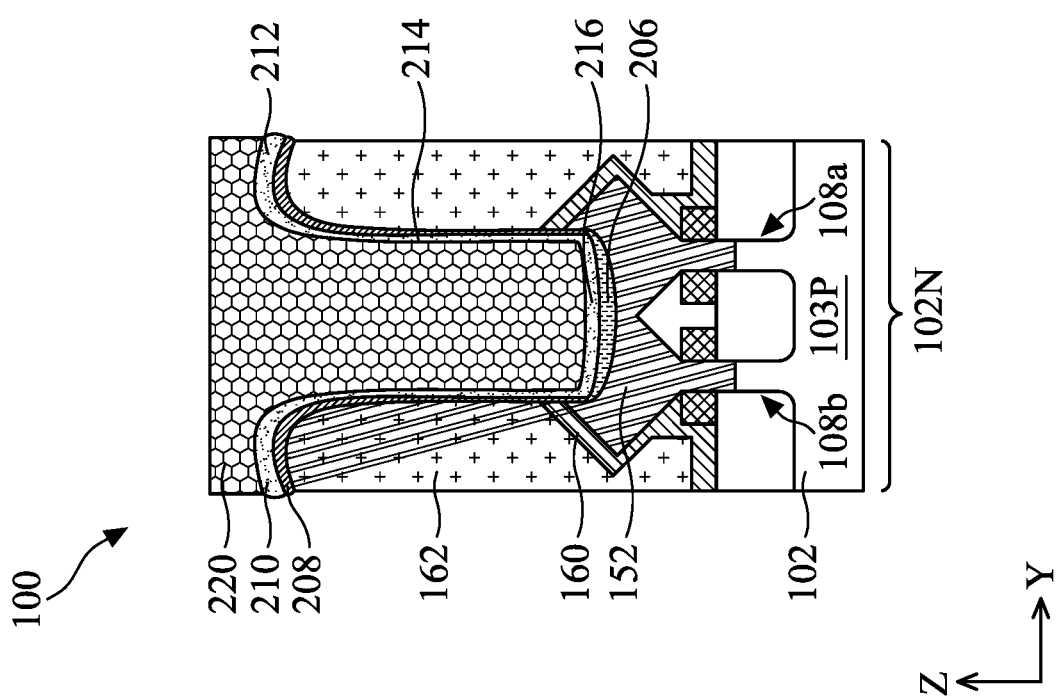

As shown in FIGS. 16A and 16B, a sacrificial layer 220 is formed in the contact opening 202. The sacrificial layer 220 may be a bottom antireflective coating (BARC) layer. Because the space between the top portions 212 along the x-axis is enlarged by the gradient metal removal process, the sacrificial layer 220 is formed in the contact opening 202 without a seam or void. In other words, the gap fill of the contact opening 202 with the sacrificial layer 220 is improved, as a result of the gradient metal removal process. The sacrificial layer 220 may be also formed over the SAC layers 179 and the ILD layer 162.

Figure 17B:
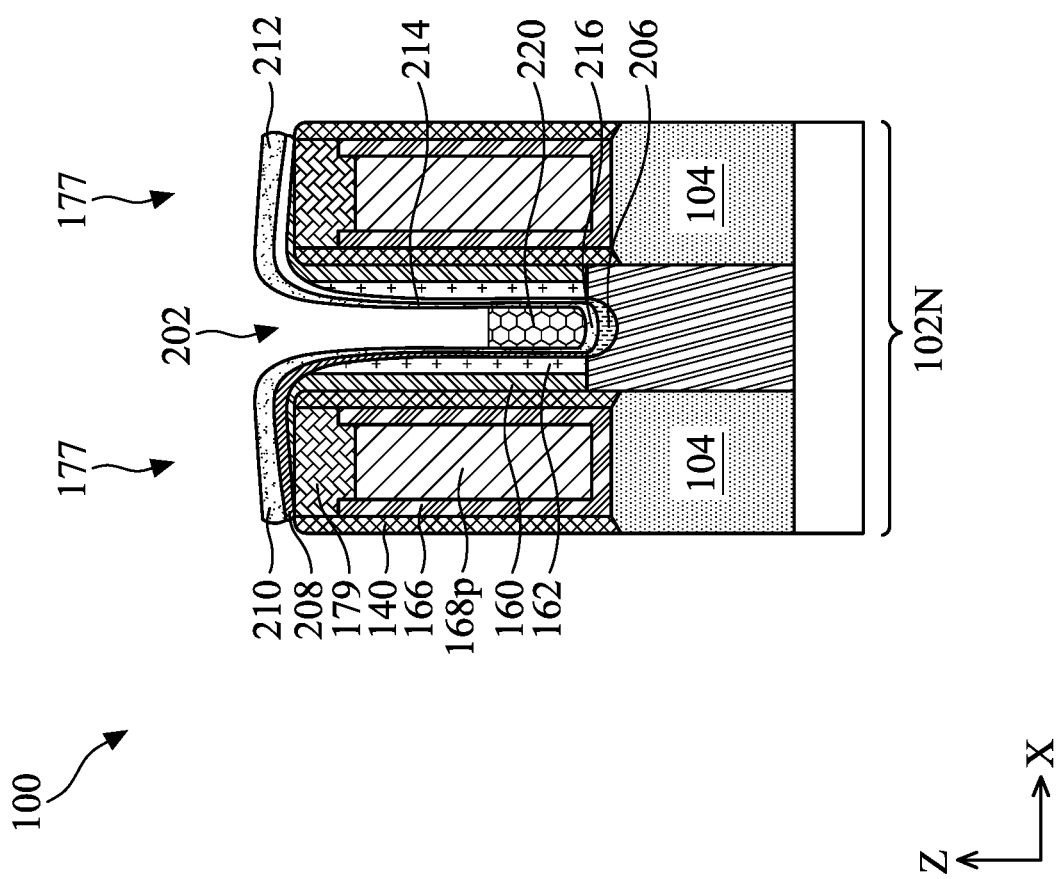
Figure 17A:
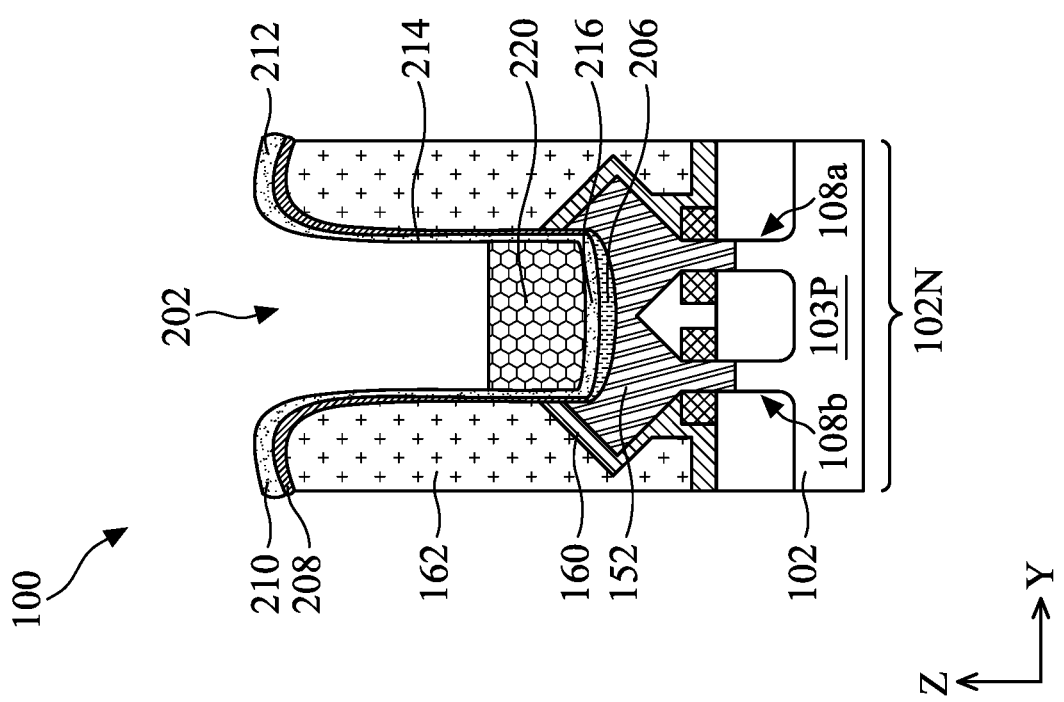

As shown in FIGS. 17A and 17B, the sacrificial layer 220 is recessed to expose a portion of the contact opening 202. The sacrificial layer 220 may be recessed by a selective etch process that does not substantially affect the metal layer 210. The selective etch process may be a dry etch, a wet etch, or a combination thereof. In some embodiments, the selective etch process is a wet etch. As a result of improved gap fill of the contact opening 202 with the sacrificial layer 220, the solution from the wet etch does not leak down to the bottom portion 216 of the metal layer 210, which can damage the bottom portion 216, the silicide region 206, and the S/D epitaxial features 152. The remaining sacrificial layer 220 is in contact with a portion of the sidewall portions 214 of the metal layer 210, and a portion of the sidewall portion 214 is exposed in the contact opening 202.

Figure 18B:
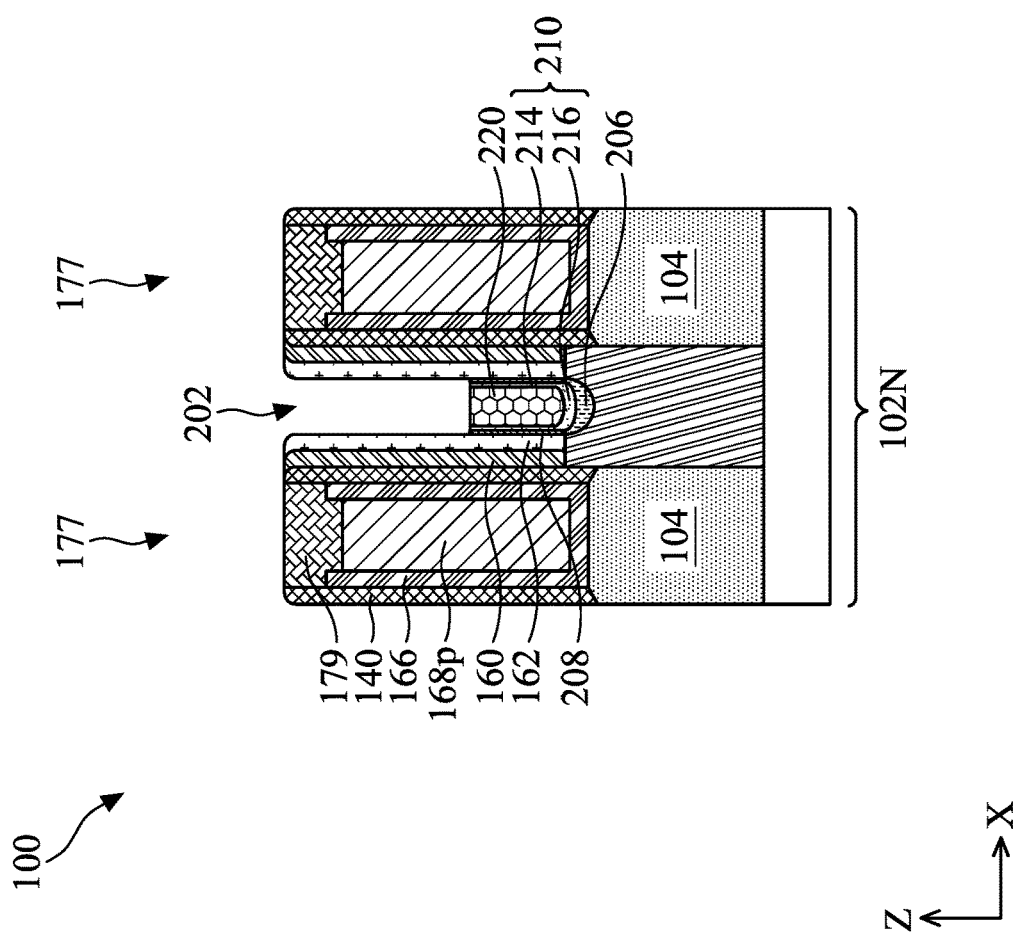
Figure 18A:
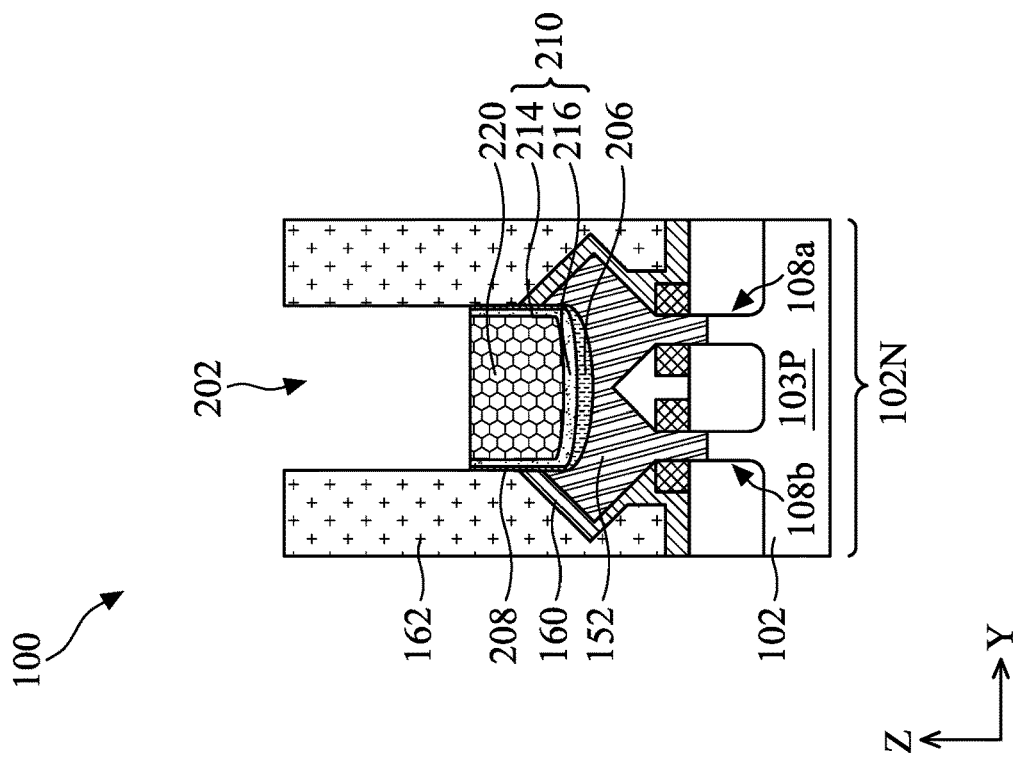

As shown in FIGS. 18A and 18B, the exposed portion of the sidewall portions 214 and the top portions 212 are removed. The exposed portion of the sidewall portion 214 and the top portions 212 may be removed by a selective etch process, such as a dry etch, a wet etch, or a combination thereof. The removal of the exposed portion of the sidewall portion 214 and the top portion 212 exposes a portion of the nitride layer 208, and the exposed portion of the nitride layer 208 is removed. In some embodiments, the exposed portion of the nitride layer 208 is removed by the same process that removes the exposed portion of the sidewall portion 214 and the top portion 212. Thus, the selective etch process removes portions of the metal layer 210 and the nitride layer 208 but does not substantially affect the SAC layers 179, the CESL 160, and the first ILD layer 162. In some embodiments, a different etch process is performed to remove the exposed portion of the nitride layer. The remaining sidewall portion 214 and the nitride layer 208 may each include a top surface substantially coplanar with a top surface of the sacrificial layer 220, as shown in FIGS. 18A and 18B.

In some embodiments, the exposed portion of the sidewall portions 214 and the top portions 212 may be removed by a wet etch, and the solution from the wet etch process does not leak down to the bottom portion 216 of the metal layer 210 due to the improved gap fill of the sacrificial layer 220.

Figure 19B:
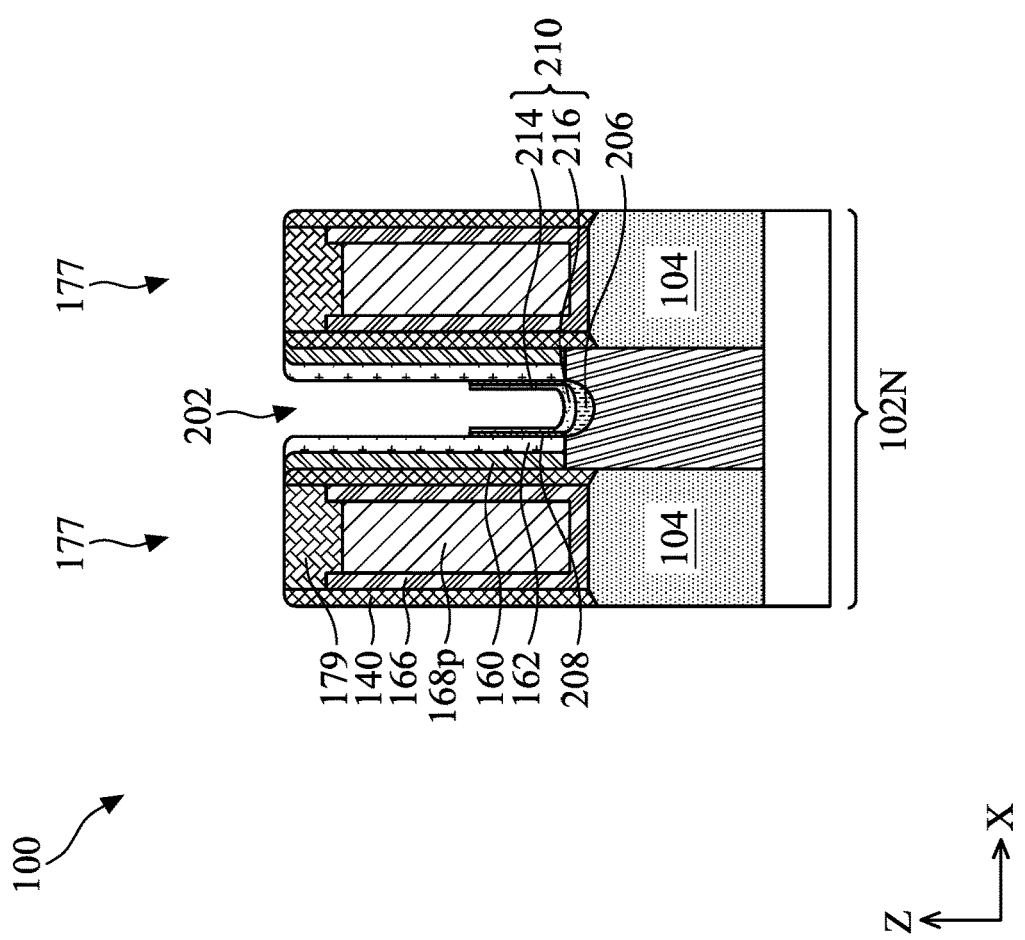
Figure 19A:
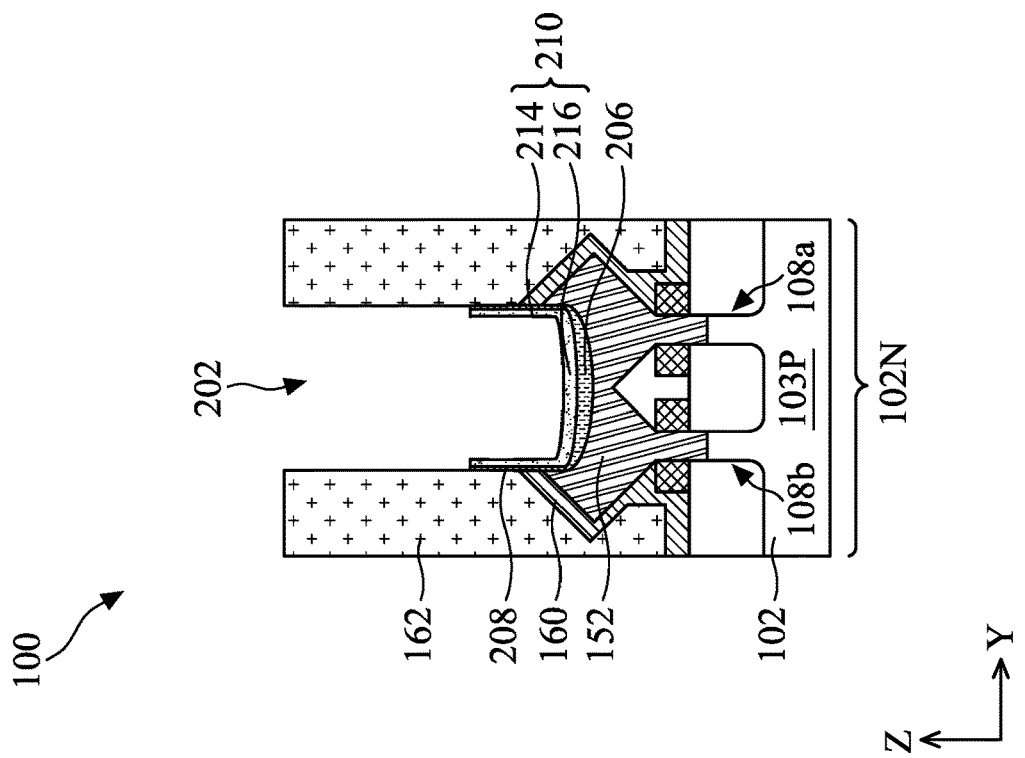

As shown in FIGS. 19A and 19B, the sacrificial layer 220 is removed. The removal of the sacrificial layer 220 may be performed by the same process as the process for recessing the sacrificial layer 220 described in FIGS. 17A and 17B. In some embodiments, the etch process to remove the sacrificial layer 220 is a dry etch, a wet etch, or a combination thereof. The etch process does not substantially affect the SAC layers 179, the CESL 160, the ILD layer 162, and the metal layer 210.

Figure 20B:
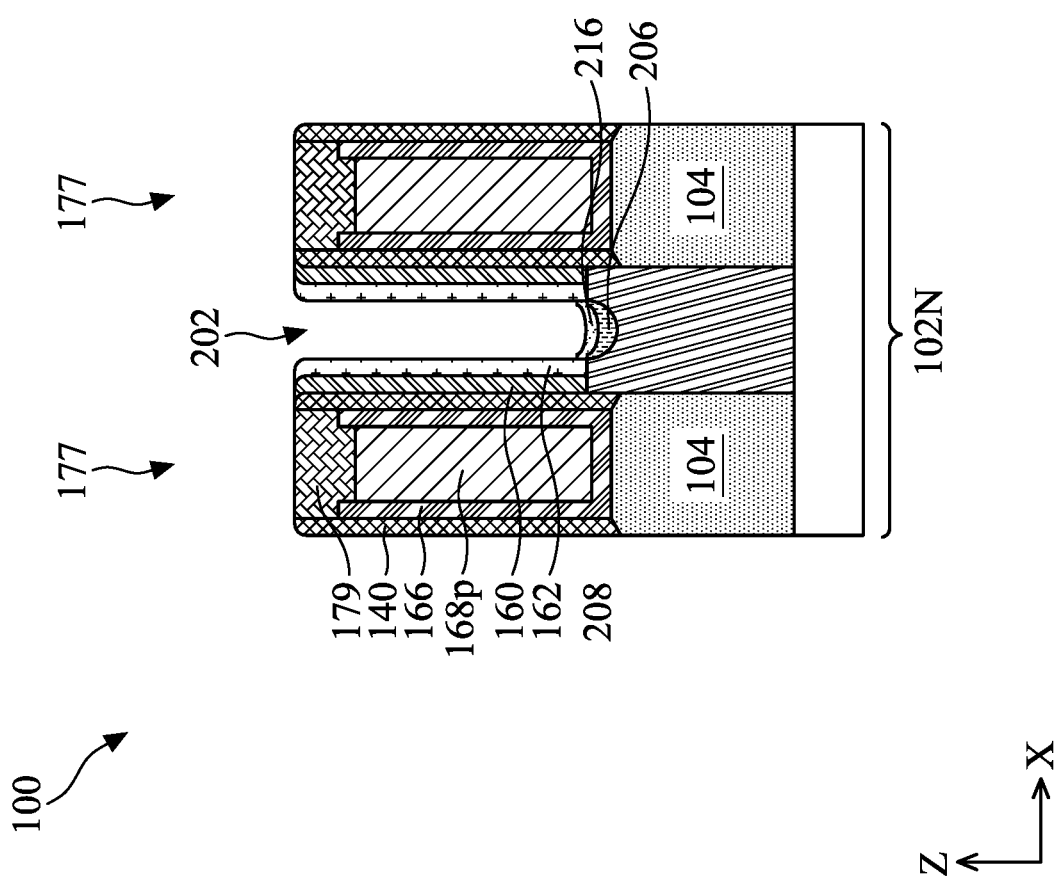
Figure 20A:
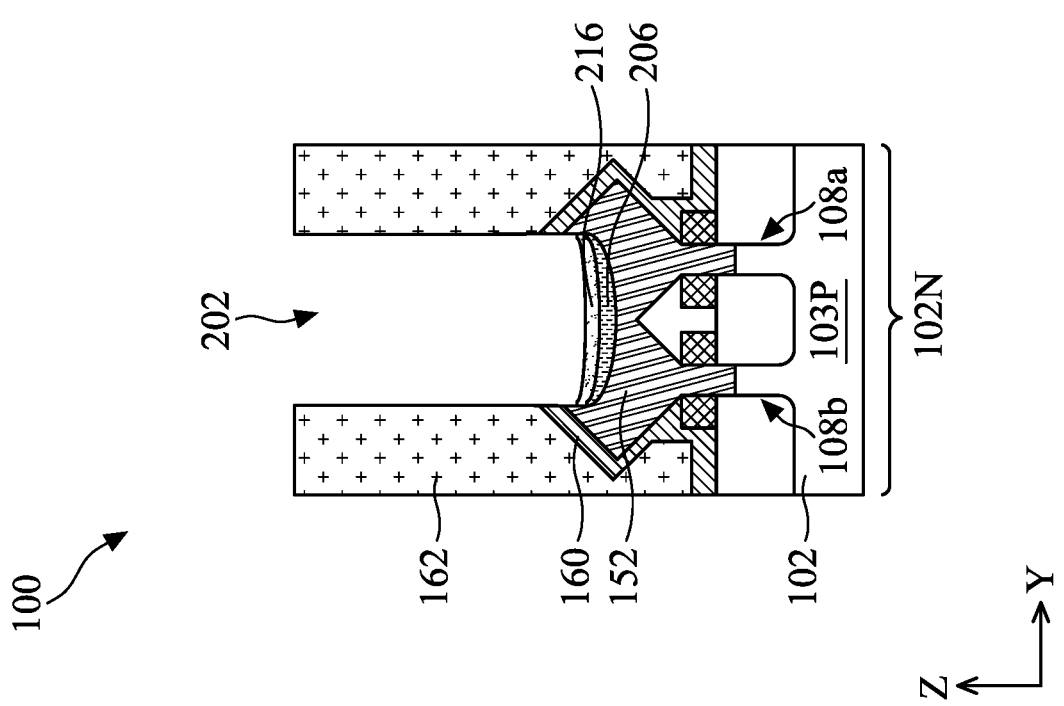

As shown in FIGS. 20A and 20B, the sidewall portion 214 of the metal layer is removed. The sidewall portion 214 may be removed by any suitable process, such as dry etch, wet etch, or a combination thereof. In some embodiments, a wet etch is performed to remove the sidewall portion 214. Because the thickness of the sidewall portion 214 is substantially less than the thickness of the bottom portion 216, a portion of the bottom portion 216 may be removed during the removal of the sidewall portion 214. As a result, a portion of the bottom portion 216 remains at the bottom of the contact opening 202. In some embodiments, the nitride layer 208 is also removed during the removal of the sidewall portion 214. In some embodiments, the nitride layer 208 remains in the contact opening 202.

As shown in FIGS. 21A and 21B, a bulk metal layer 222 is formed on the bottom portion 216 of the metal layer 210. The bulk metal layer 222 may be formed in a bottom-up manner, and the bottom portion 216 of the metal layer 210 functions as a seed layer for the bulk metal layer 222. The bulk metal layer 222 may include the same material as the metal layer 210. The bulk metal layer 222 may overfill the contact opening 202, and a planarization process, such as a CMP process, may be performed to expose the ILD layer 162 and the SAC layers 179. The bottom portion 216 of the metal layer 210 and the bulk metal layer 222 together may form the conductive contact for the S/D epitaxial features 152, 154.

Figure 22B:
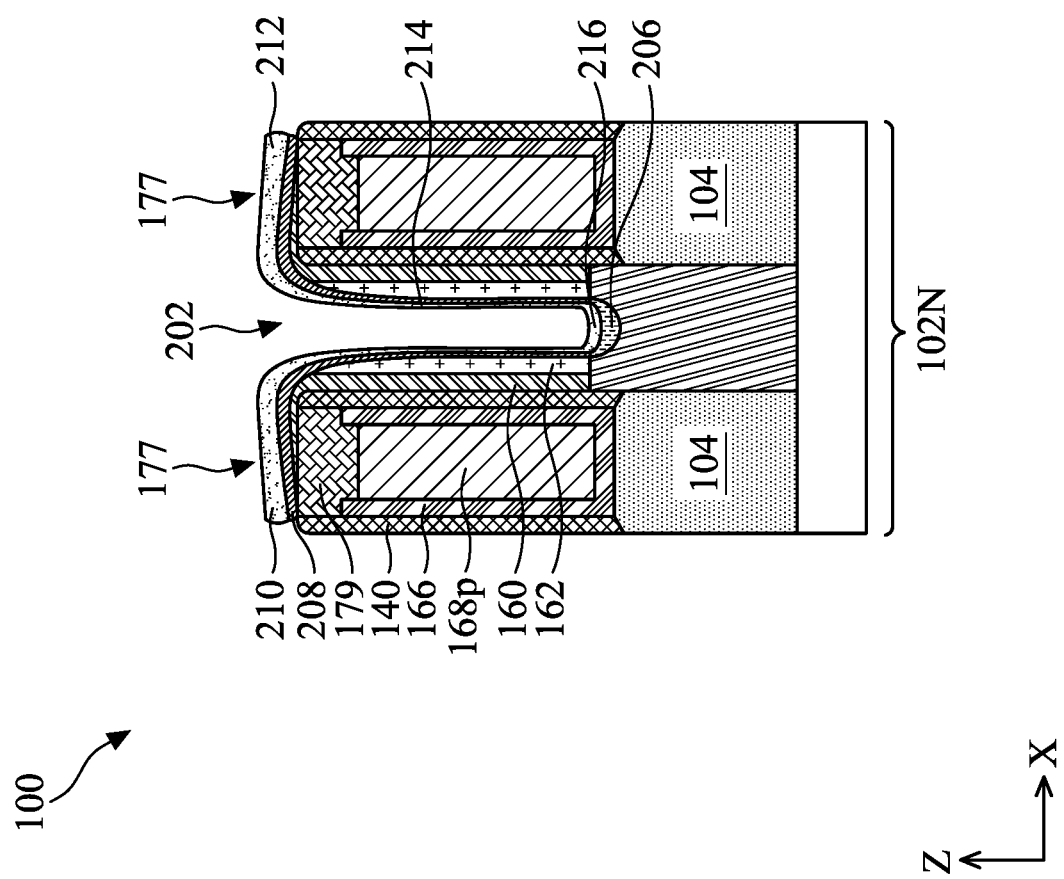
Figure 22A:
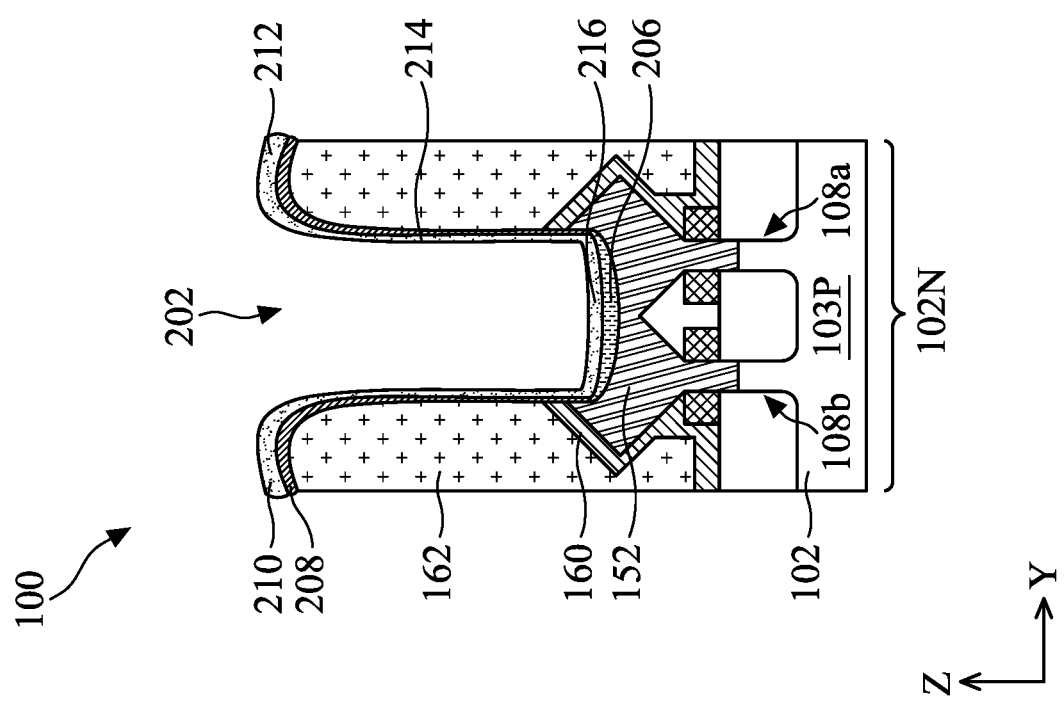
Figure 23B:
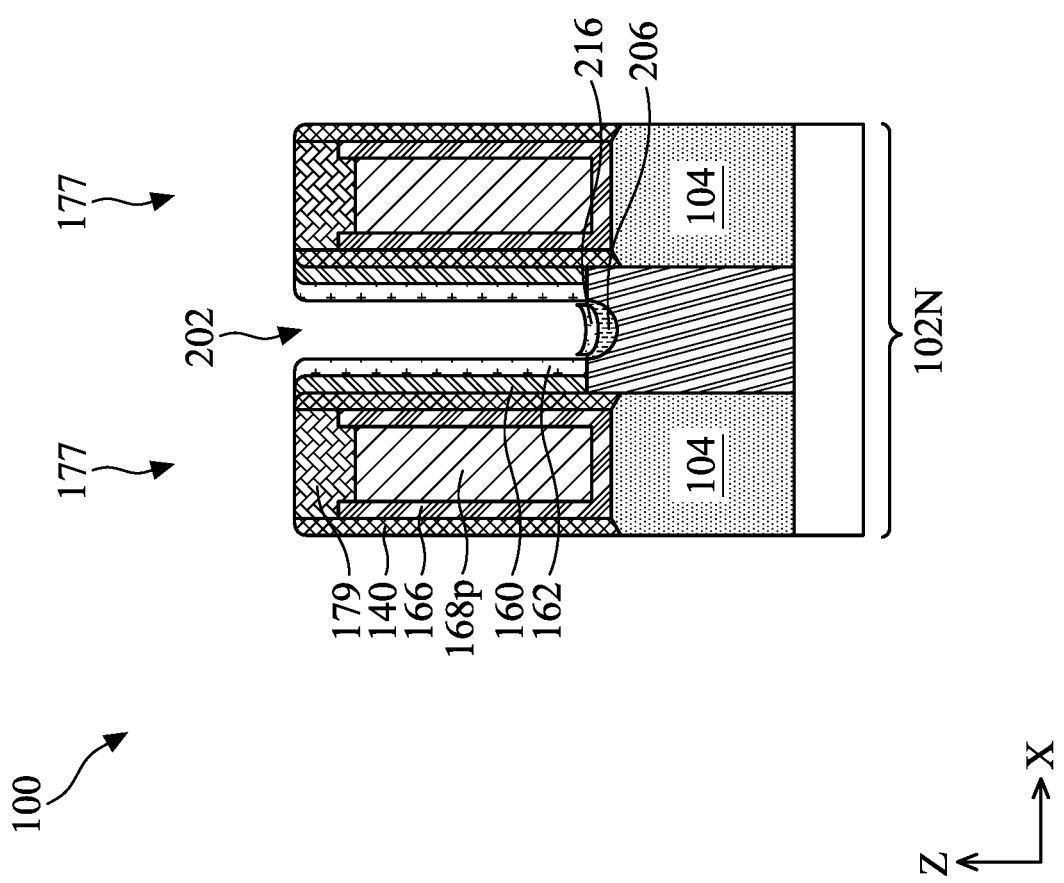
Figure 23A:
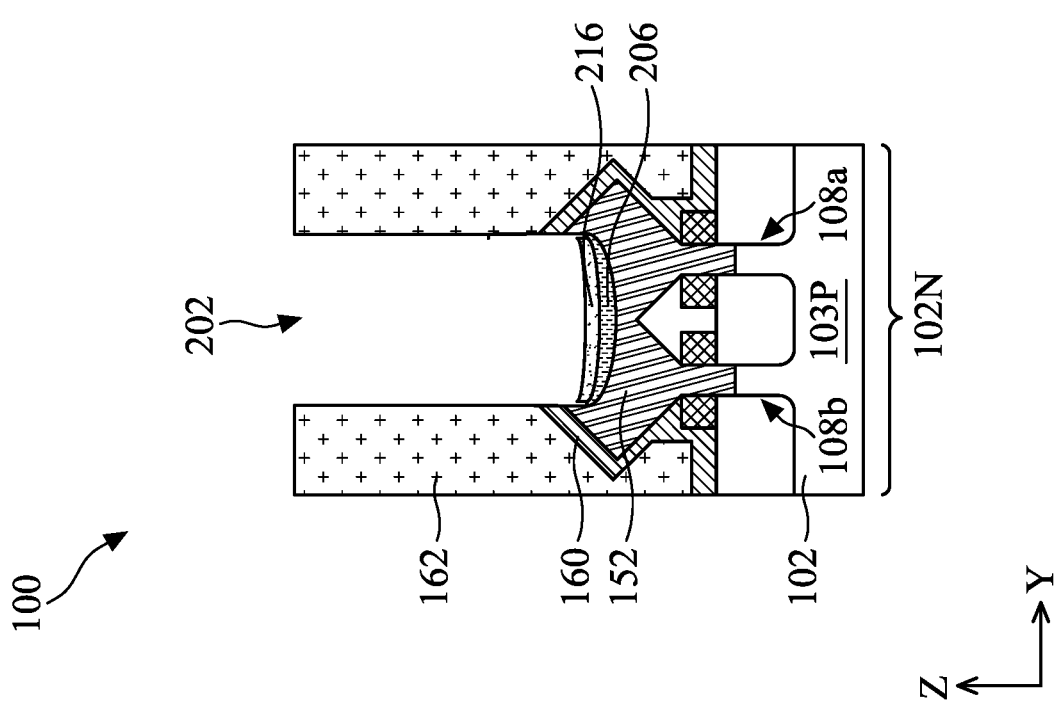
Figure 24B:
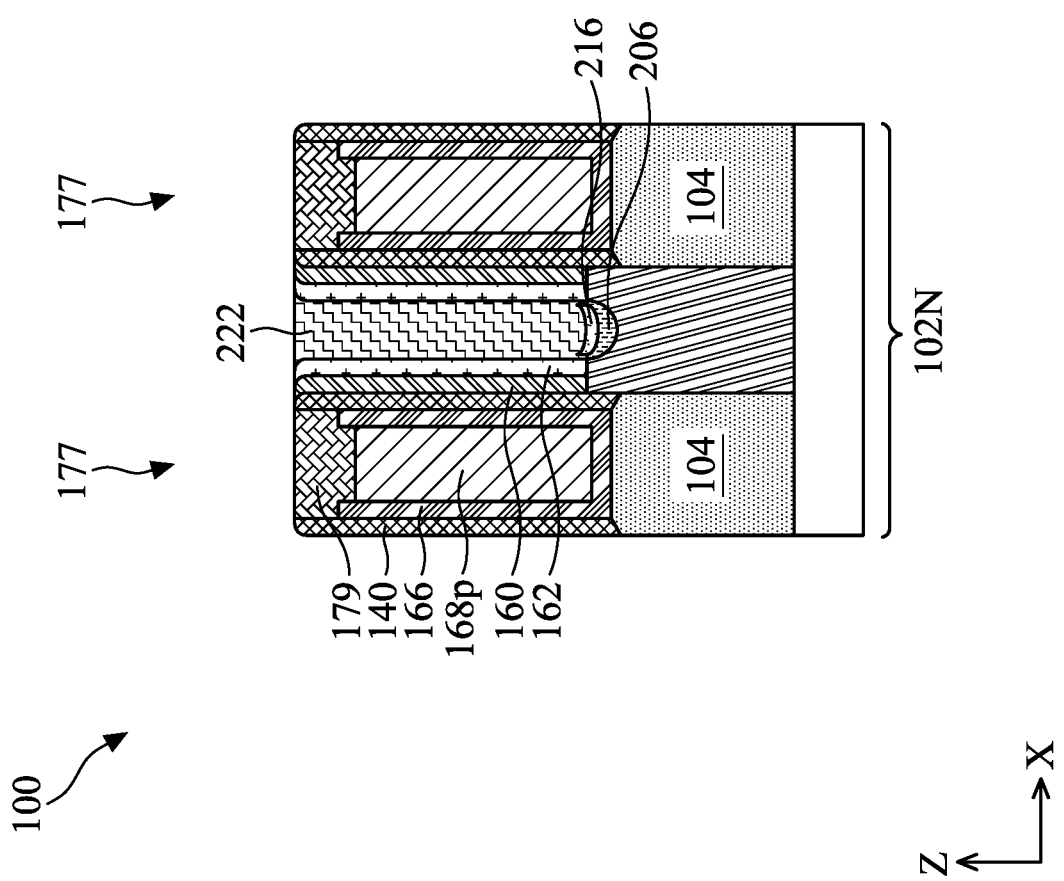
Figure 24A:
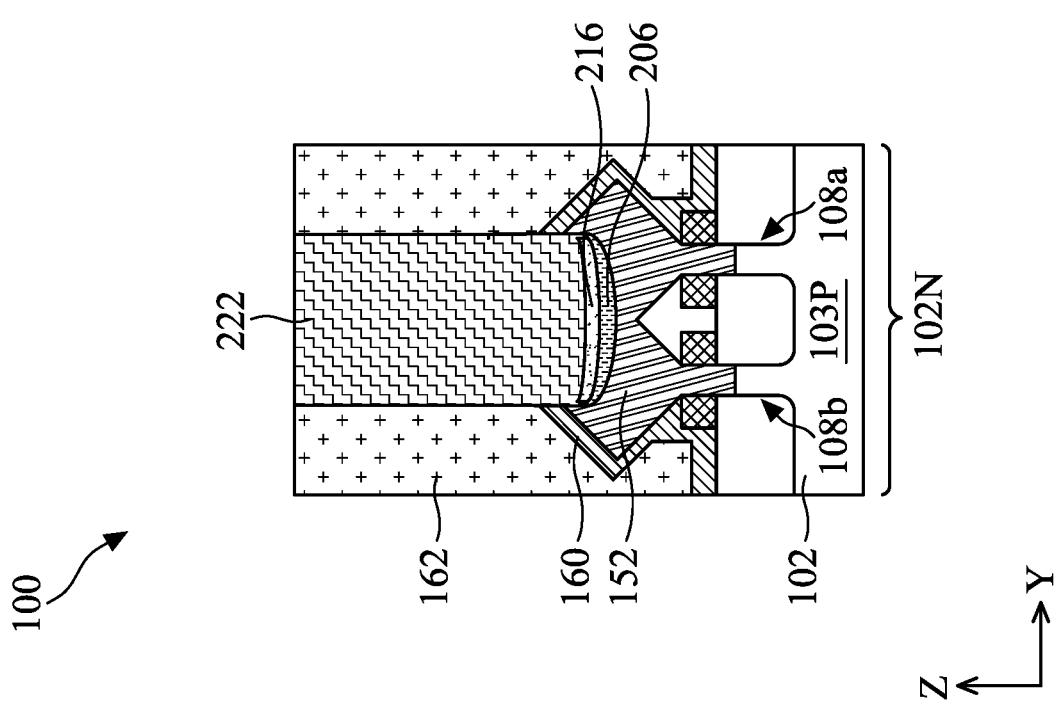

FIGS. 22A-24A are cross-sectional side views of various stages of manufacturing the semiconductor device structure 100 of FIG. 4 taken along line A-A, in accordance with alternative embodiments. FIGS. 22B-24B are cross-sectional side views of various stages of manufacturing the semiconductor device structure 100 of FIG. 4 taken along line B-B, in accordance with alternative embodiments. FIGS. 22A and 22B shows the metal layer 210 is formed on the nitride layer 208, which is the same process described in FIGS. 13A and 13B. After forming the metal layer 210, the gradient metal removal process described in FIGS. 14A, 14B, 15A, 15B is performed to remove the top portion 212 and the sidewall portion 214 of the metal layer 210, as shown in FIGS. 23A and 23B. As described above, the gradient metal removal process includes one or more cycles of an oxidation process and an etch process. The bottom portion 216 of the metal layer 210 is located at the bottom of the contact opening 202. Thus, the bottom portion 216 is exposed to less oxidizing species from the oxidation process and the etchant from the etch process compared to the top portion 212. Furthermore, the bottom portion 216 is substantially thicker than the sidewall portion 214. As a result, in some embodiments, the top portion 212 and the sidewall portion 214 are completely removed, while a portion of the bottom portion 216 remains at the bottom of the contact opening 202. The gradient metal removal process can provide a controlled metal removal process that does not completely remove the bottom portion 216, which serves as a seed layer for the subsequently formed bulk metal layer 222 (FIGS. 24A and 24B).

In some embodiments, the nitride layer 208 is removed after the gradient metal removal process. For example, the nitride layer 208 may be removed by a selective etch process that does not substantially affect the bottom portion 216 of the metal layer 210, the ILD layer 162, the CESL 160, and the SAC layers 179.

Next, as shown in FIGS. 24A and 24B, the bulk metal layer 222 is formed on the bottom portion 216 of the metal layer 210 in the contact opening 202.

Figure 25A:
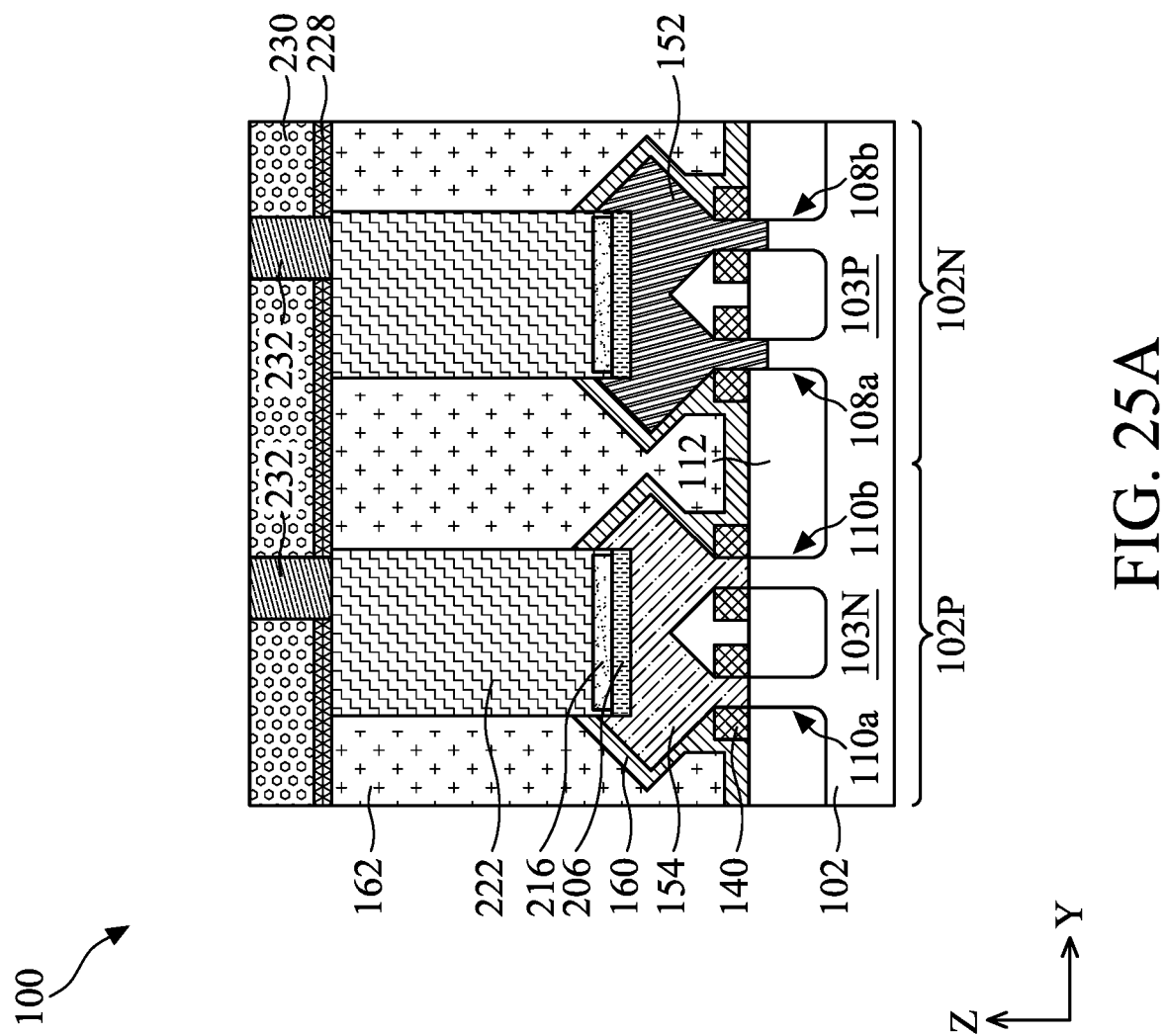
FIGS. 25A and 25B are cross-sectional side views of one of various stages of manufacturing the semiconductor device structure of FIG. 4 taken along lines A-A and B-B, respectively, in accordance with some embodiments.
Figure 25B:
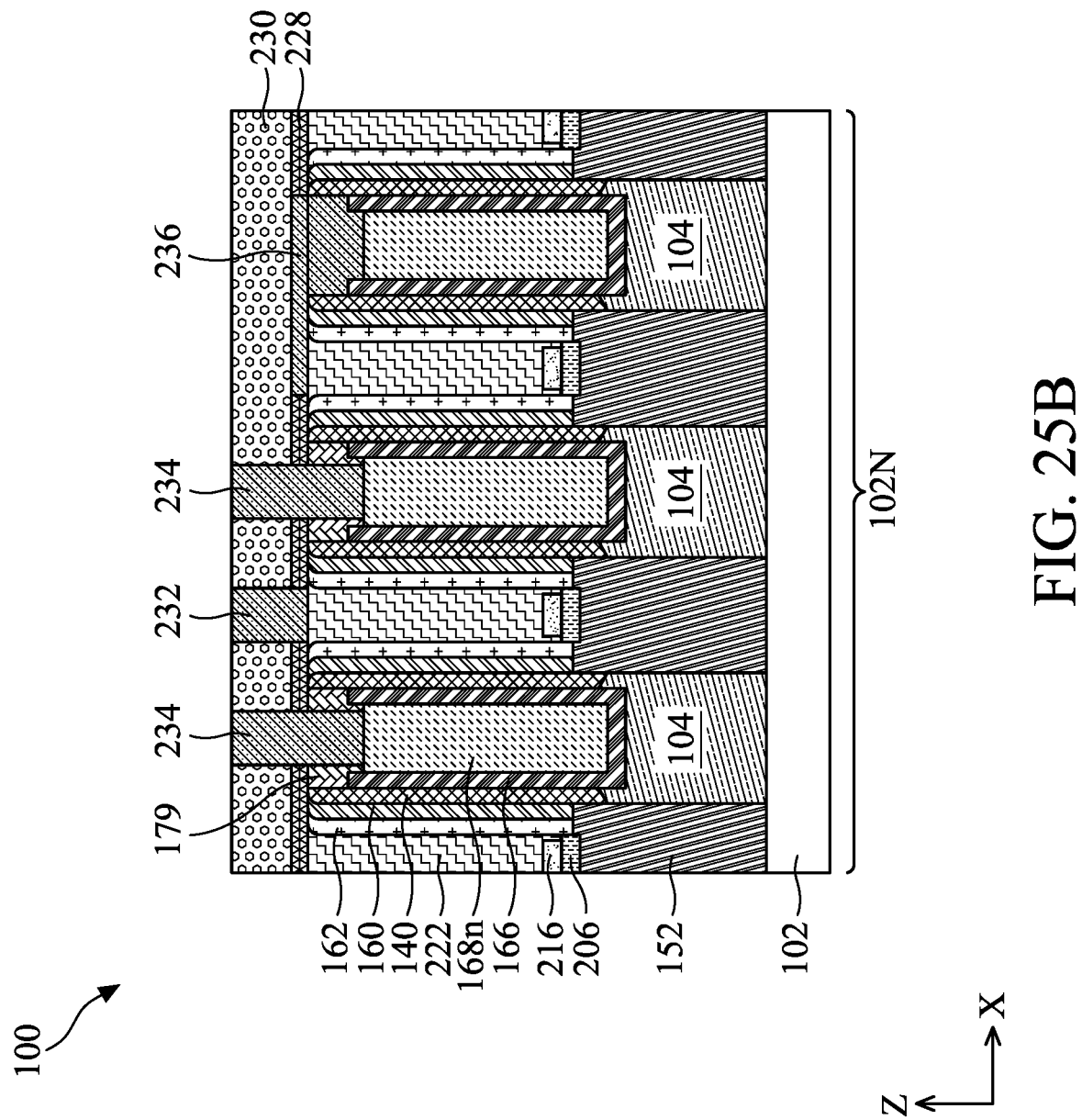

FIGS. 25A and 25B are cross-sectional side views of one of various stages of manufacturing the semiconductor device structure 100 of FIG. 4 taken along lines A-A and B-B, respectively, in accordance with some embodiments. As shown in FIGS. 25A and 25B, after forming the bulk metal layer 222, an etch stop layer 228 is formed on the ILD layer 162 and the bulk metal layer 222. The etch stop layer 228 may include the same material as the CESL 160. Another ILD layer 230 is formed on the etch stop layer 228. The ILD layer 230 may include the same material as the ILD layer 162. Conductive features 232, 234, 236 are formed in the ILD layer 230 and the etch stop layer 228. In some embodiments, the conductive features 232 are formed in the ILD layer 230 and the etch stop layer 228 and are electrically connected to the bulk metal layers 222. The conductive features 234 are formed in the ILD layer 230, the etch stop layer 228, and the SAC layers 179 and are electrically connected to the gate electrode layers 168n (and gate electrode layers 168p). In some embodiments, the conductive feature 236 is electrically connected to a bulk metal layer 222 and a gate electrode layer 168n, as shown in FIG. 25B. The conductive features 232, 234, 236 may be formed by the same process as the bottom portion 216 and the bulk metal layer 222, in order to minimize damaging the layers formed thereunder, such as the gate electrode layers 168n, 168p and the bulk metal layers 222. In some embodiments, the metal layer 204 is omitted from the process to form the conductive features 232, 234, 236, because a silicide region is not needed. Thus, in some embodiments, the conductive features 232, 234, 236 are formed by forming a metal layer, such as the metal layer 210, in an opening, and followed by the gradient metal removal process to remove the top portions of the metal layer (or to remove both the top portion and the sidewall portion of the metal layer). The processes described in FIGS. 16A-21A and 16B-21B are performed to form the conductive features 232, 234, 236.

Figure 26B:
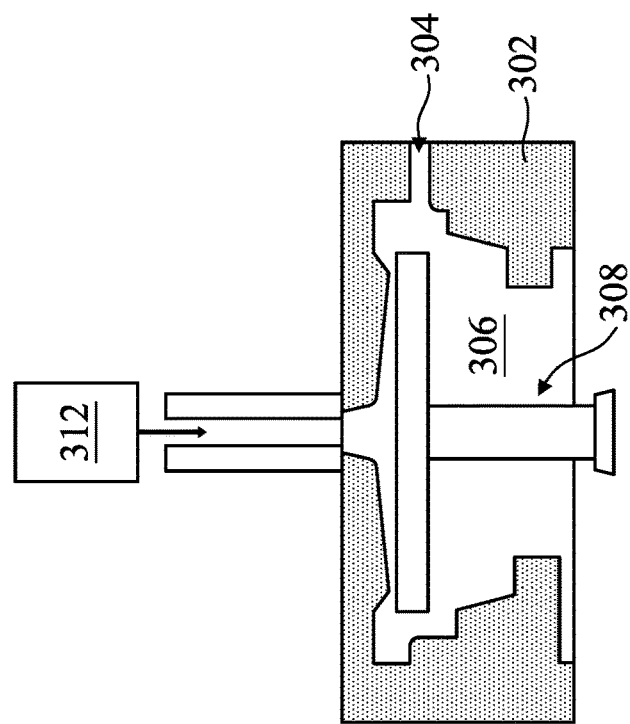
FIGS. 26A and 26B are schematic cross-sectional side views of an oxidation chamber, in accordance with some embodiments.
Figure 26A:
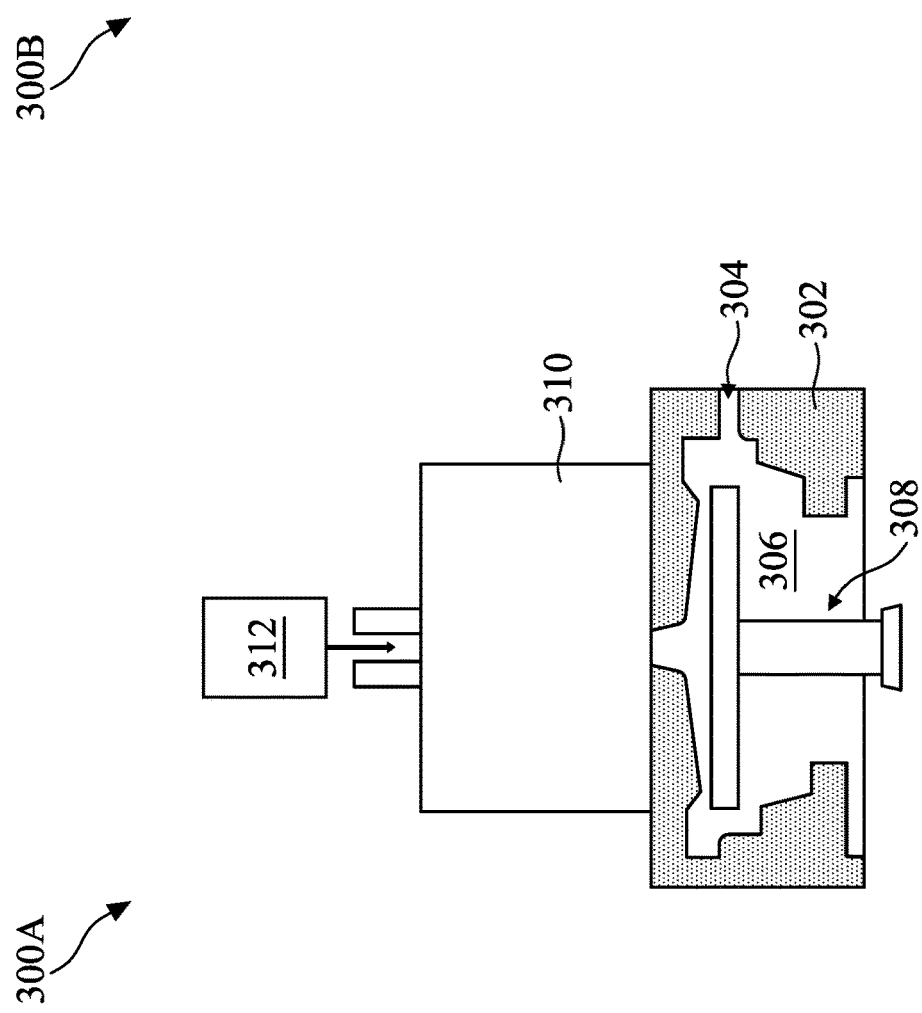

FIG. 26A is a schematic cross-sectional side view of an oxidation chamber 300A, in accordance with some embodiments. As shown in FIG. 26A, the oxidation chamber 300A includes a chamber body 302 defining an internal region 306, and a slit valve 304 is located in the chamber body 302 for transferring a substrate, such as the substrate 102, into and out of the oxidation chamber 300A. A substrate support 308 is disposed in the internal region 306 for supporting the substrate. A plasma generator 310 may be disposed over the chamber body 302. In some embodiments, the plasma generator 310 is a remote plasma source for forming remote plasma. In some embodiments, the plasma generator 310 includes one or more coils for forming inductively coupled plasma. In some embodiments, the plasma generator 310 includes a first electrode disposed over the chamber body 302 and a second electrode disposed in the substrate support 308 for forming capacitively coupled plasma. A gas source 312 is connected to the chamber body 302 for flowing an oxygen-containing gas into the oxidation chamber. The oxidation chamber 300A may be utilized for performing a plasma oxidation process.

FIG. 26B is a schematic cross-sectional side view of an oxidation chamber 300B, in accordance with some embodiments. As shown in FIG. 26B, in some embodiments, the oxidation chamber 300B includes the same components as the oxidation chamber 300A except for the plasma generator 310. The oxidation chamber 300B may be utilized for performing a thermal oxidation process, and the substrate support 308 may include one or more heating elements for heating the substrate disposed thereon. The oxidation chamber 300A, 300B may be utilized to perform the oxidation process of the gradient metal removal process described in FIGS. 14A and 14B.

Figure 27B:
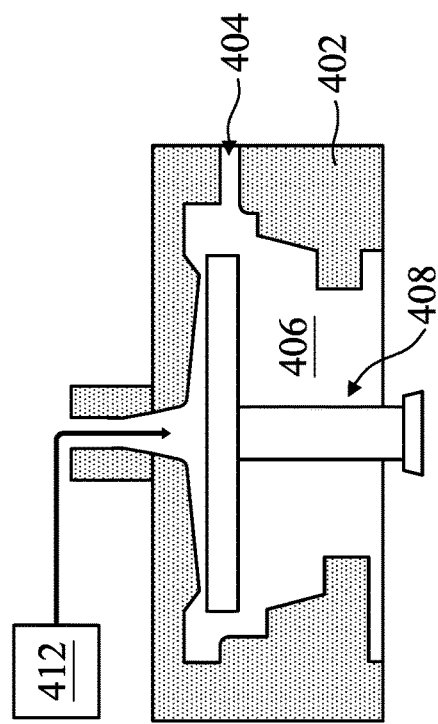
FIGS. 27A and 27B are schematic cross-sectional side views of an etch chamber, in accordance with some embodiments.
Figure 27A:
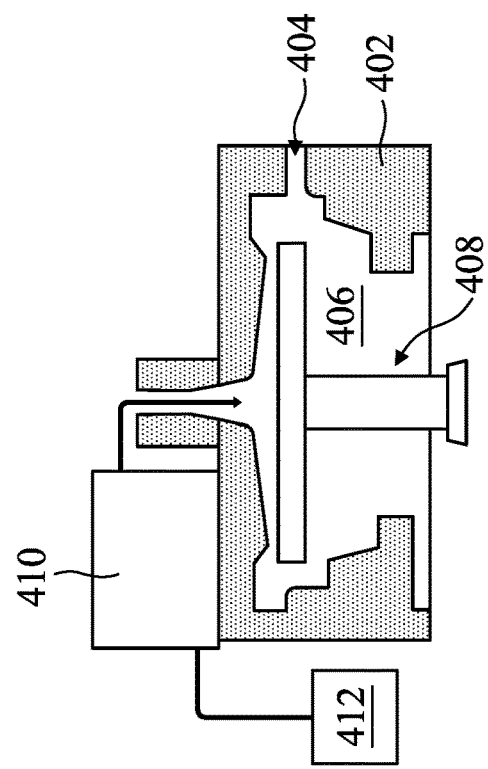

FIG. 27A is a schematic cross-sectional side view of an etch chamber 400A, in accordance with some embodiments. As shown in FIG. 27A, the etch chamber 400A includes a chamber body 402 defining an internal region 406, and a slit valve 404 is located in the chamber body 402 for transferring a substrate, such as the substrate 102, into and out of the etch chamber 400A. A substrate support 408 is disposed in the internal region 406 for supporting the substrate. A plasma generator 410 may be disposed over the chamber body 402. In some embodiments, the plasma generator 410 is a remote plasma source for forming remote plasma. In some embodiments, the plasma generator 410 includes one or more coils for forming inductively coupled plasma. In some embodiments, the plasma generator 410 includes a first electrode disposed over the chamber body 402 and a second electrode disposed in the substrate support 408 for forming capacitively coupled plasma. An etchant source 412 is connected to the chamber body 402 for flowing one or more etchants into the etch chamber. The etch chamber 400A may be utilized for performing a plasma etch process.

FIG. 27B is a schematic cross-sectional side view of an etch chamber 400B, in accordance with some embodiments. As shown in FIG. 27B, in some embodiments, the etch chamber 400B includes the same components as the etch chamber 400A except for the plasma generator 410. The etch chamber 400B may be utilized for performing a thermal etch process, and the substrate support 408 may include one or more heating elements for heating the substrate disposed thereon. The etch chamber 400A, 400B may be utilized to perform the etch process of the gradient metal removal process described in FIGS. 15A and 15B.

Figure 28:
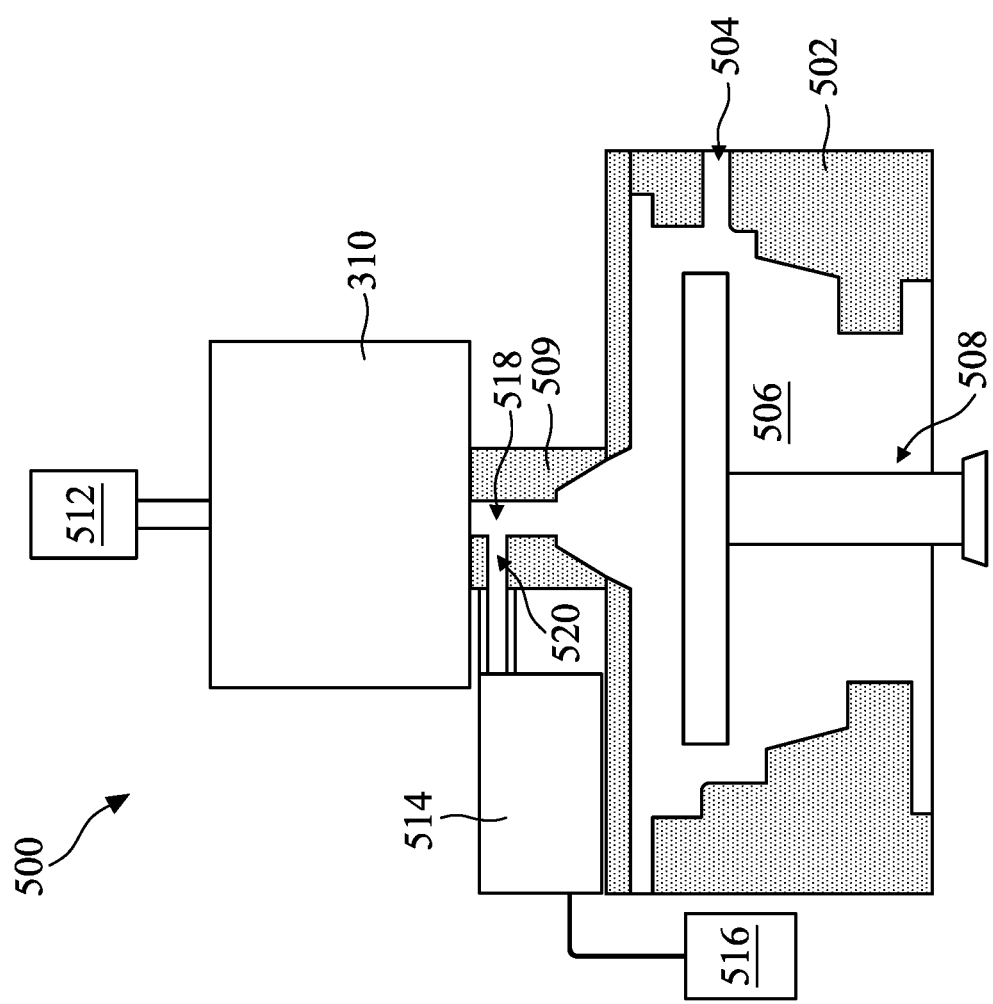
FIG. 28 is a schematic cross-sectional side view of a process chamber, in accordance with some embodiments.

FIG. 28 is a schematic cross-sectional side view of a process chamber 500, in accordance with some embodiments. As shown in FIG. 28, the process chamber 500 includes a chamber body 502 defining an internal region 506, and a slit valve 504 is located in the chamber body 502 for transferring a substrate, such as the substrate 102, into and out of the process chamber 500. A substrate support 508 is disposed in the internal region 506 for supporting the substrate. First optional plasma generator 510 and second optional plasma generator 514 may be disposed over the chamber body 502. In some embodiments, the plasma generators 510, 514 are remote plasma sources for forming remote plasma. In some embodiments, one of the plasma generators 510, 514 is utilized and includes one or more coils for forming inductively coupled plasma, while the other of the plasma generators 510, 514 is not present. In some embodiments, one of the plasma generators 510, 514 is utilized and includes a first electrode disposed over the chamber body 502 and a second electrode disposed in the substrate support 508 for forming capacitively coupled plasma, while the other of the plasma generators 510, 514 is not present. A gas source 512 is connected to the chamber body 502 for flowing an oxygen-containing gas into the process chamber, and an etchant source 516 is connected to the chamber body 502 for flowing one or more etchants into the process chamber.

As shown in FIG. 28, the process chamber 500 includes a gas injector for injecting the oxidation gas (or oxidation species from the remote plasma source) and the etchant (either in gas form or in plasma form) into the chamber body 502. The gas injector includes a main channel 518 and a side channel 520 in fluid communication with the main channel 518. The side channel 520 is located upstream of an outlet of the main channel 518. The main channel 518 is configured to inject both the oxidation gas and the etchant into the chamber body 502, and the side channel 520 is configured to inject the etchant into the main channel 518. Because the oxidation process and the etch process are performed at different times, the main channel 518 can be used to inject both the oxidation gas and the etchant into the chamber body 502. The process chamber 500 may be utilized for performing both the oxidation process and the etch process of the gradient metal removal process. The optional plasma generators 510, 514 may not be present, and the one or both of the oxidation and etch processes may be thermal processes.

Figure 29A:
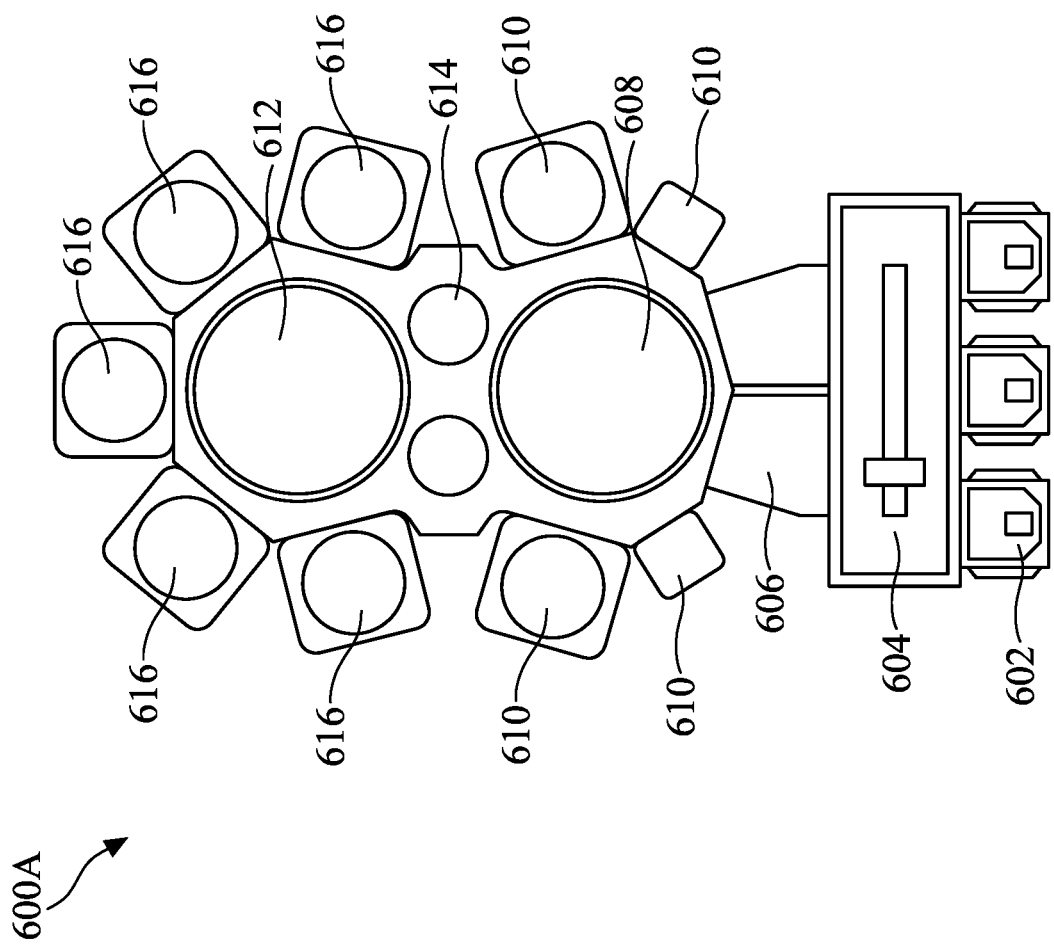
FIGS. 29A and 29B are schematic top views of a multi-chamber system, in accordance with some embodiments.

FIG. 29A is a schematic top view of a multi-chamber system 600A, in accordance with some embodiments. The multi-chamber system 600A may be a cluster tool system. As shown in FIG. 29A, the multi-chamber system 600A includes at least one pod 602 connected to a factory interface 604. The pod 602 typically is a front opening unified pods (FOUP). One or more load-lock chambers 606 are connected to the factory interface 604, and a first transfer chamber 608 is connected to the one or more load-lock chambers 606. A plurality of process chambers 610 is connected to the first transfer chamber 608. Each process chamber 610 is configured to perform at least one of a substrate processing processes, such as ALD, CVD, PVD, etch, degas, pre-cleaning orientation, oxidation, anneal, and other substrate processing processes. A second transfer chamber 612 is connected to the first transfer chamber 608 via one or more transfer chambers 614. A plurality of process chambers 616 is connected to the second transfer chamber 612. Each process chamber 616 is configured to perform at least one of a substrate processing processes, such as ALD, CVD, PVD, etch, degas, pre-cleaning orientation, oxidation, anneal, and other substrate processing processes. In some embodiments, one of the process chambers 616 is the oxidation chamber 300A or 300B, and one of the process chambers 616 is the etch chamber 400A or 400B. The remaining process chambers 616 may be deposition chambers, such as PVD chambers. In some embodiments, two of the process chambers 616 are the process chamber 500, and the remaining process chambers 616 are deposition chambers. The multi-chamber system 600A may be utilized to perform one or more processes of forming the semiconductor device structure 100, such as performing the processes to form the conductive feature including the bottom portion 216 and the bulk metal layer 222. The gradient metal removal process may be performed in one or more of the process chambers 616.

Figure 29B:
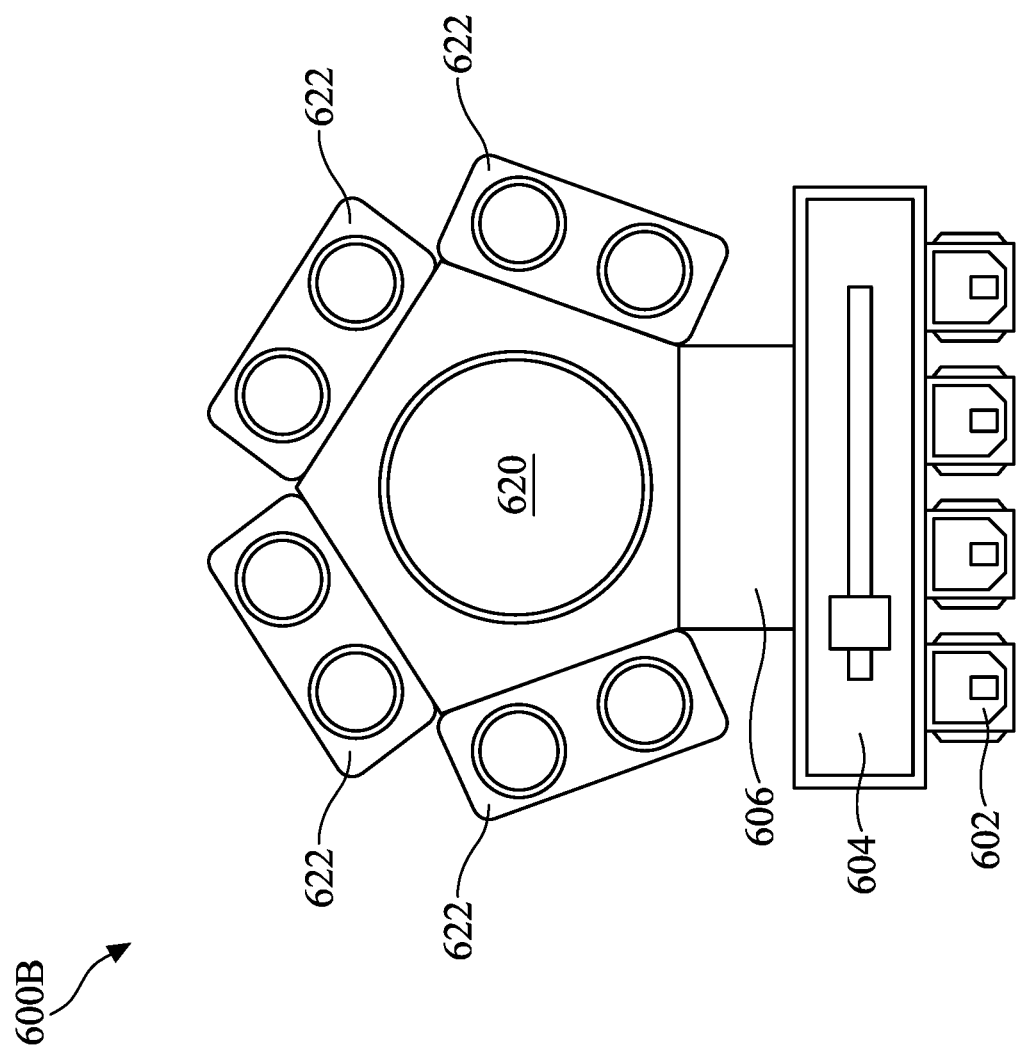

FIG. 29B is a schematic top view of a multi-chamber system 600B, in accordance with some embodiments. The multi-chamber system 600B may be a cluster tool system. As shown in FIG. 29B, the multi-chamber system 600B includes the at least one pod 602 connected to the factory interface 604, and the one or more load-lock chambers 606 are connected to the factory interface 604. A transfer chamber 620 is connected to the one or more load-lock chambers 606, and a plurality of process chambers 622 is connected to the transfer chamber 620. Each process chamber 622 is configured to perform at least one of a substrate processing processes, such as ALD, CVD, PVD, etch, degas, pre-cleaning orientation, oxidation, anneal, and other substrate processing processes. Each process chamber 622 may be configured to process two substrates at the same time. In some embodiments, one of the process chambers 622 is the oxidation chamber 300A or 300B, and one of the process chambers 622 is the etch chamber 400A or 400B. The remaining process chambers 622 may be deposition chambers, such as PVD chambers. In some embodiments, two of the process chambers 622 are the process chamber 500, and the remaining process chambers 622 are deposition chambers. The multi-chamber system 600B may be utilized to perform one or more processes of forming the semiconductor device structure 100, such as performing the processes to form the conductive feature including the bottom portion 216 and the bulk metal layer 222. The gradient metal removal process may be performed in one or more of the process chambers 622.

The present disclosure provides methods of forming the semiconductor device structure 100. In some embodiments, the method includes forming a metal layer 210 in a contact opening 202 and performing a gradient metal removal process on the metal layer 210 to enlarge a space between top portions 212 of the metal layer 210. Some embodiments may achieve advantages. For example, the enlarged space between the top portions 212 leads to better gap fill of the contact opening 202 with a sacrificial layer 220. As a result of improved gap fill, a solution from a subsequent wet etch does not leak down to a bottom portion 216 of the metal layer 210, which can damage the bottom portion 216, a silicide region 206, and a S/D epitaxial features 152.

An embodiment is a method. The method includes forming a contact opening in an interlayer dielectric (ILD) layer disposed over an epitaxy source/drain region and forming a metal layer in the contact opening. The metal layer includes top portions, side portions, and a bottom portion, and a space is defined between the top portions of the metal layer. The method further includes performing a gradient metal removal process on the metal layer to enlarge the space, forming a sacrificial layer in the contact opening, recessing the sacrificial layer in the contact opening to expose a portion of the sidewall portions, removing the top portions and the exposed portion of the sidewall portions, removing the sacrificial layer, and forming a bulk metal layer on the bottom portion of the metal layer.

Another embodiment is a method. The method includes forming a contact opening in an interlayer dielectric (ILD) layer disposed over an epitaxy source/drain region, forming a metal layer in the contact opening, wherein the metal layer comprises top portions, side portions, and a bottom portion, oxidizing an outer portion of the metal layer to form an oxide layer, removing the oxide layer, repeating the oxidizing and removing until the top portions and the sidewall portions are removed, and forming a bulk metal layer on the bottom portion of the metal layer.

A further embodiment is a method. The method includes forming a contact opening in an interlayer dielectric (ILD) layer disposed over an epitaxy source/drain region and forming a metal layer in the contact opening. The metal layer includes top portions, side portions, and a bottom portion, and a space is defined between the top portions of the metal layer. The method further includes performing a gradient metal removal process on the metal layer to enlarge the space. The gradient metal removal process includes oxidizing an outer portion of the metal layer to form an oxide layer in a process chamber and removing the oxide layer in the process chamber. The method further includes removing the top portions and at least a portion of the sidewall portions and forming a bulk metal layer on the bottom portion of the metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
    forming a contact opening in an interlayer dielectric (ILD) layer disposed over an epitaxy source/drain region;
    forming a metal layer in the contact opening, wherein the metal layer comprises top portions, sidewall portions, and a bottom portion, and a space is defined between the top portions of the metal layer;
    performing a gradient metal removal process on the metal layer to enlarge the space;
    forming a sacrificial layer in the contact opening;
    recessing the sacrificial layer in the contact opening to expose a portion of the sidewall portions;
    removing the top portions and the exposed portion of the sidewall portions;
    removing the sacrificial layer; and
    forming a bulk metal layer on the bottom portion of the metal layer.

2. The method of claim 1, wherein the metal layer is formed by a physical vapor deposition process.

3. The method of claim 2, wherein each top portion has a first thickness, each sidewall portion has a second thickness substantially less than the first thickness, and the bottom portion has a third thickness substantially greater than the second thickness.

4. The method of claim 1, wherein the metal layer further comprises tungsten, platinum, tantalum, titanium, copper, cobalt, ruthenium, rhodium, iridium, or molybdenum.

5. The method of claim 4, wherein the removal of the top portions and the exposed portion of the sidewall portions is performed by a wet etch.

6. The method of claim 1, further comprising forming a nitride layer in the contact opening, wherein the metal layer is formed on the nitride layer.

7. The method of claim 6, further comprising forming a silicide region on the epitaxy source/drain region, wherein the bottom portion of the metal layer is disposed on the silicide region.

8. A method, comprising:
    forming a contact opening in an interlayer dielectric (ILD) layer disposed over an epitaxy source/drain region;
    forming a metal layer in the contact opening, wherein the metal layer comprises top portions, sidewall portions, and a bottom portion, and a space is defined between the top portions of the metal layer;
    performing a gradient metal removal process on the metal layer to enlarge the space, wherein the gradient metal removal process comprises:
        oxidizing an outer portion of the metal layer to form an oxide layer in a process chamber; and
        removing the oxide layer in the process chamber;
    depositing a sacrificial layer in the contact opening;
    recessing the sacrificial layer in the contact opening to expose a portion of the sidewall portions;
    removing the top portions and the exposed portion of the sidewall portions;
    removing the sacrificial layer; and
    forming a bulk metal layer on the bottom portion of the metal layer.

9. The method of claim 8, wherein the process chamber is configured to perform a thermal oxidation process, a plasma oxidation process, a thermal etch process, a plasma etch process, and combinations thereof.

10. The method of claim 9, wherein the oxidizing the outer portion of the metal layer comprises flowing an oxygen-containing gas through a main channel of a gas injector into a chamber body of the process chamber.

11. The method of claim 10, wherein the removing the oxide layer comprises flowing an etchant through the main channel of the gas injector into the chamber body of the process chamber.

12. The method of claim 9, wherein multiple cycles of the oxidizing the outer portion of the metal layer and the removing the oxide layer are performed to remove the top portions and at least a portion of the sidewall portions.

13. A method, comprising:
    forming a contact opening in an interlayer dielectric (ILD) layer disposed over an epitaxy source/drain region;
    forming a silicide layer on the epitaxy source/drain region;
    depositing a first metal layer in the contact opening, wherein the first metal layer comprises top portions, sidewall portions, and a bottom portion, and the bottom portion is in contact with the silicide layer;
    removing portions of the top portions and sidewall portions by performing a gradient metal removal process;
    depositing a sacrificial layer in the contact opening;
    recessing the sacrificial layer in the contact opening to expose a portion of the sidewall portions;
    removing the top portions and the exposed portion of the sidewall portions; and
    removing the sacrificial layer.

14. The method of claim 13, wherein the forming the silicide layer comprises:
    depositing a second metal layer in the contact opening; and
    reacting the second metal layer with the epitaxy source/drain region to form the silicide layer.

15. The method of claim 14, further comprising converting the second metal layer into a nitride layer, wherein the first metal layer is in contact with the nitride layer.

16. The method of claim 15, wherein a portion of the nitride layer is removed after the removing the top portions and the exposed portion of the sidewall portions.

17. The method of claim 14, wherein the second metal layer comprises Ti or Ta.

18. The method of claim 17, wherein the first metal layer comprises W, Pt, Cu, Co, Ru, Rh, Ir, or Mo.

19. The method of claim 13, wherein the gradient metal removal process comprises performing an oxidation process followed by an etch process.

20. The method of claim 19, wherein the gradient metal removal process further comprises repeating the oxidation process followed by the etch process.

* * * * *